US012323722B2

(12) United States Patent
Machida

(10) Patent No.: US 12,323,722 B2
(45) Date of Patent: Jun. 3, 2025

(54) IMAGING DEVICE AND ELECTRONIC APPARATUS

(71) Applicant: SONY SEMICONDUCTOR SOLUTIONS CORPORATION, Kanagawa (JP)

(72) Inventor: Takashi Machida, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 256 days.

(21) Appl. No.: 17/440,260

(22) PCT Filed: Mar. 11, 2020

(86) PCT No.: PCT/JP2020/010509
§ 371 (c)(1),
(2) Date: Sep. 17, 2021

(87) PCT Pub. No.: WO2020/195824
PCT Pub. Date: Oct. 1, 2020

(65) Prior Publication Data
US 2022/0159208 A1    May 19, 2022

(30) Foreign Application Priority Data
Mar. 28, 2019    (JP) .................................. 2019-063541

(51) Int. Cl.
*H04N 25/77*        (2023.01)
*H04N 25/709*       (2023.01)
(Continued)

(52) U.S. Cl.
CPC ......... *H04N 25/771* (2023.01); *H04N 25/709* (2023.01); *H04N 25/75* (2023.01);
(Continued)

(58) Field of Classification Search
None
See application file for complete search history.

(56) References Cited

U.S. PATENT DOCUMENTS

2012/0307030 A1\* 12/2012 Blanquart .............. H04N 25/78
348/76
2015/0035028 A1\* 2/2015 Fan ................... H01L 27/14638
257/292

(Continued)

FOREIGN PATENT DOCUMENTS

CN         104637963 A      5/2015
CN         105706240 A      6/2016
(Continued)

OTHER PUBLICATIONS

International Search Report and Written Opinion of PCT Application No. PCT/JP2020/010509, issued on May 26, 2020, 09 pages of ISRWO.

*Primary Examiner* — Twyler L Haskins
*Assistant Examiner* — Wesley J Chiu
(74) *Attorney, Agent, or Firm* — CHIP LAW GROUP

(57) ABSTRACT

To provide an imaging device that allows miniaturization to be achieved in an in-plane direction without impairing operation performance. This imaging device includes a plurality of pixels each having a stacked structure of a photoelectric conversion unit formation region and an electric charge holding unit formation region. The photoelectric conversion unit formation region includes a photoelectric conversion unit and has a first planar shape in a plane extending in a first direction and a second direction. The photoelectric conversion unit is configured to generate electric charge through photoelectric conversion. The electric charge corresponds to an amount of received light. The first direction and the second direction are orthogonal to each other. The first planar shape has a first aspect ratio. The (Continued)

electric charge holding unit formation region includes an electric charge holding unit and has a second planar shape in the plane. The electric charge holding unit is configured to hold the electric charge. The second planar shape has a second aspect ratio different from the first aspect ratio.

18 Claims, 36 Drawing Sheets

(51) Int. Cl.
| | |
|---|---|
| *H04N 25/75* | (2023.01) |
| *H04N 25/767* | (2023.01) |
| *H04N 25/771* | (2023.01) |
| *H04N 25/79* | (2023.01) |
| *H10F 39/00* | (2025.01) |
| *H10F 39/12* | (2025.01) |
| *H10F 39/18* | (2025.01) |

(52) U.S. Cl.
CPC ........... *H04N 25/767* (2023.01); *H04N 25/77* (2023.01); *H04N 25/79* (2023.01); *H10F 39/182* (2025.01); *H10F 39/199* (2025.01); *H10F 39/8057* (2025.01); *H10F 39/807* (2025.01); *H10F 39/813* (2025.01)

(56) References Cited

U.S. PATENT DOCUMENTS

| | | | |
|---|---|---|---|
| 2015/0129943 A1* | 5/2015 | Kato | H01L 27/14612 257/292 |
| 2016/0118438 A1* | 4/2016 | Leung | H01L 27/14685 257/229 |
| 2017/0092684 A1* | 3/2017 | Chang | H01L 27/1463 |
| 2018/0033809 A1* | 2/2018 | Tayanaka | H01L 27/0248 |
| 2018/0213174 A1 | 7/2018 | Sano | |
| 2020/0273894 A1* | 8/2020 | Inui | H01L 27/1461 |

FOREIGN PATENT DOCUMENTS

| | | |
|---|---|---|
| CN | 107431075 A | 12/2017 |
| CN | 110313067 A | 10/2019 |
| DE | 112018001158 T5 | 12/2019 |
| EP | 2154879 A1 | 2/2010 |
| JP | 2015-095468 A | 5/2015 |
| JP | 2016-534557 A | 11/2016 |
| KR | 10-2016-0033231 A | 3/2016 |
| KR | 10-2019-0119050 A | 10/2019 |
| TW | 201515202 A | 4/2015 |
| WO | 2015/020821 A2 | 2/2015 |
| WO | 2016/136486 A1 | 9/2016 |
| WO | 2018/163732 A1 | 9/2018 |

* cited by examiner

[FIG. 1A]
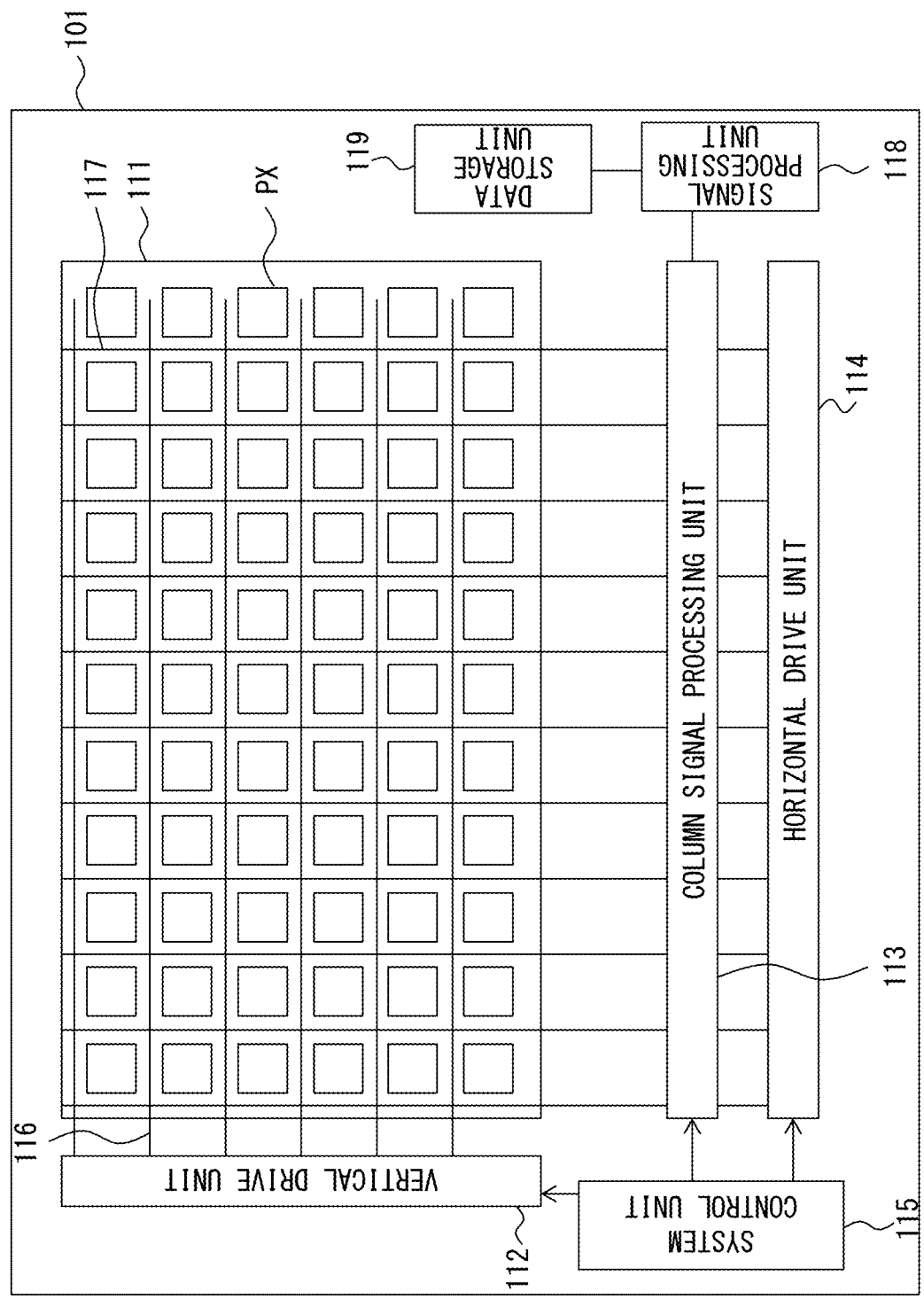

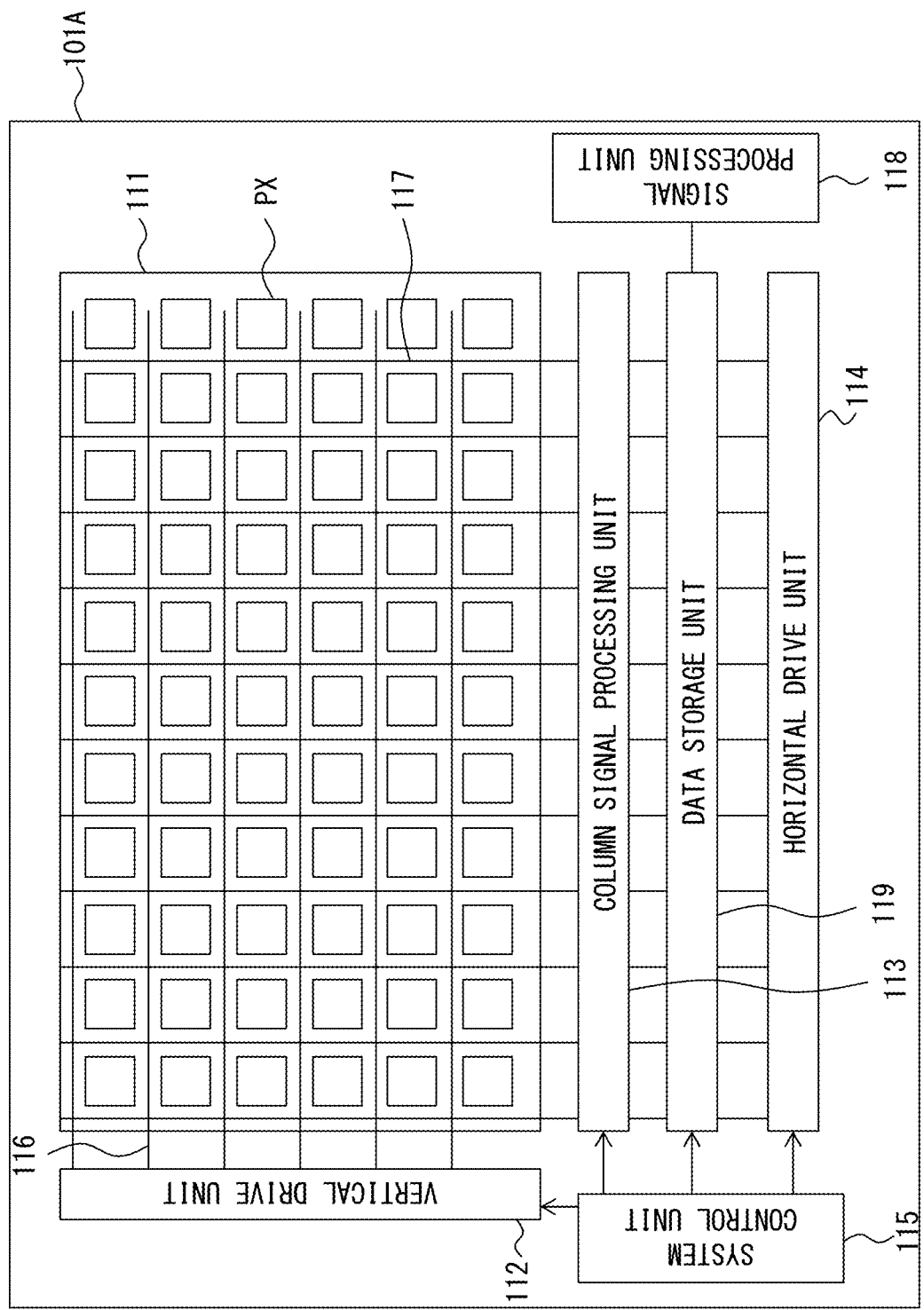
[FIG. 1B]

[FIG. 1C]
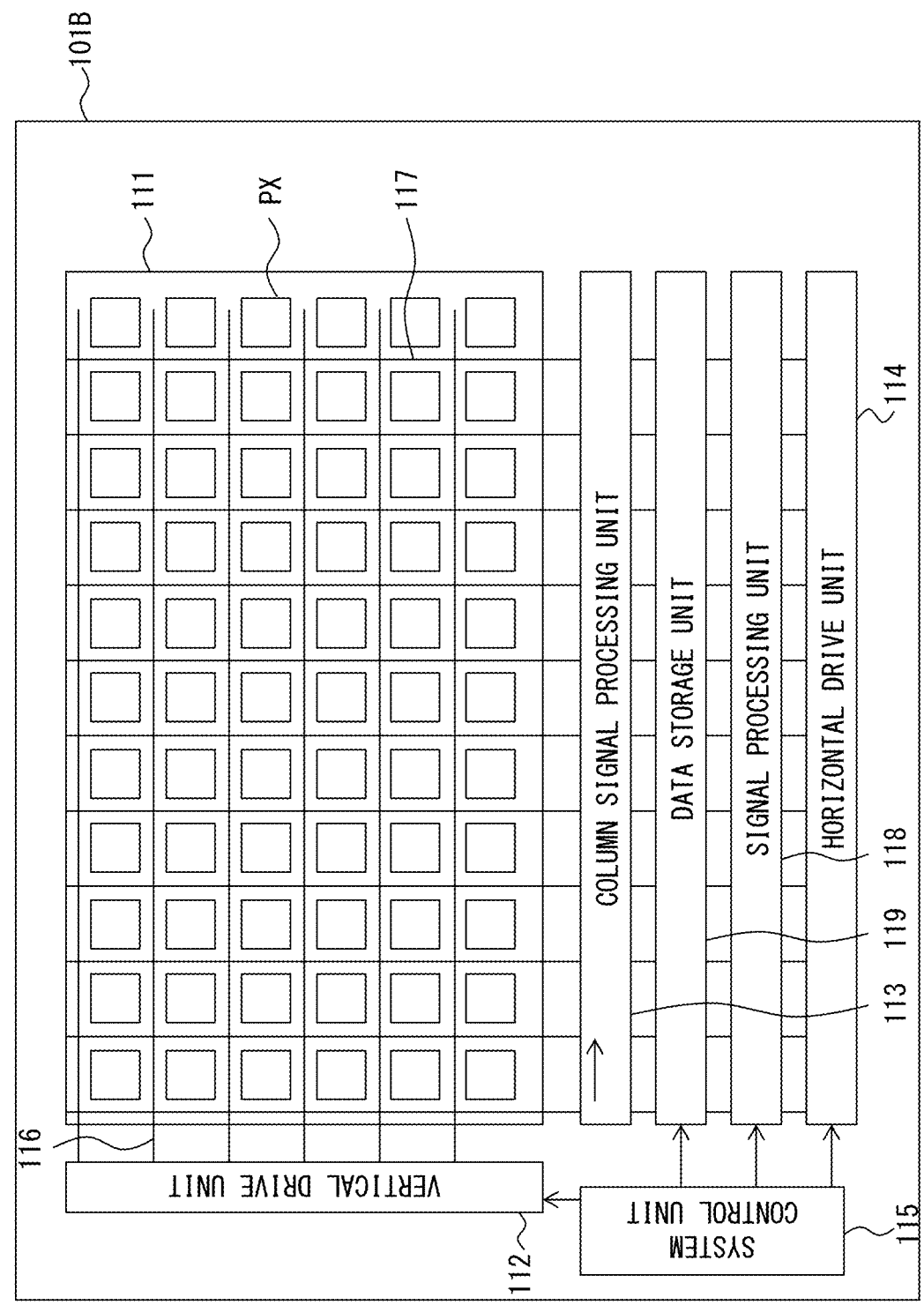

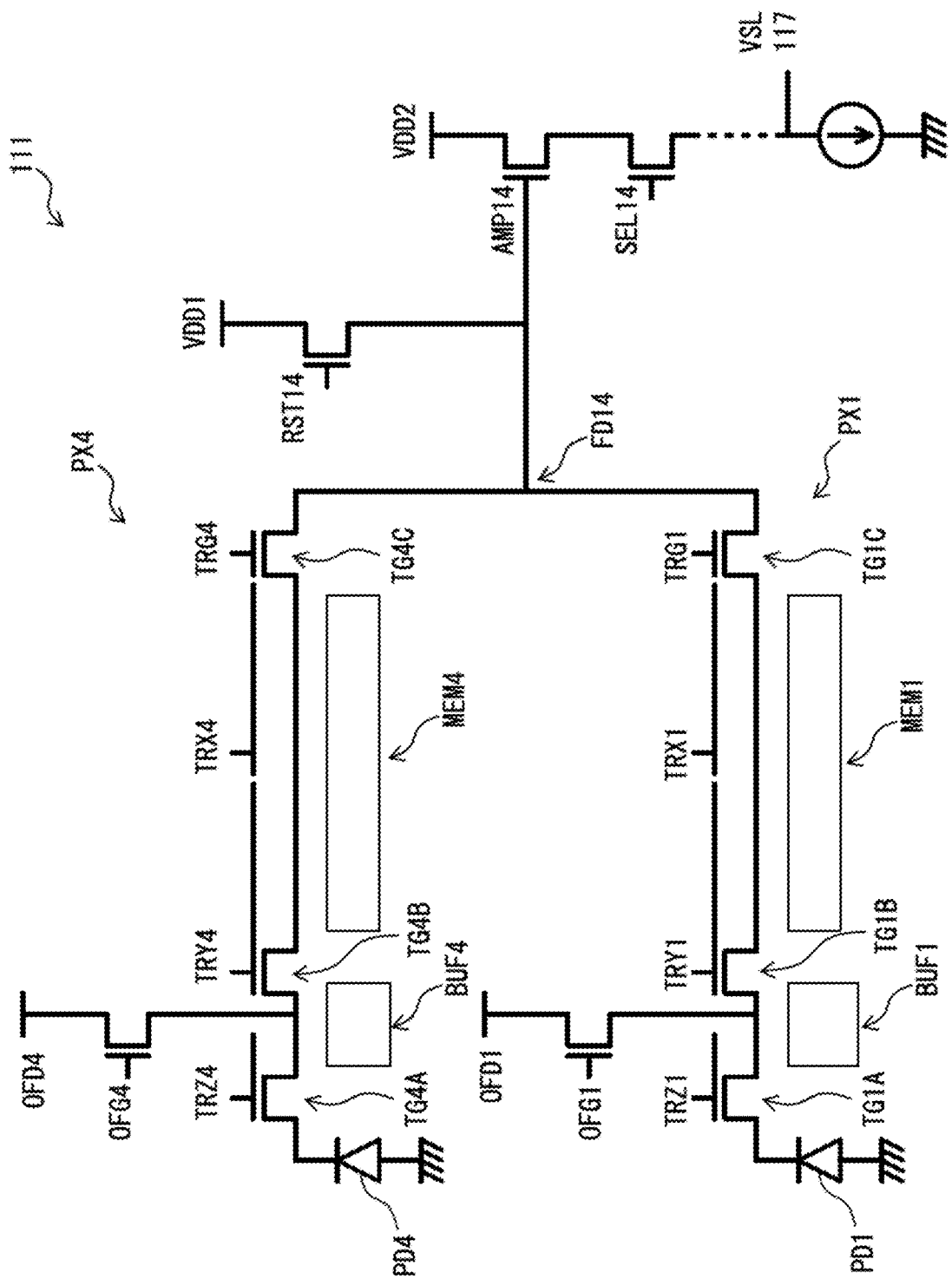
[FIG. 2]

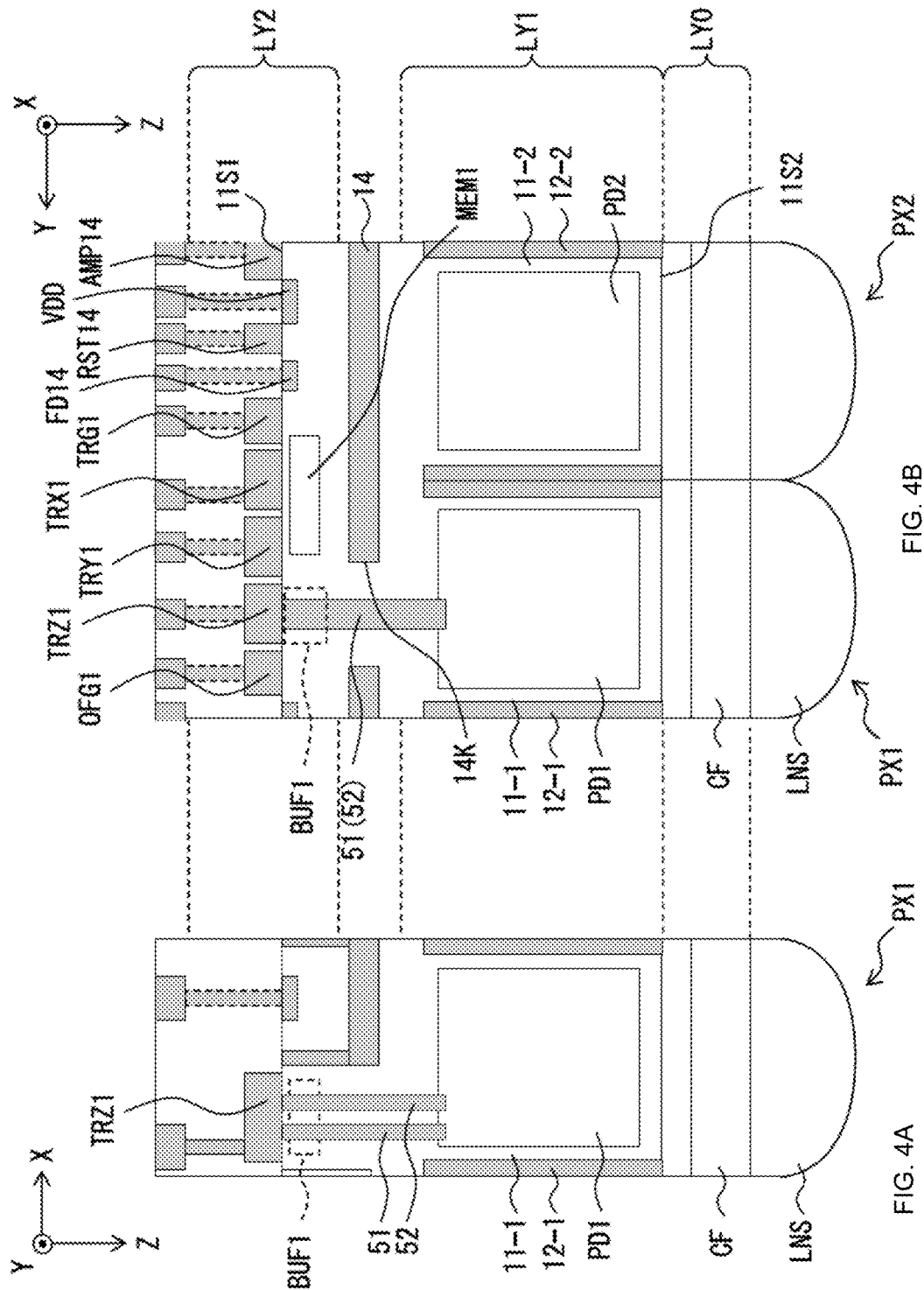

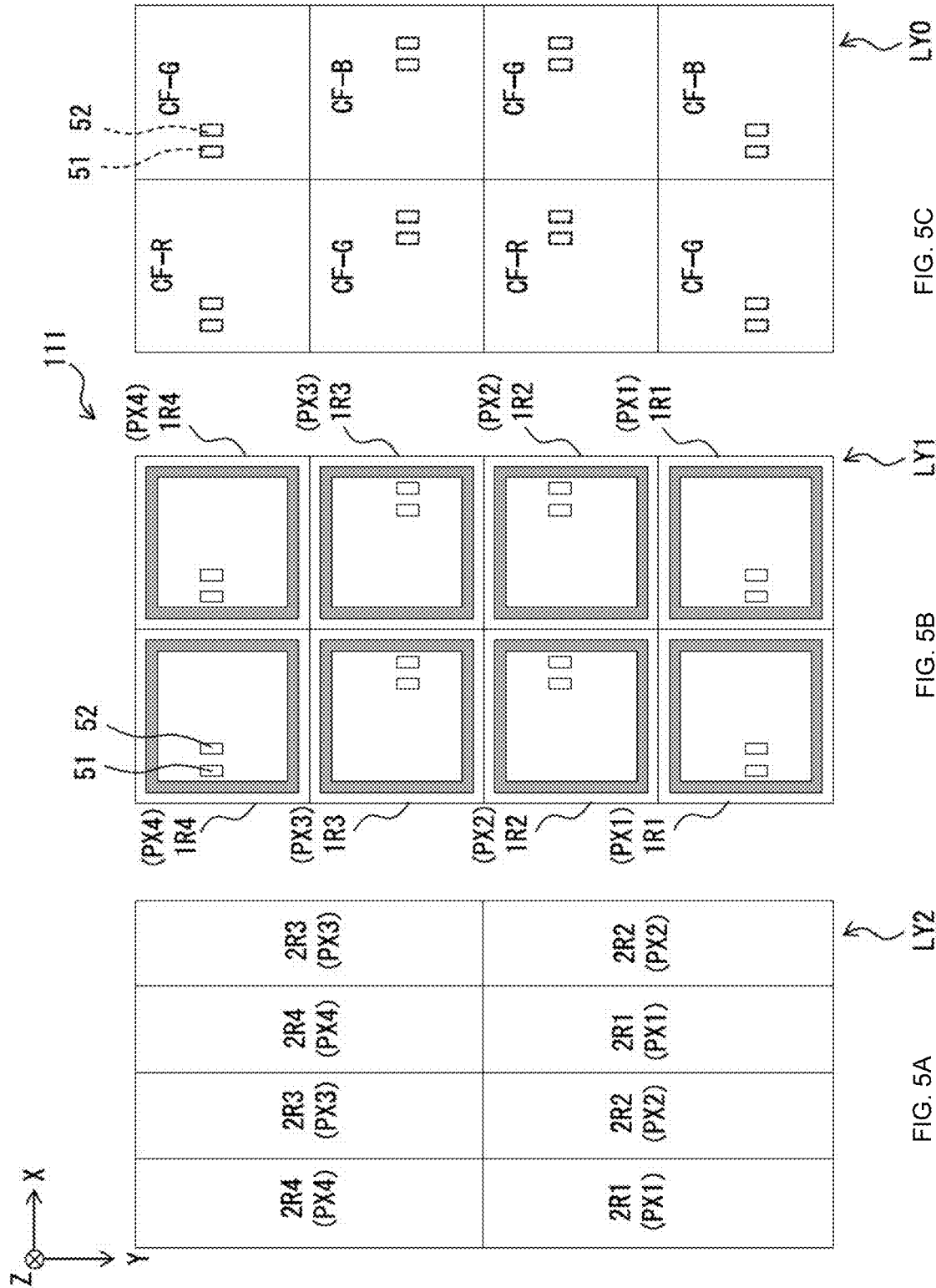

[FIG. 6A]
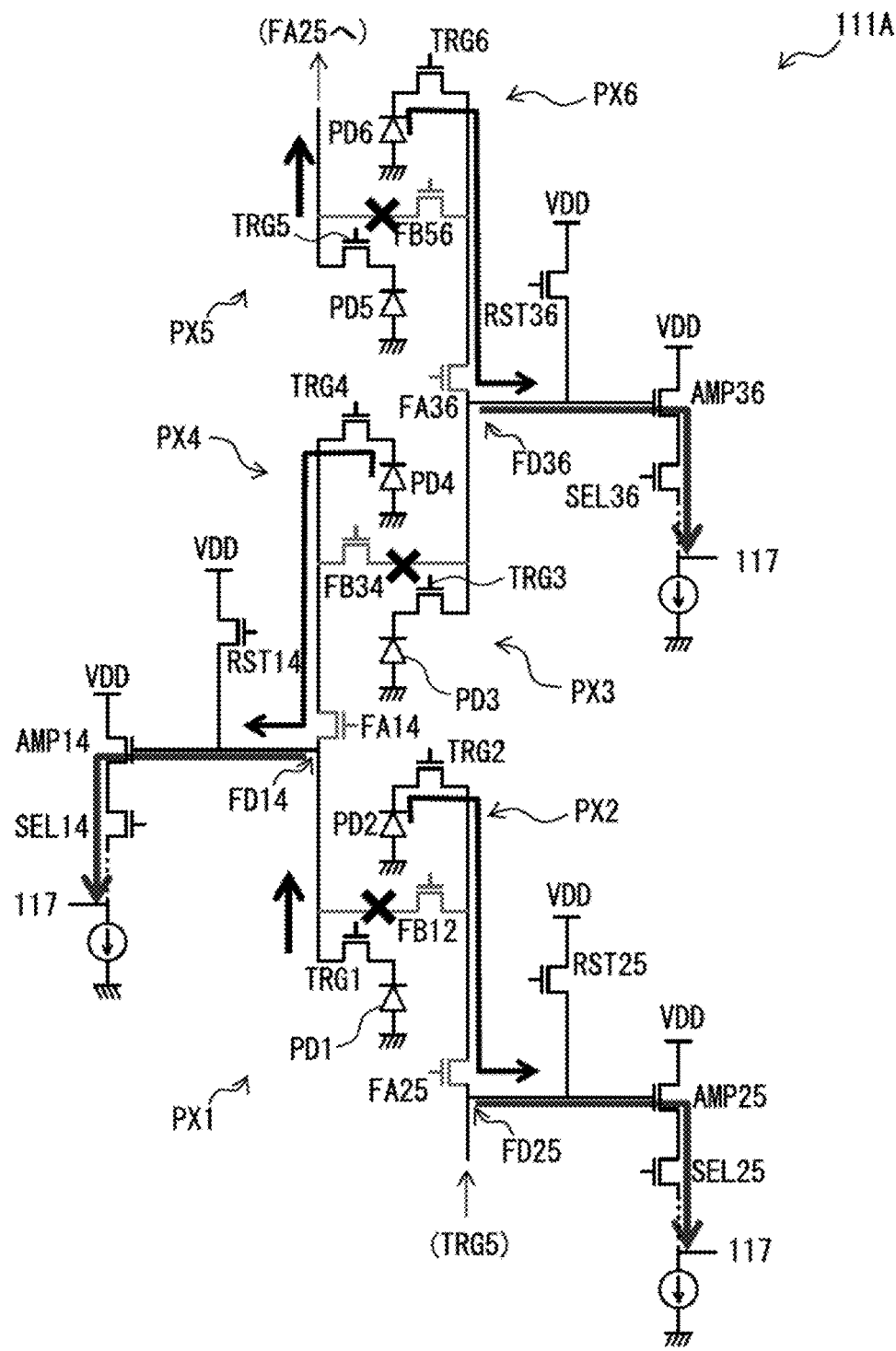

[FIG. 6B]
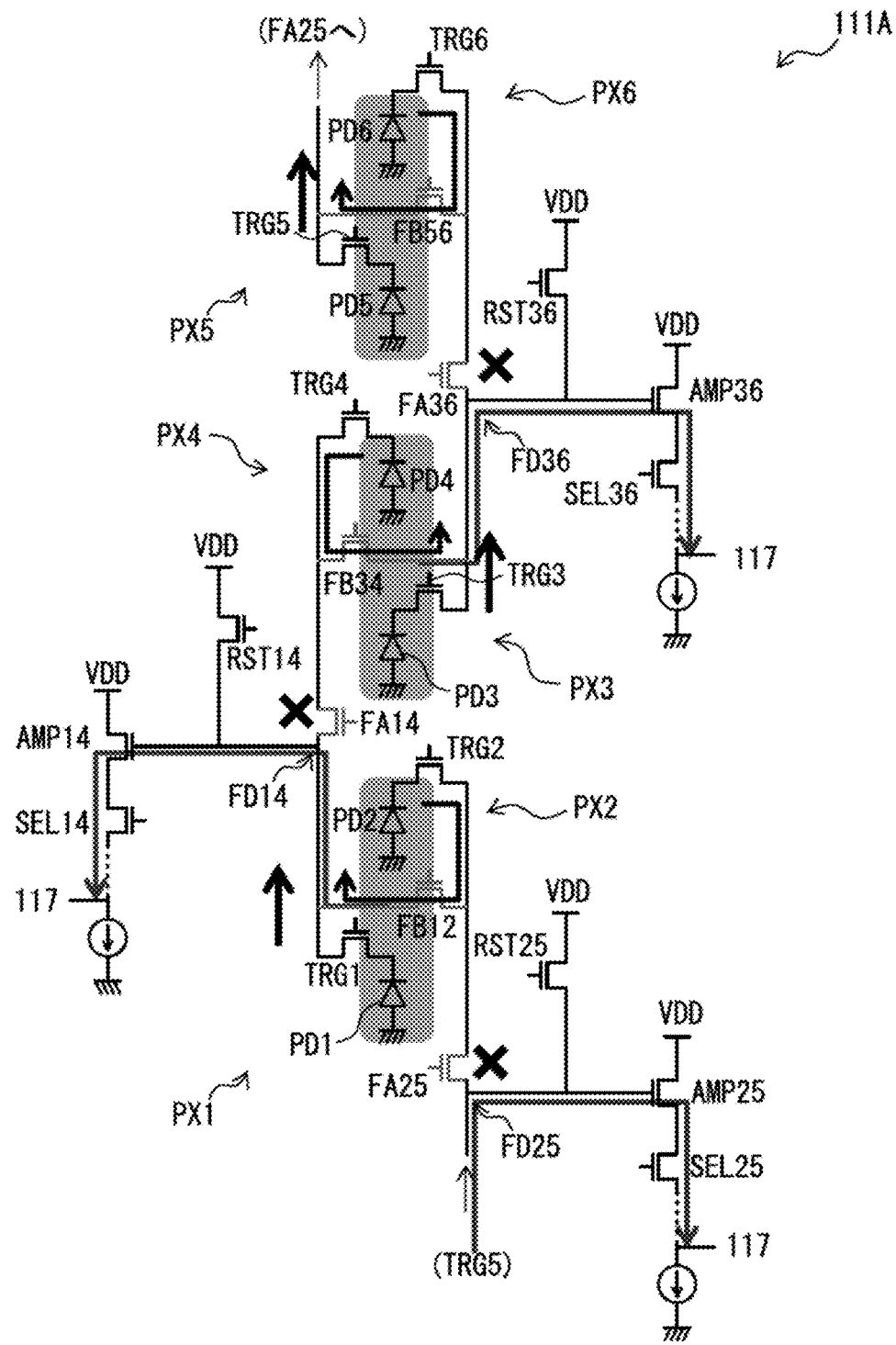

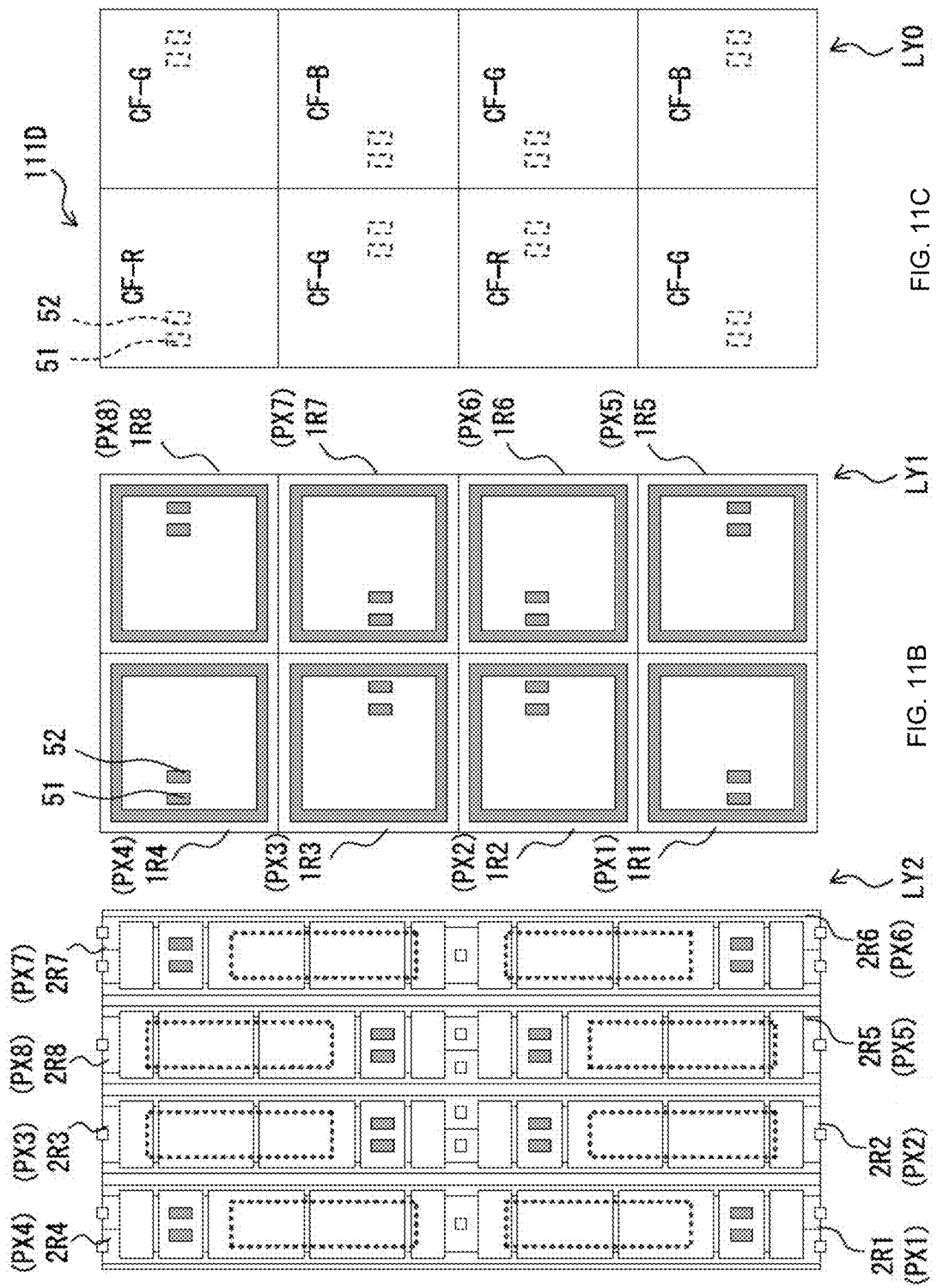

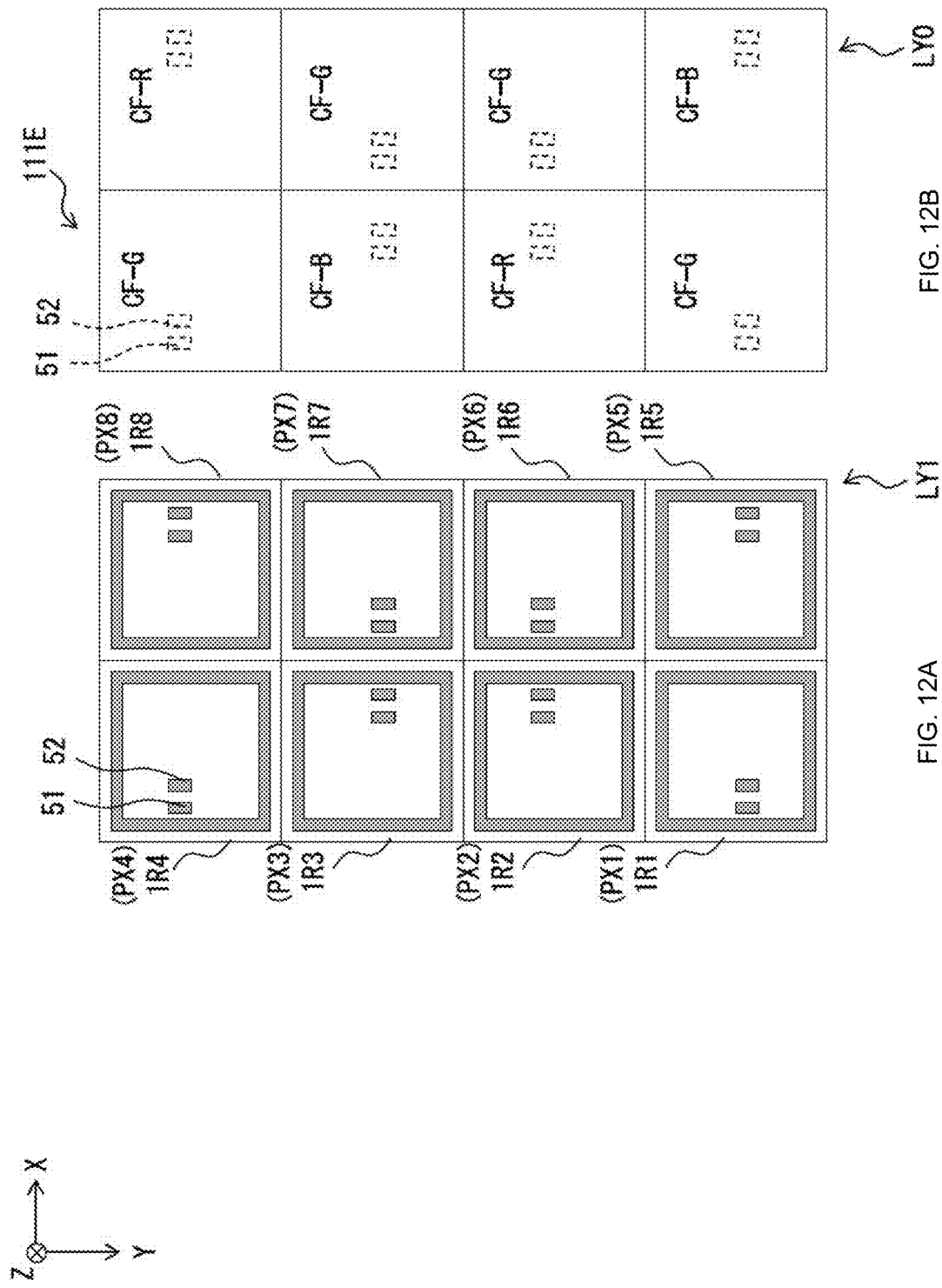

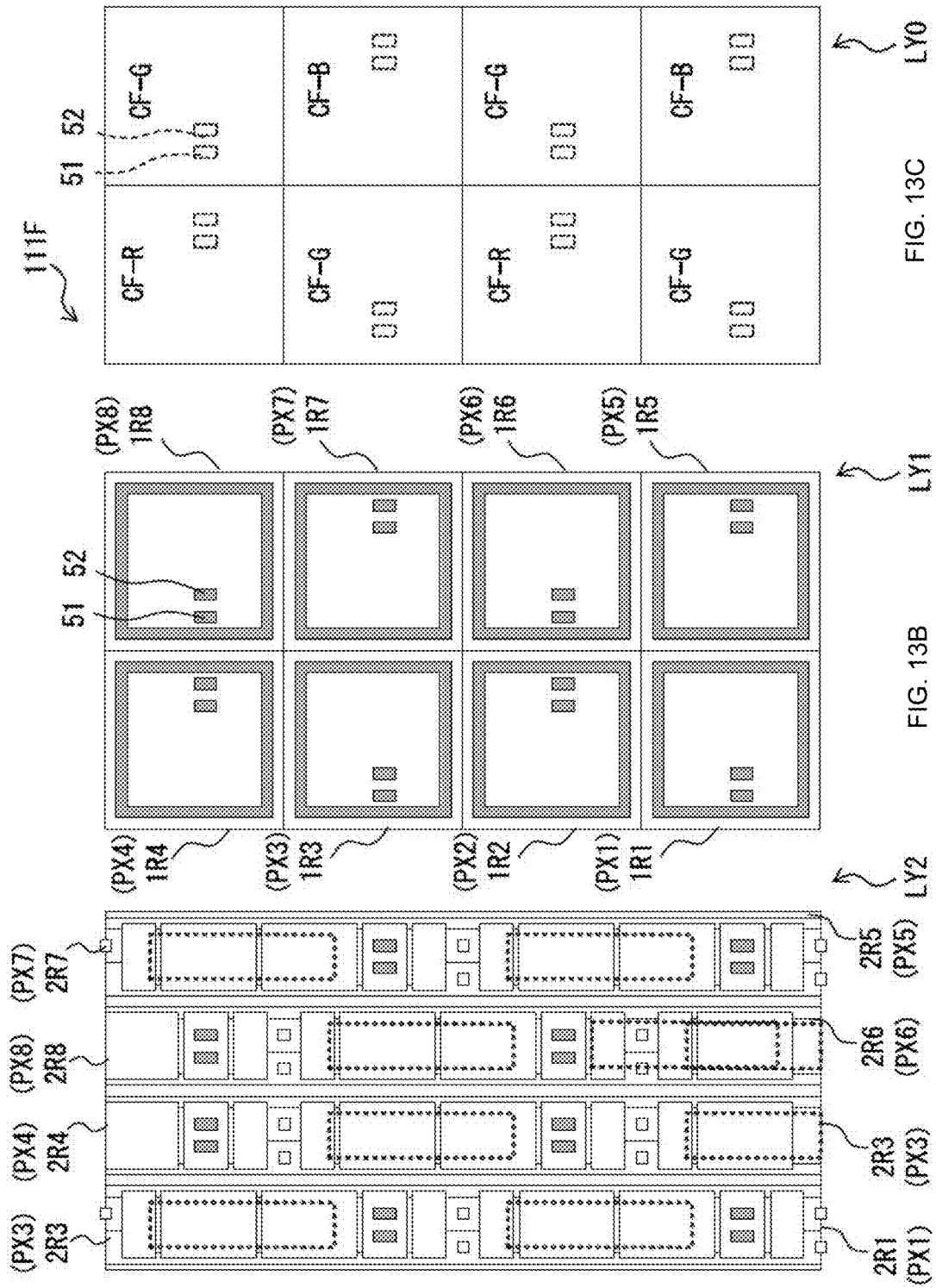

[FIG. 14]
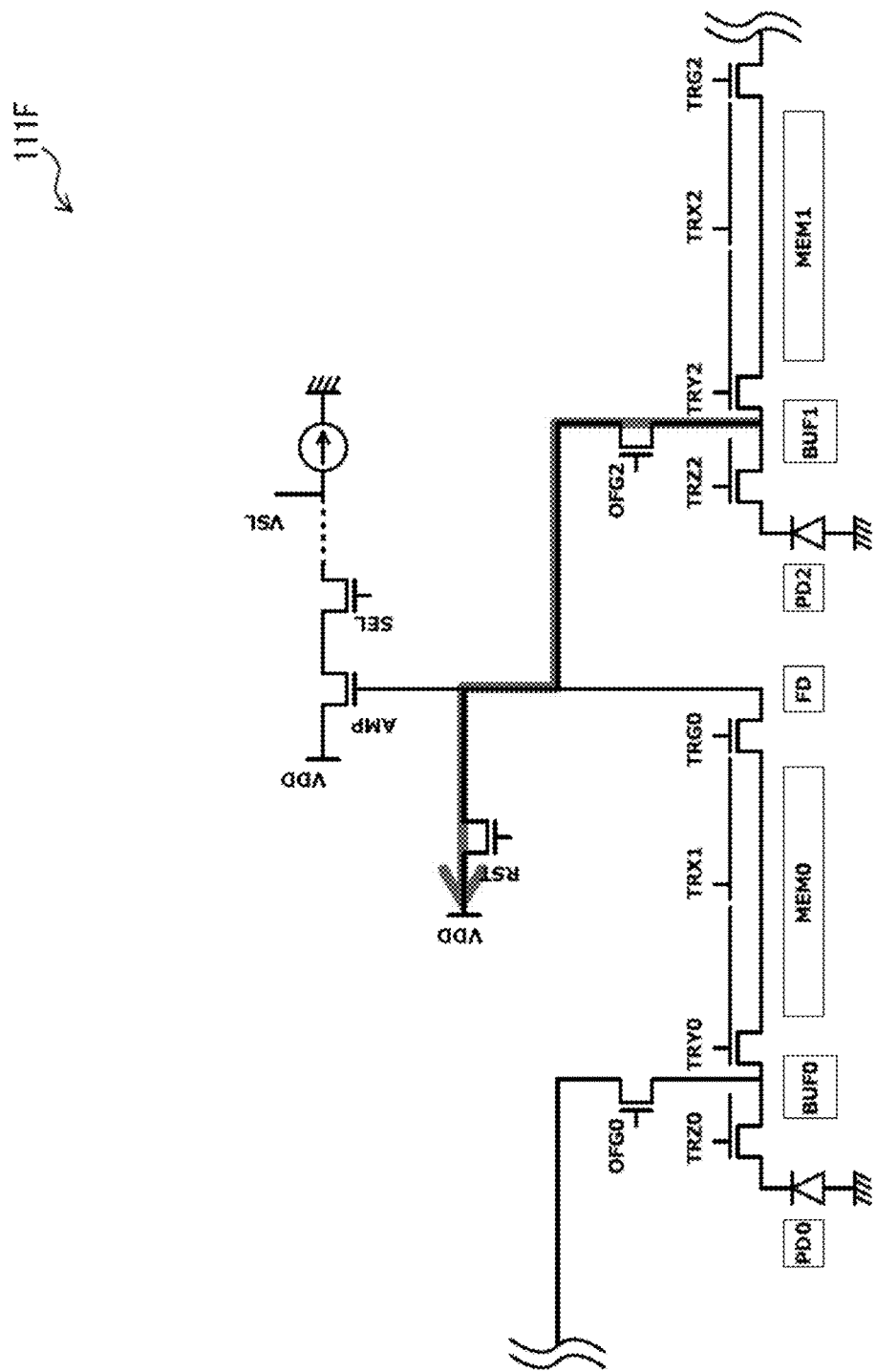

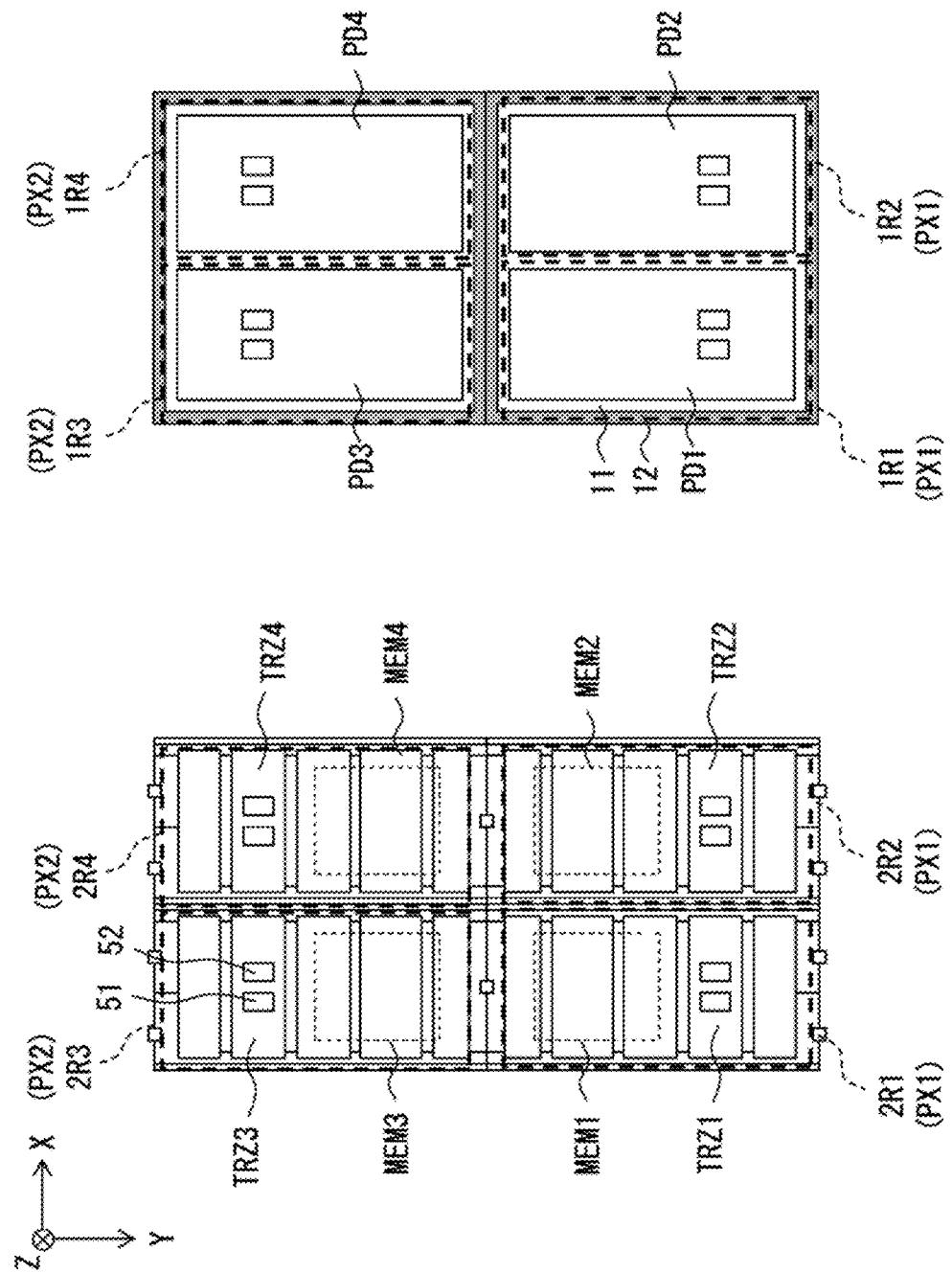

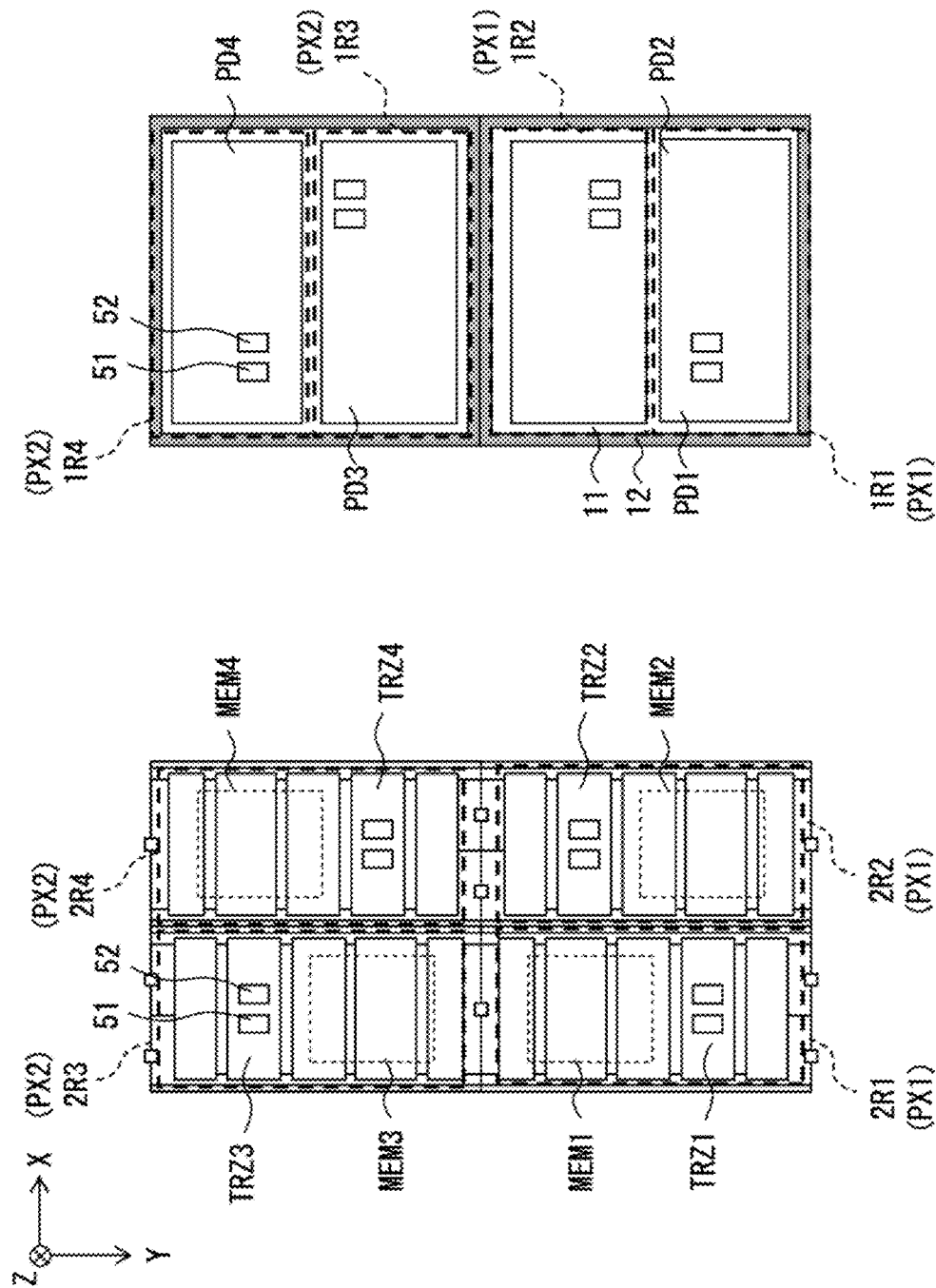

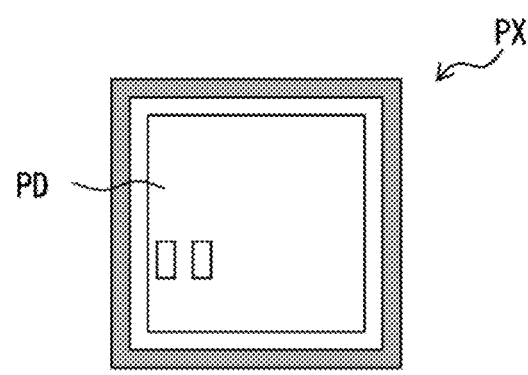
FIG. 19A
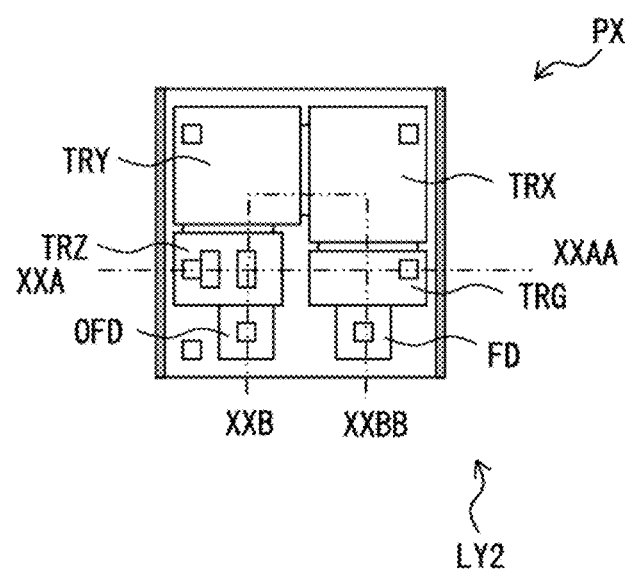
FIG. 19B

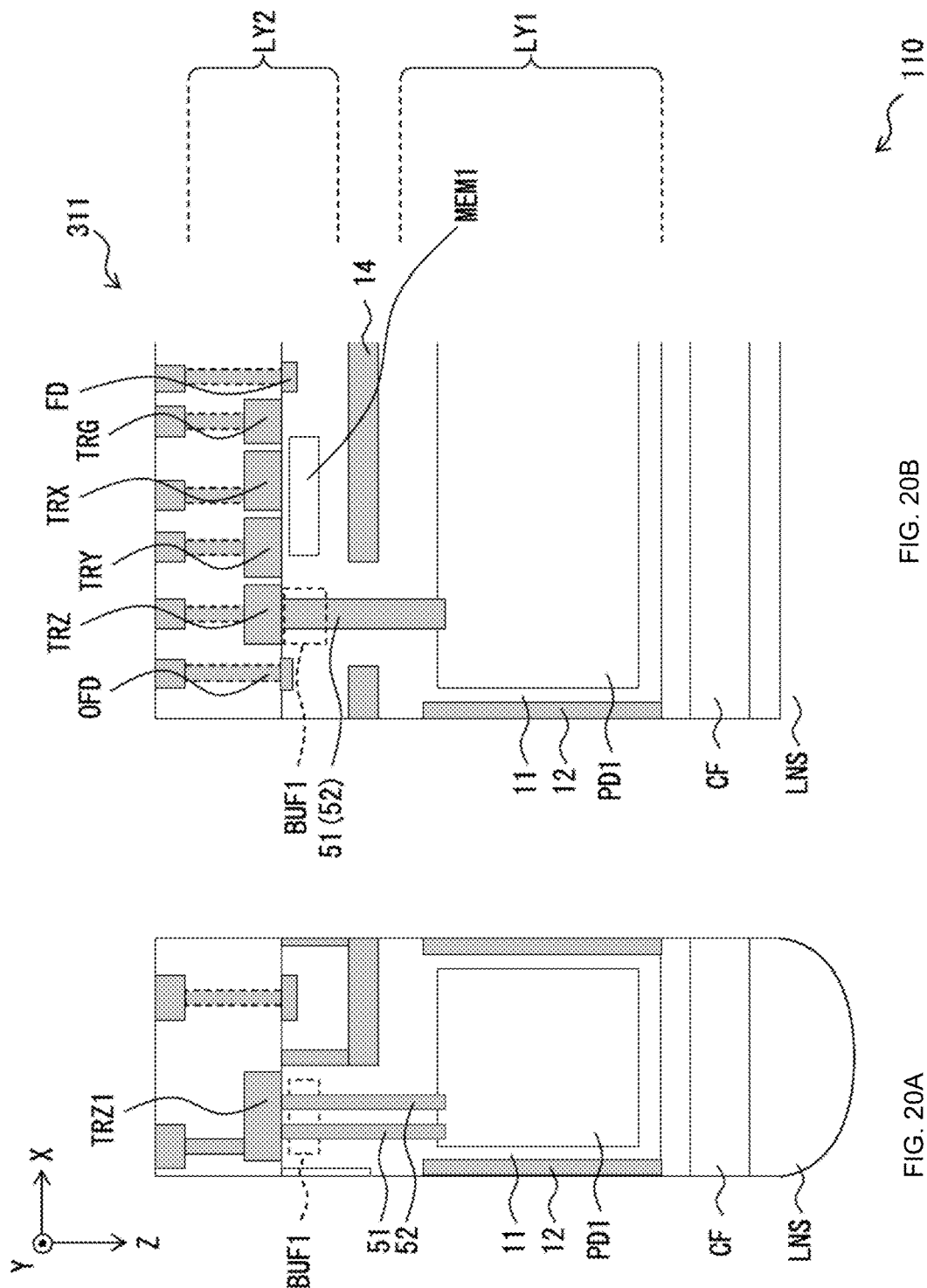

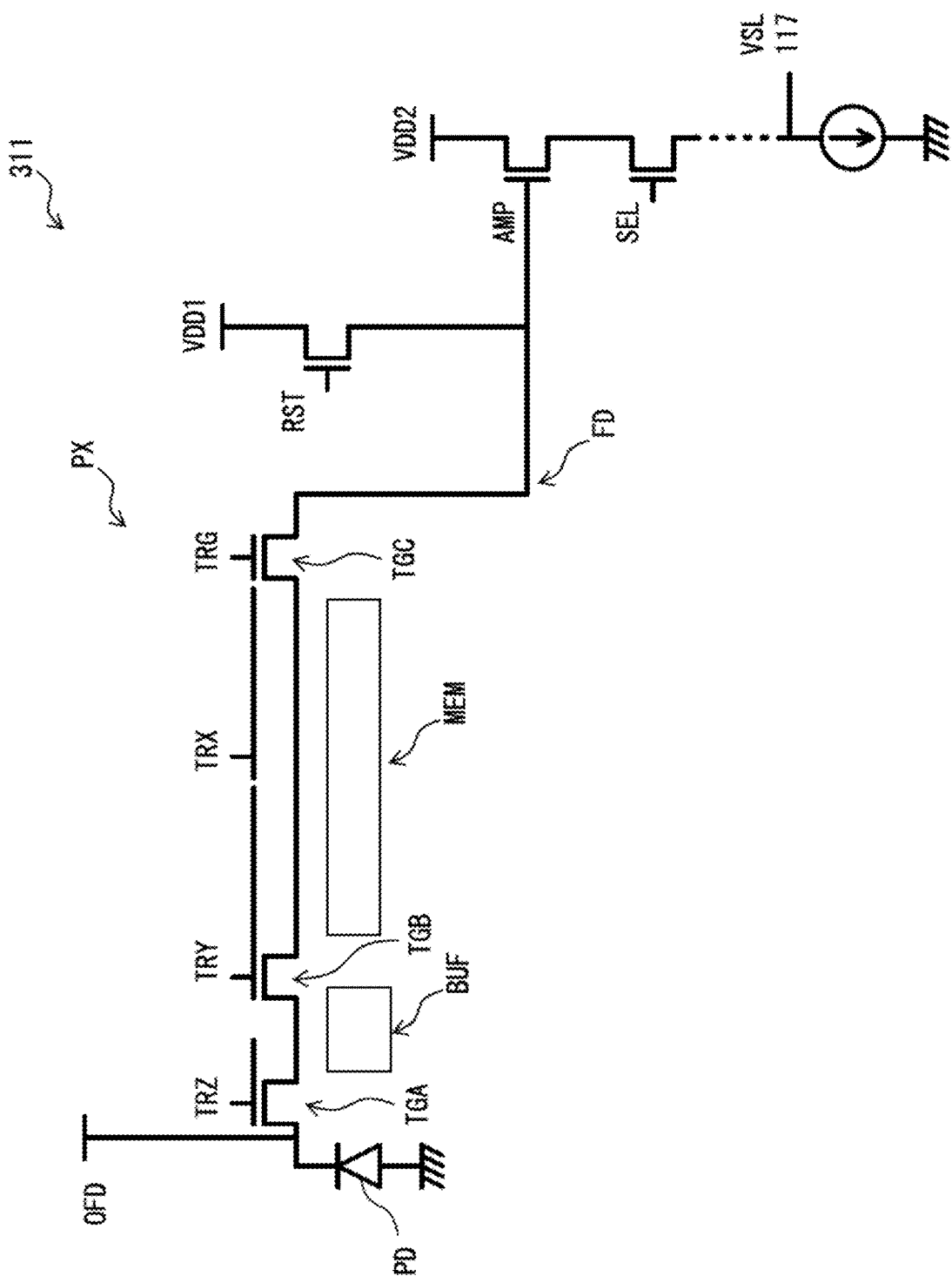
[FIG. 21]

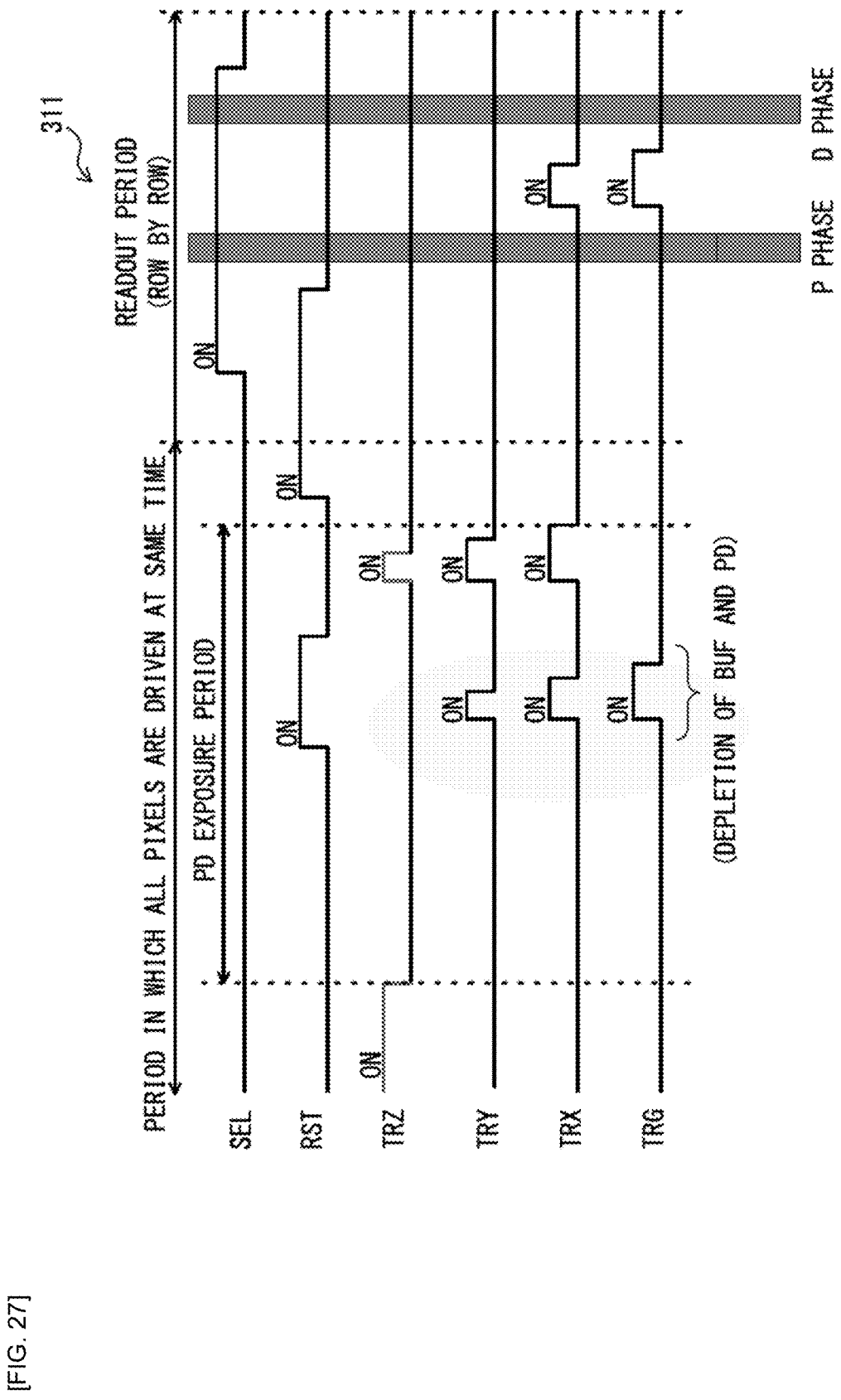
[FIG. 27]

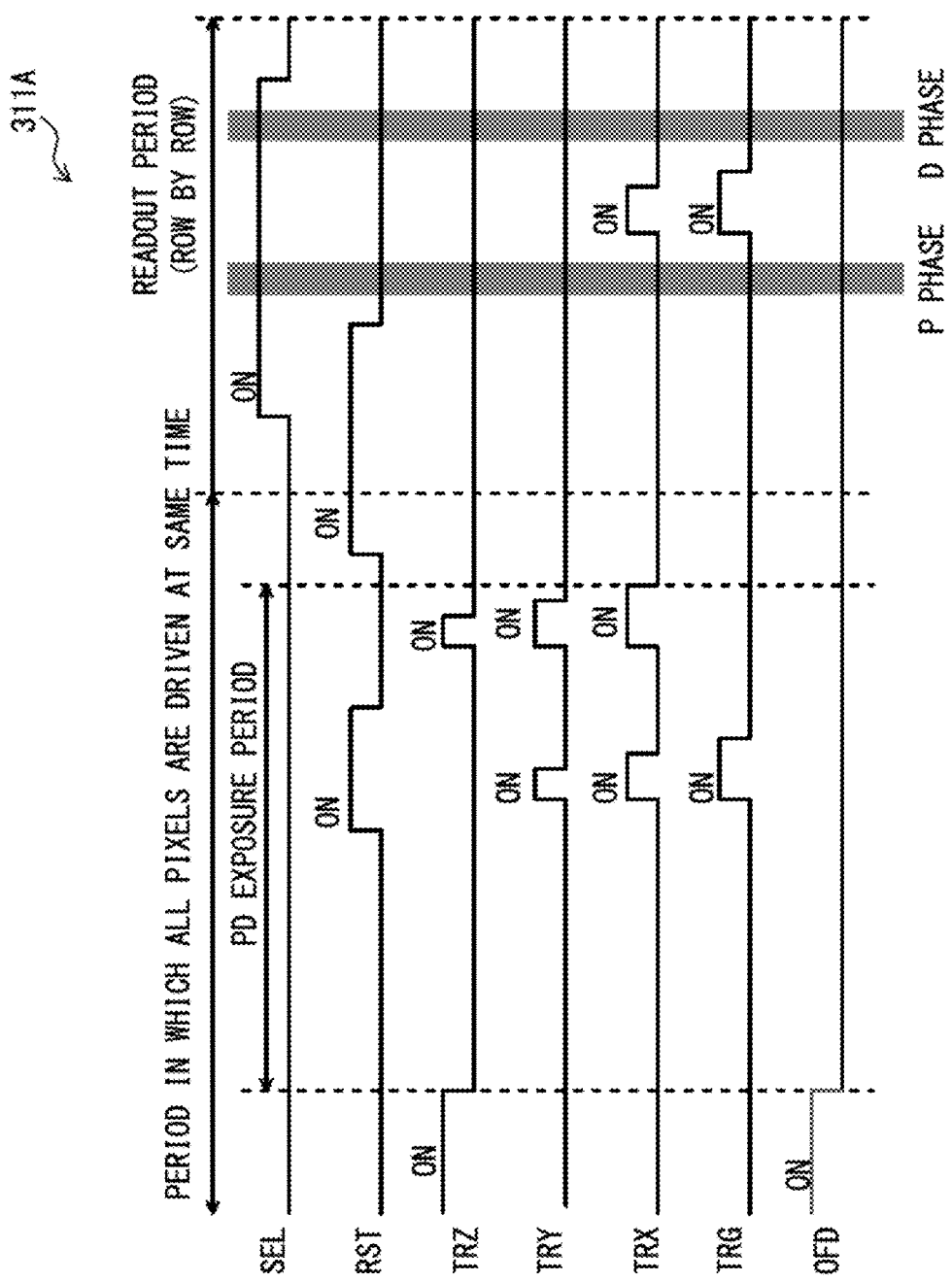
[FIG. 28]

[FIG. 30]
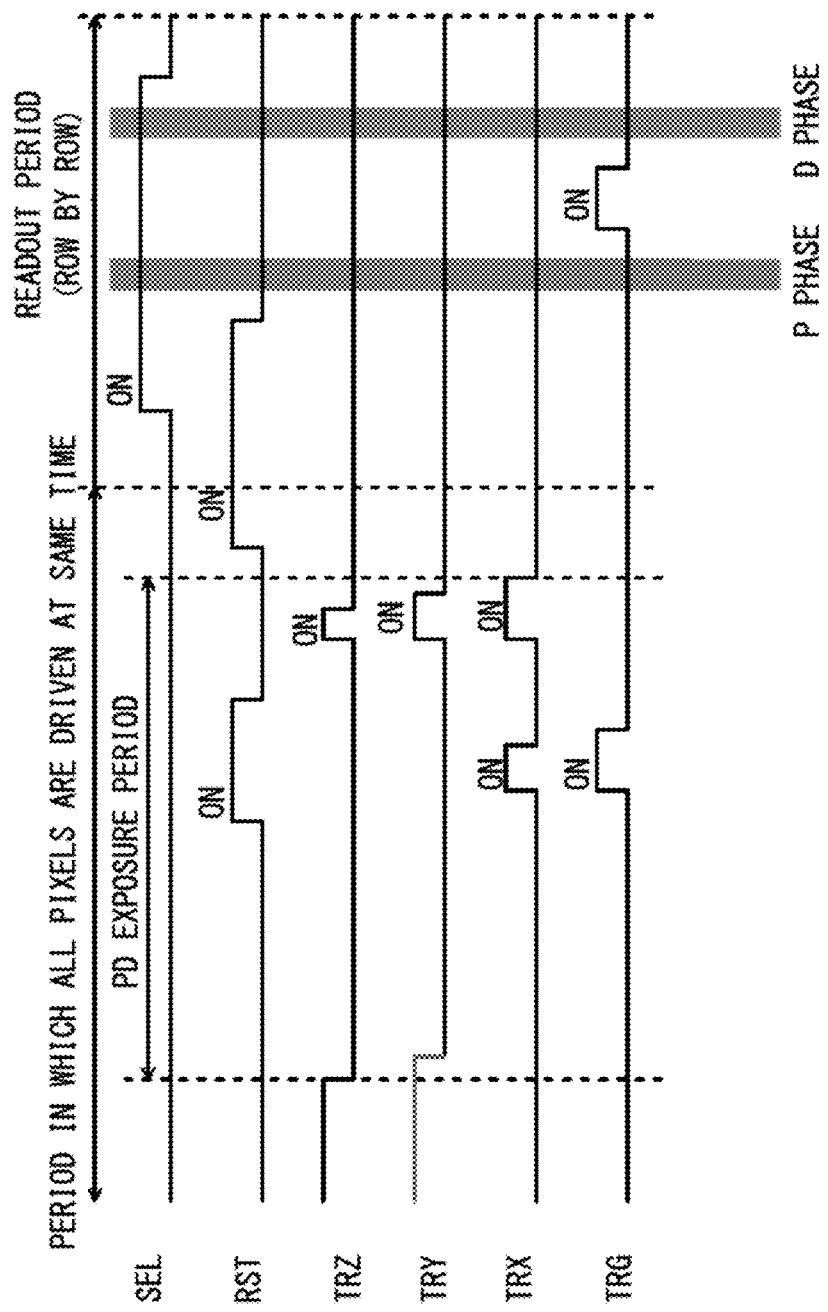

[FIG. 31]
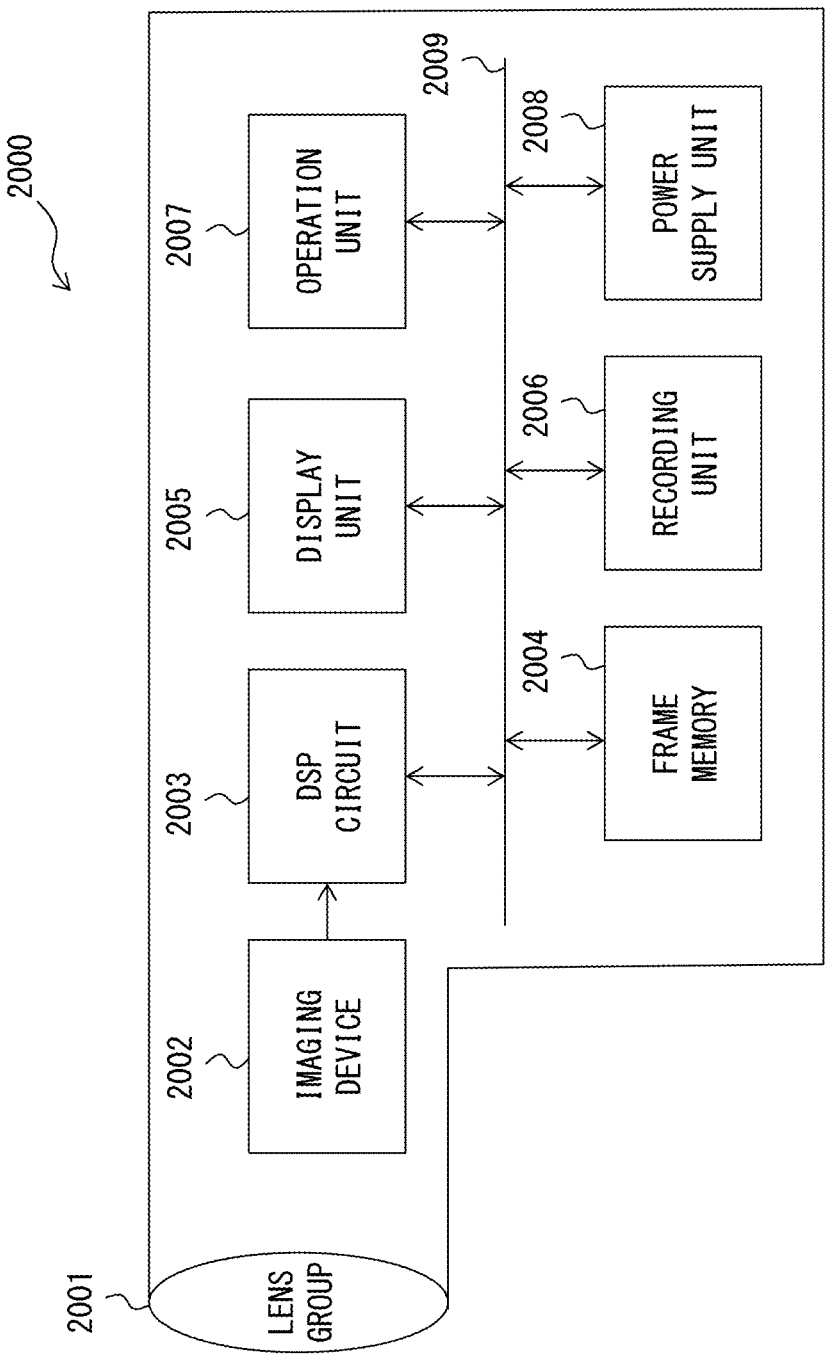

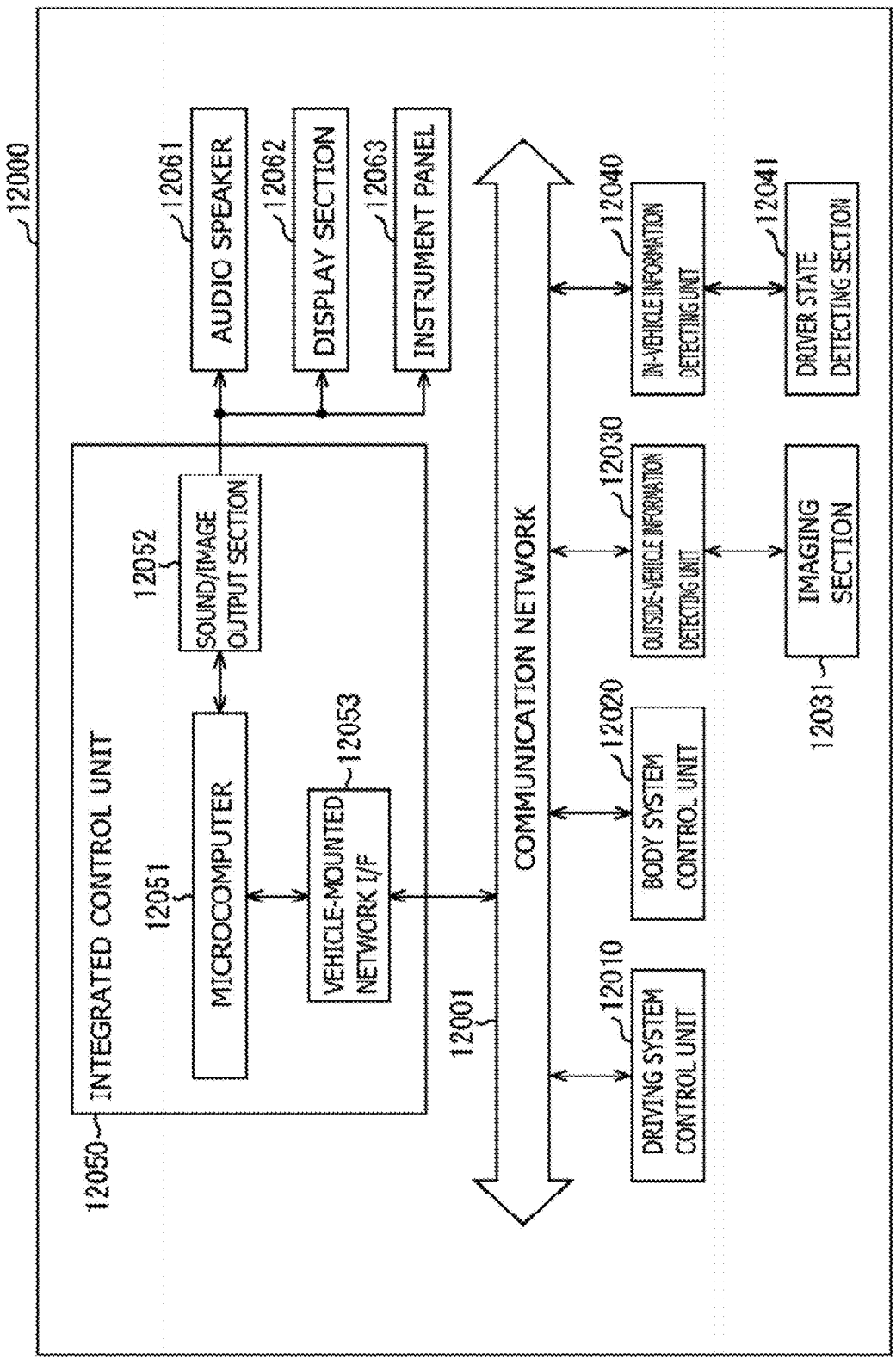
[FIG. 32]

[FIG. 33]
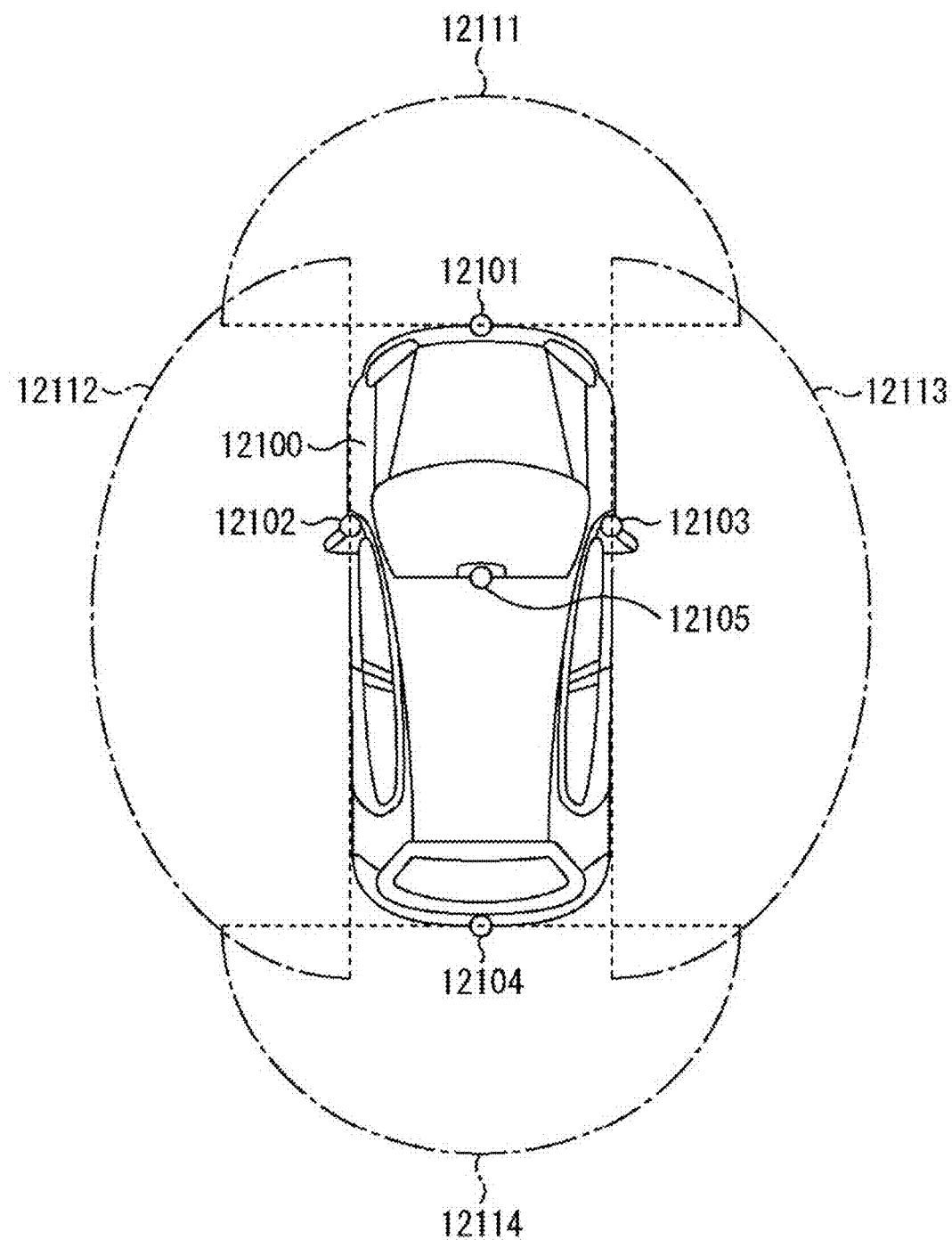

IMAGING DEVICE AND ELECTRONIC APPARATUS

CROSS REFERENCE TO RELATED APPLICATIONS

This application is a U.S. National Phase of International Patent Application No. PCT/JP2020/010509 filed on Mar. 11, 2020, which claims priority benefit of Japanese Patent Application No. JP 2019-063541 filed in the Japan Patent Office on Mar. 28, 2019. Each of the above-referenced applications is hereby incorporated herein by reference in its entirety.

TECHNICAL FIELD

The present disclosure relates to an imaging device that performs imaging by performing photoelectric conversion and an electronic apparatus including the imaging device.

BACKGROUND ART

The applicant of the present application has proposed an imaging device including a silicon substrate having a stacked structure in which a photodiode and a memory are stacked in a light incidence direction (see, for example, PTL 1).

CITATION LIST

Patent Literature

PTL 1: International Publication No. WO 2016/136486

SUMMARY OF THE INVENTION

Incidentally, such an imaging device is requested to have smaller dimensions in the in-plane direction orthogonal to the light incidence direction.

It is thus desirable to provide an imaging device that allows miniaturization to be achieved in the in-plane direction without impairing operation performance and an electronic apparatus including such an imaging device.

An imaging device serving as an embodiment of the present disclosure includes a plurality of pixels each having a stacked structure of a photoelectric conversion unit formation region and an electric charge holding unit formation region. The photoelectric conversion unit formation region includes a photoelectric conversion unit and has a first planar shape in a plane extending in a first direction and a second direction. The photoelectric conversion unit is configured to generate electric charge through photoelectric conversion. The electric charge corresponds to an amount of received light. The first direction and the second direction are orthogonal to each other. The first planar shape has a first aspect ratio. The electric charge holding unit formation region includes an electric charge holding unit and has a second planar shape in the plane. The electric charge holding unit is configured to hold the electric charge. The second planar shape has a second aspect ratio different from the first aspect ratio.

In addition, an electronic apparatus serving as an embodiment of the present disclosure includes the imaging device described above.

The configuration described above allows the imaging device and the electronic apparatus serving as the respective embodiments of the present disclosure to make a more efficient layout in the electric charge holding unit formation region and increase the proportion of area occupiable by the electric charge holding unit in the electric charge holding unit formation region.

BRIEF DESCRIPTION OF DRAWING

FIG. 1A is a block diagram illustrating a configuration example of an imaging device according to a first embodiment of the present disclosure. FIG. 1B is a block diagram illustrating a configuration example of an imaging device serving as a first modification example of the first embodiment.

FIG. 1C is a block diagram illustrating a configuration example of an imaging device serving as a second modification example of the first embodiment.

FIG. 2 is a circuit diagram illustrating a circuit configuration of one sensor pixel in the imaging device illustrated in FIG. 1A.

FIGS. 4A and 4B are schematic cross-sectional views of a cross-sectional configuration of the sensor pixel illustrated in FIGS. 3A and 3B.

FIGS. 5A, 5B, and 5C are schematic diagrams illustrating a planar configuration of several sensor pixels included in a pixel array unit illustrated in FIG. 1A for each of level layers.

FIG. 6A is a first circuit diagram illustrating a circuit configuration of a sensor pixel in a pixel array unit serving as a third modification example of the first embodiment.

FIG. 6B is a second circuit diagram illustrating the circuit configuration of the sensor pixel in the pixel array unit serving as the third modification example of the first embodiment.

FIGS. 11A, 11B, and 11C are plan views of a sensor pixel in a pixel array unit serving as a sixth modification example of the first embodiment.

FIGS. 12A and 12B are plan views of a sensor pixel in a pixel array unit serving as a seventh modification example of the first embodiment.

FIGS. 13A, 13B, and 13C are plan views of a sensor pixel in a pixel array unit serving as an eighth modification example of the first embodiment.

FIG. 14 is a circuit diagram illustrating a circuit configuration example of the pixel array unit illustrated in FIGS. 13A, 13B, and 13C.

FIGS. 17A and 17B are plan views of a sensor pixel in a pixel array unit according to a second embodiment of the present disclosure.

FIGS. 18A and 18B are plan views of a sensor pixel in a pixel array unit serving as a first modification example of the second embodiment of the present disclosure.

FIGS. 19A and 19B are plan views of a sensor pixel in a pixel array unit according to a third embodiment of the present disclosure.

FIGS. 20A and 20B are cross-sectional views of the sensor pixel illustrated in FIGS. 19A and 19B.

FIG. 21 is a circuit diagram illustrating a circuit configuration of the sensor pixel illustrated in FIGS. 19A and 19B.

FIG. 27 is a timing chart illustrating an operation of the sensor pixel illustrated in FIGS. 19A and 19B.

FIG. 28 is a timing chart illustrating an operation of a sensor pixel in a pixel array unit serving a first modification example of the third embodiment of the present disclosure.

MODES FOR CARRYING OUT THE INVENTION

Figures 3A, 3B:
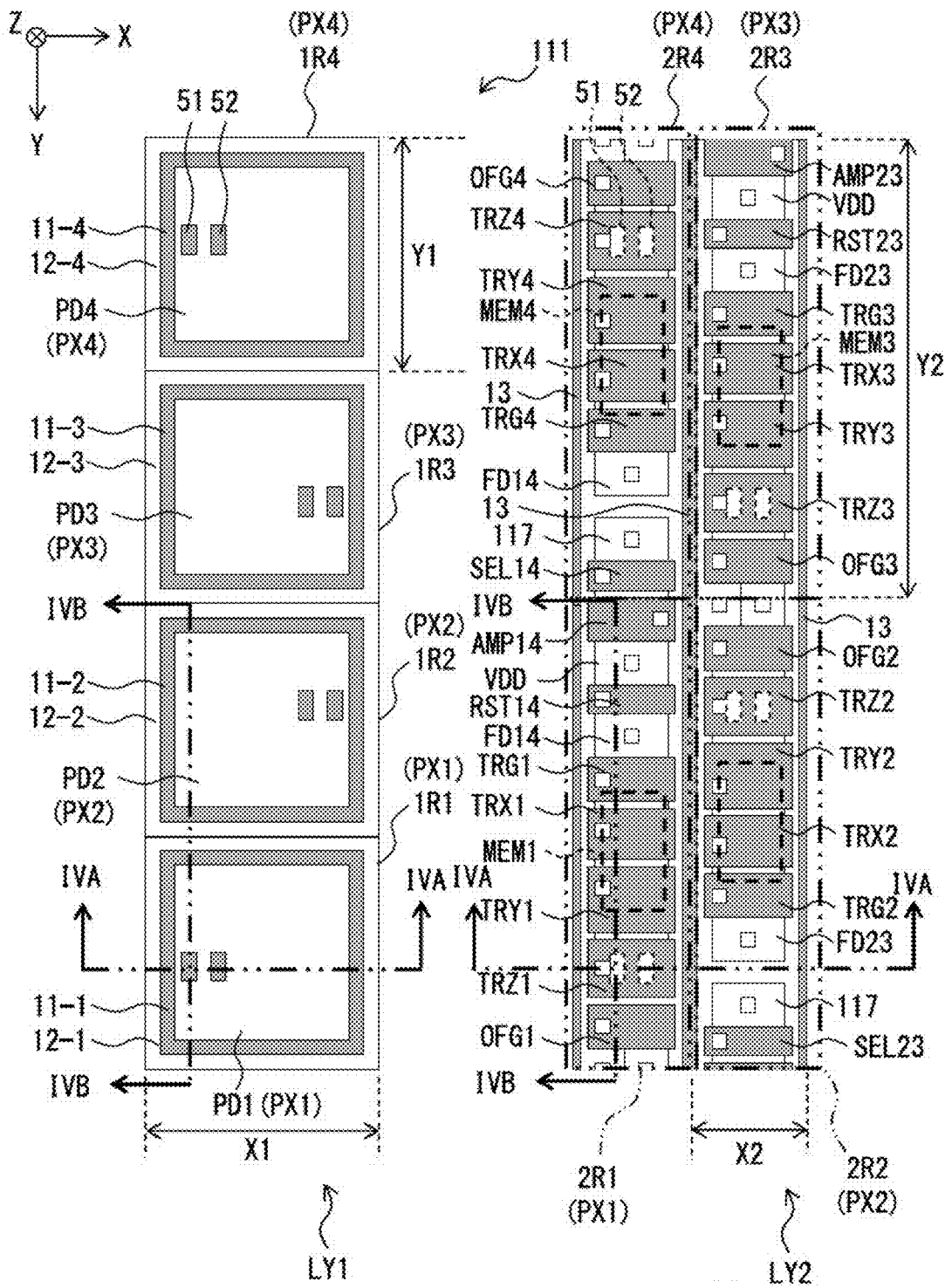
FIGS. 3A and 3B are schematic plan views of a planar configuration of a portion of the sensor pixels in the imaging device illustrated in FIG. 1A.
Figures 7A, 7B:
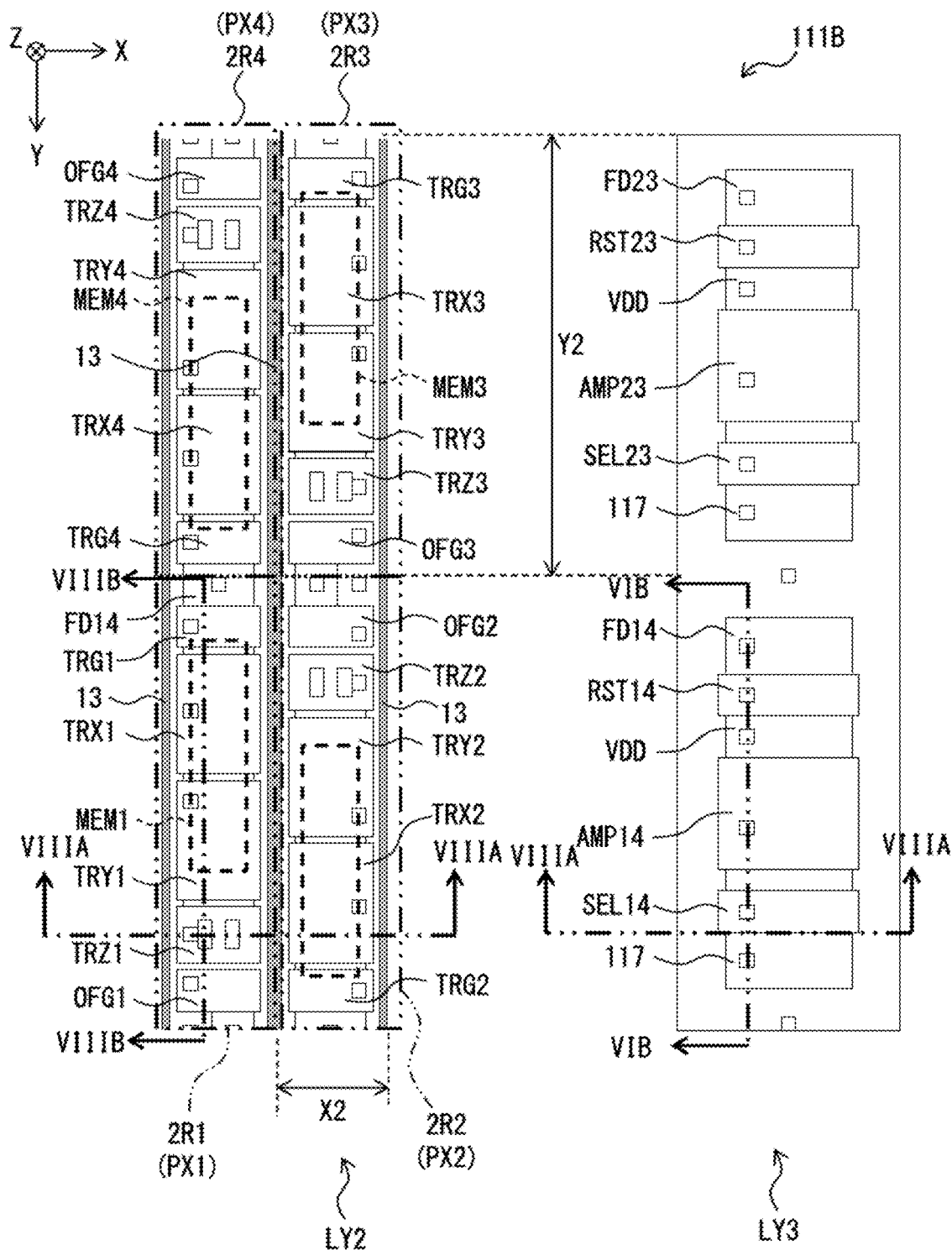
FIGS. 7A and 7B are plan views of a sensor pixel in a pixel array unit serving as a fourth modification example of the first embodiment.
Figures 8A, 8B:
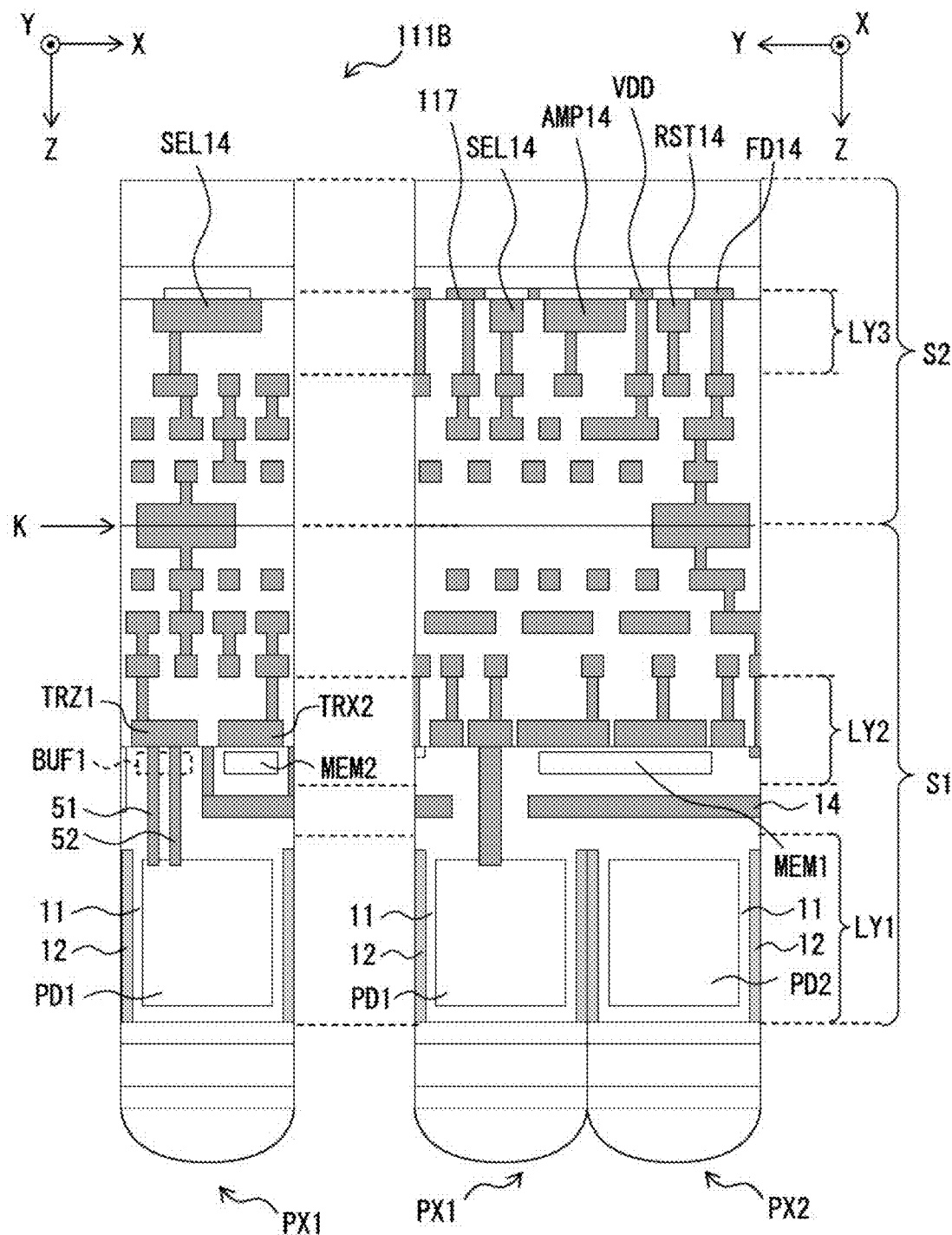
FIGS. 8A and 8B are cross-sectional views of the sensor pixel in the pixel array unit serving as the fourth modification example of the first embodiment.
Figures 9A, 9B:
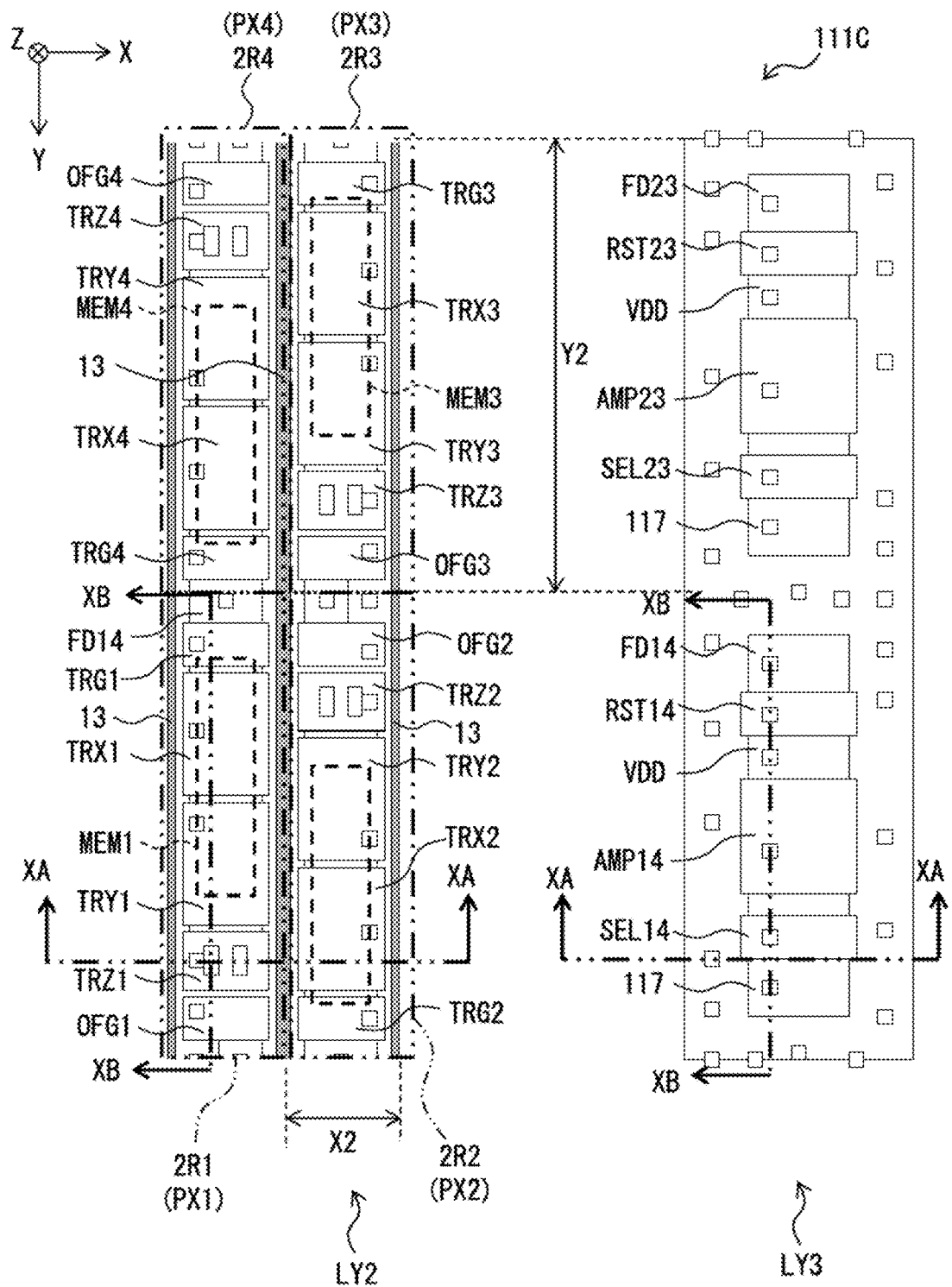
FIGS. 9A and 9B are plan views of a sensor pixel in a pixel array unit serving as a fifth modification example of the first embodiment.
Figures 10A, 10B:
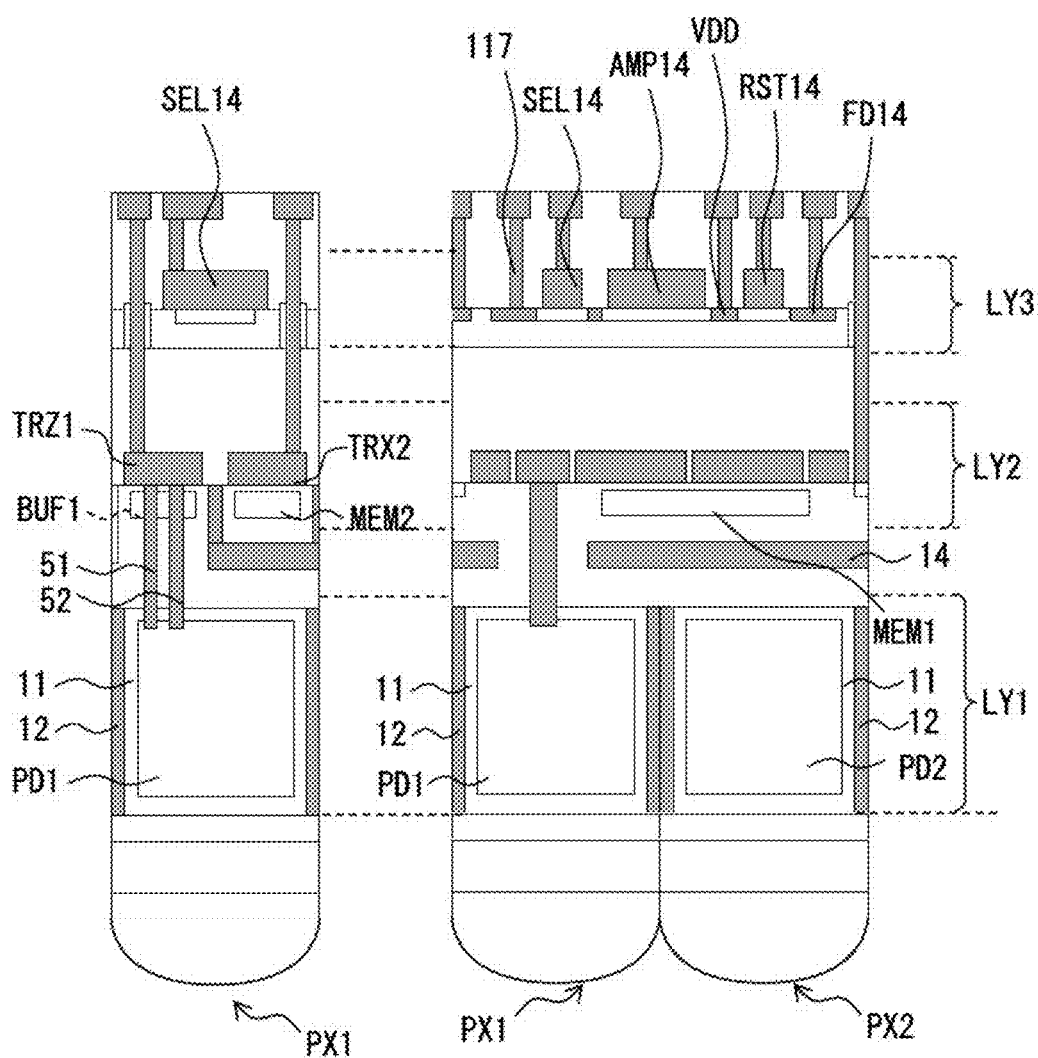
FIGS. 10A and 10B are cross-sectional views of the sensor pixel in the pixel array unit serving as the fifth modification example of the first embodiment.

The following describes embodiments of the present disclosure in detail with reference to the drawings. It is to be noted that description is given in the following order.

1. First Embodiment

An example of a solid-state imaging device in which the aspect ratio of a photoelectric conversion unit formation region and the aspect ratio of an electric charge holding unit formation region are different.

2. Modification Examples of First Embodiment

3. Second Embodiment

An example of a solid-state imaging device in which two respective sub-pixels divided in one pixel include a photoelectric conversion unit formation region and an electric charge holding unit formation region.

4. Modification Examples of Second Embodiment

An example of a solid-state imaging device in which the aspect ratio of a photoelectric conversion unit formation region and the aspect ratio of an electric charge holding unit formation region are different in two sub-pixels.

5. Third Embodiment

An example of a solid-state imaging device in which an electric charge conveyance path toward a discharge unit and an electric charge conveyance path toward an electric charge holding unit branch off in an electric charge transfer unit.

6. Modification Examples of Third Embodiment

7. Example of Application to Electronic Apparatus

8. Example of Application to Mobile Body

9. Other Modification Examples

1. First Embodiment

[Configuration of Solid-State Imaging Device 101]

FIG. 1A is a block diagram illustrating a functional configuration example of a solid-state imaging device 101 according to a first embodiment of the present technology.

The solid-state imaging device 101 is, for example, a back-illuminated image sensor of a so-called global shutter mode such as a CMOS (Complementary Metal Oxide Semiconductor) image sensor. The solid-state imaging device 101 receives light from a subject and performs photoelectric conversion. The solid-state imaging device 101 generates an image signal to capture an image.

The global shutter mode is a mode for performing global exposure in which exposure is basically begun at the same time for all the pixels and is finished at the same time for all the pixels. Here, all the pixels refer to all the pixels in the portion appearing in an image and exclude dummy pixels or the like. In addition, in a case where a time difference or image distortion is small enough to raise no issue, the global shutter mode also includes a mode of changing regions for global exposure while performing global exposure not at the same time for all the pixels, but for a plurality of rows (e.g., several tens of rows). In addition, the global shutter mode also includes a mode of performing global exposure for the pixels in a predetermined region rather than all the pixels in the portion appearing in an image.

The back-illuminated image sensor refers to an image sensor having a configuration in which a photoelectric conversion unit such as a photodiode is provided between a light receiving surface and a wiring layer. The photoelectric conversion unit receives light from a subject and converts the light into an electric signal. Light from a subject enters the light receiving surface. The wiring layer is provided with a wiring line of a transistor or the like that drives each of pixels.

The solid-state imaging device 101 includes, for example, a pixel array unit 111, a vertical drive unit 112, a column signal processing unit 113, a data storage unit 119, a horizontal drive unit 114, a system control unit 115, and a signal processing unit 118.

In the solid-state imaging device 101, the pixel array unit 111 is formed on a semiconductor substrate 11 (that is described below). Peripheral circuits such as the vertical drive unit 112, the column signal processing unit 113, the data storage unit 119, the horizontal drive unit 114, the system control unit 115, and the signal processing unit 118 are provided, for example, on the semiconductor substrate 11 as with the pixel array unit 111.

The pixel array unit 111 includes a plurality of sensor pixels PX each including a photoelectric conversion unit PD (that is described below) that generates electric charge corresponding to the amount of light coming from a subject and accumulates the electric charge. As illustrated in FIG. 1A, the sensor pixels PX are arranged in both the horizontal direction (the row direction) and the vertical direction (the column direction). In the pixel array unit 111, there is provided a pixel drive line 116 in the row direction for each of the pixel rows and there is provided a vertical signal line (VSL) 117 in the column direction for each of the pixel columns. Each of the pixel rows includes the sensor pixels PX arranged in line in the row direction. Each of the pixel columns includes the sensor pixels PX arranged in line in the column direction.

The vertical drive unit 112 includes a shift register, an address decoder, and the like. The vertical drive unit 112 drives all of the plurality of sensor pixels PX in the pixel array unit 111 at the same time or drives the plurality of sensor pixels PX in the pixel array unit 111 for each of the pixel rows by supplying the plurality of sensor pixels PX with signals or the like through the plurality of pixel drive lines 116.

The vertical drive unit 112 includes, for example, two scanning systems: a readout scanning system; and a sweep scanning system. The readout scanning system selectively scans the unit pixels in the pixel array unit 111 in order row by row to read out signals from the unit pixels. The sweep scanning system performs, on a readout row on which readout scanning is to be performed by the readout scanning system, sweep scanning earlier than the readout scanning by the time corresponding to the shutter speed.

This sweep scanning performed by the sweep scanning system sweeps unnecessary electric charge from the photoelectric conversion units PD of the unit pixels in the readout row. This is referred to as "resetting". Sweeping unnecessary electric charge by this sweeping scanning system or resetting then causes a so-called electronic shutter operation to be performed. Here, the electronic shutter operation refers to an operation of discharging the optical charge of the photoelectric conversion unit PD and newly beginning exposure or newly beginning to accumulate optical charge.

A signal to be read out by a readout operation by the readout scanning system corresponds to the amount of light that has come after the readout operation or the electronic shutter operation performed immediately before. The accumulation time of optical charge in the unit pixel or the exposure time is the period from the readout timing of the readout operation performed immediately before or the sweep timing of the electronic shutter operation performed immediately before to the readout timing of the readout operation performed this time.

The signal to be outputted from each unit pixel in the pixel row selectively scanned by the vertical drive unit 112 is supplied to the column signal processing unit 113 through each of the vertical signal lines 117. The column signal processing unit 113 performs predetermined signal processing on the signal outputted from each unit pixel in the selected row through the vertical signal line 117 for each of the pixel columns of the pixel array unit 111 and temporarily holds the pixel signal that has been subjected to the signal processing.

Specifically, the column signal processing unit 113 includes, for example, a shift register, an address decoder, and the like and performs a noise removal process, a correlation double sampling process, an A/D (Analog/Digital) conversion A/D conversion process on an analog pixel signal, and the like to generate a digital pixel signal. The column signal processing unit 113 supplies the generated pixel signal to the signal processing unit 118.

The horizontal drive unit 114 includes a shift register, an address decoder, and the like and selects, in order, unit circuits corresponding to pixel columns of the column signal processing unit 113. The selective scanning by this horizontal drive unit 114 causes the pixel signals that have been subjected to signal processing for each of the unit circuits in the column signal processing unit 113 to be outputted to the signal processing unit 118 in order.

The system control unit 115 includes a timing generator or the like that generates a variety of timing signals. The system control unit 115 performs drive control on the vertical drive unit 112, the column signal processing unit 113, and the horizontal drive unit 114 on the basis of the timing signals generated by the timing generator.

While temporarily storing data in the data storage unit 119 as necessary, the signal processing unit 118 performs signal processing such as an arithmetic process on the pixel signals supplied from the column signal processing unit 113 and outputs an image signal including each of the pixel signals.

The data storage unit 119 temporarily holds data necessary for the signal processing unit 118 to perform signal processing.

It is to be noted that the solid-state imaging device according to the present technology is not limited to the solid-state imaging device 101 illustrated in FIG. 1A, but may have a configuration such as that of a solid-state imaging device 101A illustrated in FIG. 1B or that of a solid-state imaging device 101B illustrated in FIG. 1C, for example. FIG. 1B is a block diagram illustrating a configuration example of the solid-state imaging device 101A serving as a first modification example according to the first embodiment of the present technology. FIG. 1C is a block diagram illustrating a configuration example of the solid-state imaging device 101B serving as a second modification example according to the first embodiment of the present technology In the solid-state imaging device 101A illustrated in FIG. 1B, the data storage unit 119 is provided between the column signal processing unit 113 and the horizontal drive unit 114 and a pixel signal outputted from the column signal processing unit 113 is supplied to the signal processing unit 118 through the data storage unit 119.

In addition, the solid-state imaging device 101B in FIG. 1C is provided with the data storage unit 119 and the signal processing unit 118 in parallel between the column signal processing unit 113 and the horizontal drive unit 114. In the solid-state imaging device 101B, the column signal processing unit 113 performs A/D conversion for each of the columns of the pixel array unit 111 or for a plurality of columns of the pixel array unit 111. The A/D conversion converts an analog pixel signal into a digital pixel signal.

[Configuration of Sensor Pixel PX]

Circuit Configuration Example

Next, with reference to FIG. 2, a circuit configuration example of the sensor pixel PX provided in the pixel array unit 111 in FIG. 1A is described. FIG. 2 illustrates a circuit configuration example of two sensor pixels PX1 and PX4 of the plurality of sensor pixels PX included in the pixel array unit 111. Each of the plurality of sensor pixels PX other than the sensor pixels PX1 and PX4 also has a substantially similar configuration. It is to be noted that the sensor pixel PX1 and the sensor pixel PX4 are disposed to sandwich two other sensor pixels PX2 and PX3 as illustrated in FIGS. 3A and 3B described below.

In the example illustrated in FIG. 2, the sensor pixels PX (PX1 and PX4) in the pixel array unit 111 achieve a memory-holding global shutter.

The sensor pixel PX1 includes a photoelectric conversion unit PD1, first to third transfer transistors TG1A to TG1C, an electric charge holding unit MEM1, a discharge transistor OFG1, a discharge unit OFD1, and a buffer BUF1. The first transfer transistor TG1A includes a transfer gate TRZ1, the second transfer transistor TG1B includes a transfer gate TRY1 and a transfer gate TRX1, and the third transfer transistor TG1C includes a transfer gate TRG1.

Similarly, the sensor pixel PX4 includes a photoelectric conversion unit PD4, first to third transfer transistors TG4A to TG4C, an electric charge holding unit MEM4, a discharge transistor OFG4, a discharge unit OFD4, and a buffer BUF4. The first transfer transistor TG4A includes a transfer gate TRZ4, the second transfer transistor TG4B includes a transfer gate TRY4 and a transfer gate TRX4, and the third transfer transistor TG4C includes a transfer gate TRG4.

Further, the sensor pixel PX1 and the sensor pixel PX4 share power supplies VDD1 and VDD2, an electric charge voltage conversion unit FD14, a reset transistor RST14, an amplification transistor AMP14, a selection transistor SEL14, and the like.

In this example, all of the first to third transfer transistors TG1A to TG1C, the first to third transfer transistors TG4A to TG4C, the reset transistor RST14, the amplification transistor AMP14, and the selection transistor SEL14 are N-type MOS transistors. The respective gate electrodes of these first to third transfer transistors TG1A to TG1C, first to third transfer transistors TG4A to TG4C, reset transistor RST14, amplification transistor AMP14, and selection transistor SEL14 are each supplied with drive signals from the vertical drive unit 112 and the horizontal drive unit 114 on the basis of the drive control by the system control unit 115. Each of those drive signals is a pulse signal whose high level state corresponds to an active state (an on state) and whose low level state corresponds to an inactive state (an off state). It is to be noted that the following also refers to bringing a drive signal into the active state as turning on the drive signal and refers to bringing a drive signal into the inactive state as turning off the drive signal.

Each of the photoelectric conversion units PD1 and PD4 is, for example, a photoelectric conversion element including a PN-junction photodiode. Each of the photoelectric conversion units PD1 and PD4 is configured to receive light from a subject, generate electric charge corresponding to the amount of received light through photoelectric conversion, and accumulate the electric charge.

The electric charge holding units MEM1 and MEM4 are respectively provided between the photoelectric conversion units PD1 and PD4 and the electric charge voltage conversion unit FD14. The electric charge holding units MEM1 and MEM4 are regions that temporarily hold the electric charge generated and accumulated in the photoelectric conversion units PD1 and PD4 until the electric charge is transferred to the electric charge voltage conversion unit FD14 to achieve a global shutter function.

The first transfer transistor TG1A and the second transfer transistor TG1B are disposed in order between the photoelectric conversion unit PD1 and the electric charge holding unit MEM1. The third transfer transistor TG1C is disposed between the electric charge holding unit MEM1 and the electric charge voltage conversion unit FD14. The first transfer transistor TG1A and the second transfer transistor TG1B are each configured to transfer the electric charge accumulated in the photoelectric conversion unit PD1 to the electric charge holding unit MEM1 in accordance with a drive signal applied to the gate electrode thereof.

Similarly, the first transfer transistor TG4A and the second transfer transistor TG4B are disposed in order between the photoelectric conversion unit PD4 and the electric charge holding unit MEM4. The third transfer transistor TG4C is disposed between the electric charge holding unit MEM4 and the electric charge voltage conversion unit FD14. The first transfer transistor TG4A and the second transfer transistor TG4B are each configured to transfer the electric charge accumulated in the photoelectric conversion unit PD4 to the electric charge holding unit MEM4 in accordance with a drive signal applied to the gate electrode thereof.

The third transfer transistor TG1C and the third transfer transistor TG4C are respectively configured to transfer the electric charge temporarily held in the electric charge holding unit MEM1 and the electric charge holding unit MEM4 to the electric charge voltage conversion unit FD14 in accordance with drive signals applied to the gate electrodes thereof. The first to third transfer transistors TG1A to TG1C and the first to third transfer transistors TG4A to TG4C are specific examples corresponding to an "electric charge transfer unit" according to the present disclosure.

For example, in a case where the second transfer transistors TG1B and TG4B are turned off and the third transfer transistors TG1C and TG4C are turned on in the sensor pixels PX1 and PX4, the electric charge held in the respective electric charge holding units MEM1 and MEM4 is transferred to the electric charge voltage conversion unit FD14 through the third transfer transistors TG1C and TG4C.

Each of the buffers BUF1 and BUF4 is an electric charge accumulation region formed between the first transfer transistor TG1A and the second transfer transistor TG1B.

The reset transistor RST14 has the drain coupled to the power supply VDD1 and the source coupled to the electric charge voltage conversion unit FD14. The reset transistor RST14 initializes or resets the electric charge voltage conversion unit FD14 in accordance with the drive signal applied to the gate electrode thereof. For example, in a case where the reset transistor RST14 is turned on by the drive signal, the potential of the electric charge voltage conversion unit FD14 is reset to the voltage level of the power supply VDD1. That is, the electric charge voltage conversion unit FD14 is initialized.

The electric charge voltage conversion unit FD14 is a floating diffusion region that converts, into electric signals (e.g., voltage signals), the electric charge transferred from the photoelectric conversion units PD1 and PD4 through the first to third transfer transistors TG1A to TG1C and TG4A to TG4C and the electric charge holding units MEM1 and MEM45 and outputs the converted electric signals. The reset transistor RST14 is coupled to the electric charge voltage conversion unit FD14 and VSL 117 is coupled through the amplification transistor AMP14 and the selection transistor SEL14.

The amplification transistor AMP14 outputs an electric signal corresponding to the potential of the electric charge voltage conversion unit FD14. The amplification transistor AMP14 is included, for example, in a source follower circuit along with a constant current source provided in the column signal processing unit 113. The selection transistor SEL14 is turned on in a case where the sensor pixel PX is selected. The selection transistor SEL14 outputs an electric signal supplied from the electric charge voltage conversion unit FD14 through the amplification transistor AMP14 to the column signal processing unit 113 through the VSL 117.

The sensor pixels PX1 and PX4 further include the discharge units OFD1 and OFD4, respectively, as transfer destinations of the electric charge of the photoelectric conversion units PD1 and PD4 in addition to the electric charge voltage conversion unit FD14. The discharge transistor OFG1 is disposed between the buffer BUF1 and the discharge unit OFD1 and the discharge transistor OFG4 is disposed between the buffer BUF4 and the discharge unit OFD4.

The discharge transistor OFG1 has the drain coupled to the discharge unit OFD1 and the source coupled to the buffer BUF1. Similarly, the discharge transistor OFG4 has the drain coupled to the discharge unit OFD4 and the source coupled to the buffer BUF4. The discharge transistors OFG1 and OFG4 initialize or reset the photoelectric conversion units PD1 and PD4 in accordance with the drive signals applied to the respective gate electrodes. Resetting the photoelectric conversion units PD1 and PD4 means depleting the photoelectric conversion units PD1 and PD4.

In addition, each of the discharge transistors OFG1 and OFG4 forms an overflow path. The discharge transistors OFG1 and OFG4 respectively discharge electric charge overflowing from the photoelectric conversion units PD1 and PD4 to the discharge units OFD1 and OFD4. It is, however, necessary to turn on the discharge transistors OFG1 and OFG4 and turn on the transfer gates TRZ1 and TRZ4 in a case where the photoelectric conversion units PD1 and PD4 are reset.

(Planar Configuration Example and Cross-sectional Configuration Example)

Next, with reference to FIGS. 3A, 3B, 4A, 4B, 5A, 5B, and 5C, a planar configuration example and a cross-sectional configuration example of the sensor pixel PX provided in the pixel array unit 111 in FIG. 1A are described.

FIGS. 3A and 3B illustrate a planar configuration example of the four sensor pixels PX1 to PX4 of the plurality of sensor pixels PX included in the pixel array unit 111. (A) of FIG. 3A is a plan view of a planar configuration of a first level layer LY1 taken along the XY plane and FIG. 3B is a plan view of a planar configuration of a second level layer LY2 taken along the XY plane. It is to be noted that the planar configuration of the plurality of sensor pixels PX other than the sensor pixels PX1 to PX4 is substantially the same as that of the sensor pixels PX1 to PX4.

FIG. 4A is a cross-sectional view of a cross section in an arrow direction taken along the IVA-IVA cutting line in the X axis direction. The IVA-IVA cutting line extends through the sensor pixel PX1 illustrated in FIGS. 3A and 3B. In addition, FIG. 4B is a cross-sectional view of a cross section in an arrow direction taken along the IVB-IVB cutting line in the Y axis direction.

As illustrated in FIGS. 3A, 3B, 4A, and 4B, each of the sensor pixels PX1 to PX4 has a stacked structure of the first level layer LY1 including a photoelectric conversion unit formation region 1R (1R1 to 1R4) and the second level layer LY2 including an electric charge holding unit formation region 2R (2R1 to 2R4).

Each of the photoelectric conversion unit formation regions 1R1 to 1R4 is a rectangular region having a first aspect ratio AR1 (=X1/Y1) defined by a width X1 and a length Y1 in the XY plane. In the present embodiment, the photoelectric conversion unit formation regions 1R1 to 1R4 are arranged in line in the Y axis direction. FIGS. 3A and 3B illustrate an example in which the first aspect ratio AR1 is 1. In other words, the width X1 and the length Y1 are equal.

Each of the electric charge holding unit formation regions 2R1 to 2R4 is a rectangular region having a second aspect ratio AR2 (=X2/Y2) defined by a width X2 and a length Y2 in the XY plane. Here, the first aspect ratio AR1 and the second aspect ratio AR2 are different. The electric charge holding unit formation regions 2R1 to 2R4 are arranged in a matrix, for example, to cause the electric charge holding unit formation region 2R1 and the electric charge holding unit formation region 2R2 to be adjacent in the X axis direction, cause the electric charge holding unit formation region 2R3 and the electric charge holding unit formation region 2R4 to be adjacent in the X axis direction, cause the electric charge holding unit formation region 2R1 and the electric charge holding unit formation region 2R4 to be adjacent in the Y axis direction, and cause the electric charge holding unit formation region 2R2 and the electric charge holding unit formation region 2R3 to be adjacent in the Y axis direction. FIGS. 3A and 3B illustrate an example in which the second aspect ratio AR2 is 4. In other words, the length Y2 is four times as great dimensions as the width X2. It is to be noted that, in FIGS. 3A and 3B, the width X2 is half as great dimensions as the width X1 and the length Y2 is two times as great dimensions as the length Y1.

In addition, in the present embodiment, the first longitudinal direction of the photoelectric conversion unit formation region 1R and the second longitudinal direction of the electric charge holding unit formation region 2R substantially match or are substantially orthogonal to each other. In other words, the second longitudinal direction of the electric charge holding unit formation region 2R is the Y axis direction. This means that, in a case where the first longitudinal direction of the photoelectric conversion unit formation region 1R is the X axis direction along the width X1, the second longitudinal direction is substantially orthogonal to the first longitudinal direction. Meanwhile, in a case where the first longitudinal direction of the photoelectric conversion unit formation region 1R is the Y axis direction along the length Y1, the second longitudinal direction substantially matches the first longitudinal direction.

In addition, in the pixel array unit 111 according to the present embodiment, the pixels PX1 to PX4 illustrated in FIGS. 3A and 3B are used as a minimum unit and repeatedly arranged along both the X axis direction and the Y axis direction. As described above, the first aspect ratio AR1 and the second aspect ratio AR2 are different. The first arrangement pitch of the photoelectric conversion unit formation regions 1R and the second arrangement pitch of the electric charge holding unit formation regions 2R are thus different from each other in the X axis direction. In the example of FIGS. 3A and 3B, the second arrangement pitch is equal to the width X2 while the first arrangement pitch is equal to the width X1. In other words, the two electric charge holding unit formation regions 2R are disposed for the one photoelectric conversion unit formation region 1R in the X axis direction. Meanwhile, the third arrangement pitch of the photoelectric conversion unit formation regions 1R and the fourth arrangement pitch of the electric charge holding unit formation regions 2R are also different from each other in the Y axis direction. In the example of FIGS. 3A and 3B, the fourth arrangement pitch is equal to the length Y2 while the third arrangement pitch is equal to the length Y1. In other words, the one electric charge holding unit formation region 2R is disposed for the two photoelectric conversion unit formation regions 1R in the Y axis direction. In this way, in the present embodiment, the electric charge holding unit formation region 2R1 is not provided only immediately above the photoelectric conversion unit formation region 1R1, for example, included in the pixel PX1, but the electric charge holding unit MEM1 is formed over both the photoelectric conversion unit formation region 1R1 and the photoelectric conversion unit formation region 1R2. Similarly, the electric charge holding unit formation region 2R2 is not provided only immediately above the photoelectric conversion unit formation region 1R2 included in the pixel PX2, but the electric charge holding unit MEM2 is formed over both the photoelectric conversion unit formation region 1R1 and the photoelectric conversion unit formation region 1R2. In other words, the photoelectric conversion unit formation region 1R1 overlaps with a portion of the electric charge holding unit formation region 2R1 and a portion of the electric charge holding unit formation region 2R2. The photoelectric conversion unit formation region 1R2 overlaps with the remaining portion of the electric charge holding unit formation region 2R1 and the remaining portion of the electric charge holding unit formation region 2R2.

In the example of FIGS. 3A and 3B, a first ratio (X2/X1) of the width X2 to the width X1 is substantially equal to the inverse of a second ratio (Y2/Y1) of the length Y2 to the length Y1. The width X1 is the first arrangement pitch. The width X2 is the second arrangement pitch. The length Y1 is the third arrangement pitch. The length Y2 is the fourth arrangement pitch.

Each of the sensor pixels PX1 to PX4 includes the semiconductor substrate 11 (11-1 to 11-4) and the photoelectric conversion unit PD (PD1 to PD4) in the first level layer LY1. The semiconductor substrate 11 (11-1 to 11-4) is formed by using a semiconductor material such as Si (silicon). The photoelectric conversion unit PD (PD1 to PD4) is embedded in the semiconductor substrate 11. In addition, as illustrated in FIGS. 4A and 4B, the semiconductor substrate 11 includes a front surface 11S1 and a back surface 11S2 opposite to the front surface 11S1. The back surface 11S2 is a surface that receives light from the outside. The back surface 11S2 is provided with a color filter formation layer LY0 including a color filter CF. The color filter CF is further provided with an on-chip lens LNS on the opposite side to the back surface 11S2. In addition, the front portions of two vertical trench gates 51 and 52 are in contact with the photoelectric conversion unit PD (PD1 to PD4). The two vertical trench gates 51 and 52 extend from the lower portion of the transfer gate TRZ (TRZ1 to TRZ4) in the depth direction (the +Z direction). The transfer gate TRZ (TRZ1 to TRZ4) is provided on the front surface 11S1.

There is further provided an element separation unit 12 (12-1 to 12-4) in the first level layer LY1 of the semiconductor substrate 11. The element separation unit 12 (12-1 to 12-4) surrounds each of the photoelectric conversion units PD (PD1 to PD4). The element separation unit 12 is a wall-shaped member that extends in the Z axis direction at a boundary position between the sensor pixels PX adjacent to each other to penetrate the semiconductor substrate 11 and surrounds each of the photoelectric conversion units PD. The element separation unit 12 electrically separates the sensor pixels PX adjacent to each other. In addition, the element separation unit 12 prevents the generation of noise such as color mixing caused by the entry of leakage light from the adjacent sensor pixel PX into each of the photoelectric conversion units PD (PD1 to PD4). The element separation unit 12 includes, for example, an insulating material such as silicon oxide.

In the electric charge holding unit formation regions 2R1 to 2R4, the electric charge holding units MEM1 to MEM4 are respectively formed. In addition, for example, in the electric charge holding unit formation region 2R1, the discharge transistor OFG1, the first to third transfer transistors TG1A to TG1C, the electric charge voltage conversion unit FD14, the reset transistor RST14, a power supply VDD, the amplification transistor AMP14, the selection transistor SEL14, and the like are arranged in the Y axis direction. It is to be noted that the electric charge holding unit MEM1 is positioned, for example, below the transfer gates TRY1, TRX1, and TRG1. The same applies to the other electric charge holding unit formation regions 2R2 to 2R4.

Each of the electric charge holding unit formation regions 2R1 to 2R4 is provided with the two vertical trench gates 51 and 52 arranged in the X axis direction. The vertical trench gates 51 and 52 are included in a portion of the electric charge transfer unit. The vertical trench gates 51 and 52 connect the photoelectric conversion units PD1 to PD4 and the transfer gates TRZ1 to TRZ4, respectively. The vertical trench gates 51 and 52 serve as paths for transferring electric charge from the photoelectric conversion units PD1 to PD4 to the electric charge holding units MEM1 to MEM4 through the buffers BUF1 to BUF4. The electric charge holding units MEM1 to MEM4 are transfer destinations. It is to be noted that one vertical trench gate alone may be disposed or three or more vertical trench gates may be disposed.

It is sufficient if each of the electric charge holding unit formation regions 2R1 to 2R4 further includes a light shielding wall 13 extending in the Z axis direction and extending along the Y axis direction that is the second longitudinal direction. Each of the electric charge holding units MEM1 to MEM4 is disposed to be sandwiched between the two light shielding walls 13 adjacent in the X axis direction. The light shielding wall 13 is a member that prevents light from entering each of the electric charge holding units MEM1 to MEM4.

There is further provided a light shielding film 14 between the photoelectric conversion units PD1 to PD4 and the electric charge holding units MEM1 to MEM4 (FIGS. 4A and 4B). The light shielding film 14 extends along the XY plane. The light shielding film 14 is a member that prevents light from entering the electric charge holding units MEM1 to MEM4 as with the light shielding wall 13. The light shielding film 14 suppresses the entry of light passing through the photoelectric conversion units PD1 to PD4 into the electric charge holding units MEM1 to MEM4 to generate noise. It is to be noted that the light which comes from the back surface 11S2 and passes through the photoelectric conversion units PD1 to PD4 without being absorbed by the photoelectric conversion units PD1 to PD4 is reflected on the light shielding film 14 and enters the photoelectric conversion units PD1 to PD4 again. In other words, the light shielding film 14 is also a reflector. The light shielding film 14 increases the photoelectric conversion efficiency by causing the light passing through the photoelectric conversion units PD1 to PD4 to enter the photoelectric conversion units PD1 to PD4 again. The light shielding film 14 is, however, provided with an opening 14K that allows the electric charge generated by the photoelectric conversion units PD1 to PD4 to pass therethrough. Each of the vertical trench gates 51 and 52 is provided to extend through the opening 14K. The light shielding film 14 may be provided over the whole of the XY plane of the pixel array unit 111 except for the opening 14K. In addition, the light shielding film 14 may be linked to the light shielding wall 13. The light shielding film 14 and the light shielding wall 13 each have, for example, a two-layer structure including an inner layer portion and an outer layer portion surrounding the periphery thereof. The inner layer portion includes, for example, a material including at least one of a single metal, a metal alloy, a metal nitride, or a metal silicide having a light shielding property. More specific examples of a material included in the inner layer portion include Al (aluminum), Cu (copper), Co (cobalt), W (tungsten), Ti (titanium), Ta (tantalum), Ni (nickel), Mo (molybdenum), Cr (chromium), Ir (iridium), platinum iridium, TiN (titanium nitride), a tungsten silicon compound, or the like. Among them, Al (aluminum) is the most optically preferable material. It is to be noted that the inner layer portion may include graphite, an organic material, or the like. The outer layer portion includes, for example, an insulating material such as SiOx (a silicon oxide). The outer layer portion secures an electrical insulation property between the inner layer portion and the semiconductor substrate 11.

It is to be noted that it is possible to form the light shielding film 14 extending in the XY plane, for example, by forming a space inside the semiconductor substrate 11 through a wet etching process and then filling the space with the material described above. In the wet etching process, for example, in a case where the semiconductor substrate 11 includes Si (111), crystal anisotropic etching using a property that the etching rate is different in accordance with the plane orientation of the Si (111) is performed by using a predetermined alkaline aqueous solution. More specifically, the property is used that the etching rate in a <110> direction is sufficiently high with respect to the etching rate in a <111> direction in the Si (111) substrate. As the predetermined alkaline aqueous solution, an inorganic solution is applicable such as KOH, NaOH, or CsOH. An organic solution is applicable such as EDP (an ethylenediamine pyrocatechol aqueous solution), $N_2H_4$ (hydrazine), $NH_4OH$ (ammonium hydroxide), or TMAH (tetramethyl ammonium hydroxide).

In a case where the space for forming the light shielding film 14 is formed through a wet etching process, the light shielding film 14 has a greater thickness (dimensions in the Z axis direction) as the wet etching proceeds more in the XY plane. It is thus desirable that the wet etching proceed as little as possible in the XY plane to prevent the light shielding film 14 from having a thickness greater than necessary. Accordingly, it is sufficient if the light shielding film 14 has shorter dimensions in the X axis direction as illustrated in FIGS. 3A and 3B according to the present embodiment. In the present embodiment, the use of a trench made to form the light shielding wall 13 extending in the Y axis direction allows a space in which the light shielding film 14 is formed to be formed through the wet etching process that proceeds in the X axis direction. This makes it possible to suppress an increase in the thickness of the light shielding film 14 that is finally obtained.

In addition, in the present embodiment, the semiconductor substrate 11 is, for example, of a P-type (a first electrical conductivity type) and the photoelectric conversion unit PD and the electric charge holding units MEM1 to MEM4 are of an N-type (a second electrical conductivity type).

FIGS. 5A, 5B, and 5C are schematic diagrams illustrating a planar configuration of the eight sensor pixels PX for each of level layers. The eight sensor pixels PX are included in a pixel array unit 100. FIG. 5A schematically illustrates the arrangement of the electric charge holding unit formation regions 2R1 to 2R4 in the second level layer LY2. FIG. 5B schematically illustrates the arrangement of the photoelectric conversion unit formation regions 1R1 to 1R4 in the first level layer LY1. FIG. 5C schematically illustrates the arrangement of the color filters CF in the color filter formation layer LY0. In FIG. 5O, the sign CF-R represents a red color filter, the sign CF-G a green color filter, and the sign CF-B represents a blue color filter.

FIG. 5A illustrates the eight electric charge holding unit formation regions 2R in total: two first unitary units each including the four electric charge holding unit formation regions 2R1 to 2R4 arranged in a matrix are arranged in the X axis direction. In the pixel array unit 100, the plurality of first unitary units illustrated in FIG. 5A is arranged in both the X axis direction and the Y axis direction as minimum units in the second level layer LY2.

In addition, FIG. 5B illustrates the eight photoelectric conversion unit formation regions 1R in total: two second unitary units each including the four photoelectric conversion unit formation regions 1R1 to 1R4 arranged in order in the Y axis direction are arranged in the X axis direction. In the pixel array unit 100, the plurality of second unitary units illustrated in FIG. 5B is arranged in both the X axis direction and the Y axis direction as minimum units in the first level layer LY1.

Further, FIG. 5C illustrates a third unitary unit including the eight color filters CF in total. The color filters CF are arranged in two columns in the X axis direction and arranged in four rows in the Y axis direction. In the pixel array unit 100, the plurality of third unitary units illustrated in FIG. 5C is arranged in both the X axis direction and the Y axis direction as minimum units in the color filter formation layer LY0. The first to third unitary units illustrated in FIGS. 5A, 5B, and 5C overlap with each other in the Z axis direction as illustrated in FIGS. 4A and 4B. If described in detail, the two first unitary units illustrated in FIG. 5A and the two second unitary units illustrated in FIG. 5B are accordingly stacked for the one third unitary unit illustrated in FIG. 5C.

(Operation of Sensor Pixel PX)

Next, with reference to FIGS. 2, 3A, 3B, 4A, 4B, 5A, 5B, and 5C and the like, an operation of the sensor pixel PX is described. In the sensor pixel PX, first, a high-level drive signal is supplied to each of the discharge transistor OFG and the transfer gate TRZ before exposure is performed on the basis of the drive control by the system control unit 115. This turns on the discharge transistor OFG and the transfer gate TRZ. This causes the electric charge accumulated in the photoelectric conversion unit PD to be discharged to the discharge unit OFD and the photoelectric conversion unit PD is reset.

After the photoelectric conversion unit PD is reset, a low-level drive signal is supplied to each of the discharge transistor OFG and the transfer gate TRZ on the basis of the drive control by the system control unit 115. This turns off the discharge transistor OFG and the transfer gate TRZ. This begins exposure for all of the sensor pixels PX in the pixel array unit 111 and generates and accumulates electric charge in each of the photoelectric conversion units PD that have received light from a subject.

After a scheduled exposure time elapses, in all of the sensor pixels PX in the pixel array unit 111, the drive signals to the transfer gate TRZ and a transfer gate TRY are turned on on the basis of the drive control by the system control unit 115. This transfers the electric charge accumulated in the photoelectric conversion unit PD from the photoelectric conversion unit PD to an electric charge holding unit MEM through the transfer gate TRZ and the transfer gate TRY in each of the sensor pixels PX. The electric charge is temporarily held in the electric charge holding unit MEM.

Subsequently, the drive signals to the transfer gate TRZ and the transfer gate TRY are turned off on the basis of the drive control by the system control unit 115. After that, a readout operation is performed of sequentially reading out the electric charge held in the electric charge holding units MEM of the respective sensor pixels PX. The readout operation for the electric charge is performed, for example, for each of the rows of the pixel array unit 111. Specifically, the transfer gates TRX and the transfer gates TRG are turned on by the drive signals for each of the rows to be read out. This transfers the electric charge held in the electric charge holding units MEM of the respective sensor pixels PX to the respective electric charge voltage conversion units FD row by row.

In a case where a selection transistor SEL is turned on by a drive signal after that, an electric signal indicating the level corresponding to the electric charge held in an electric charge voltage conversion unit FD sequentially passes through an amplification transistor AMP and the selection transistor SEL and is outputted to the column signal processing unit 113 through the VSL 117.

[Effects of Solid-state Imaging Device 101]

In this way, the solid-state imaging device 101 according to the present embodiment includes a plurality of pixels each having a stacked structure of the photoelectric conversion unit formation region 1R including the photoelectric conversion unit PD and the electric charge holding unit formation region 2R including the electric charge holding unit MEM. Here, the photoelectric conversion unit formation region 1R has the first aspect ratio AR1 in the XY plane and the electric charge holding unit formation region 2R has the second aspect ratio AR2 different from the first aspect ratio AR1 in the XY plane. Such a configuration makes a more effective layout in the electric charge holding unit formation region 2R. It is possible to increase the proportion of area occupiable by the electric charge holding unit MEM in the electric charge holding unit formation region 2R. This makes it possible to increase the occupied area of the electric charge holding unit MEM along the XY plane without increasing the area of the pixel array unit 111. It is thus possible to increase the saturation capacity of the electric charge holding unit MEM without increasing the area of the pixel array unit 111. In other words, it is possible to decrease the area of the pixel array unit 111 while maintaining the saturation capacity of the electric charge holding unit MEM. This makes it possible to achieve the miniaturization of the solid-state imaging device 101.

In addition, it is possible to increase the occupied area of the electric charge holding unit MEM along the XY plane. This increases a portion of the electric charge holding unit MEM at a position away from the opening 14K of the light shielding film 14. As a result, it is expectable to reduce the influence of light unintendedly entering the electric charge holding unit MEM or reduce the PLS (Parasitic Light Sensitivity).

2. Modification Examples of First Embodiment

Third Modification Example

[Circuit Configuration of Sensor Pixel PX in Pixel Array Unit 111A]

Each of FIGS. 6A and 6B is a circuit diagram illustrating a circuit configuration of the sensor pixel PX in a pixel array unit 111A serving as a third modification example of the first embodiment. The pixel array unit 111A is configured to selectively perform two readout methods: normal readout of individually reading out voltages from the respective sensor pixels PX; and addition readout of adding and reading out the voltages of the two sensor pixels PX adjacent in the Y axis direction. FIG. 6A illustrates the flow of electric charge (electric signals) in a case of the normal readout and FIG. 6B illustrates the flow of electric charge (electric signals) in a case of the addition readout.

In the pixel array unit 111A illustrated in each of FIGS. 6A and 6B, the six photoelectric conversion units PD1 to PD6 arranged in line in the Y axis direction are used as one unitary unit. The plurality of unitary units is arranged in both the X axis direction and the Y axis direction in the first level layer LY1. Each of FIGS. 6A and 6B illustrates only the sensor pixels PX1 to PX6 respectively including the photoelectric conversion units PD1 to PD6 among the plurality of sensor pixels PX. It is to be noted that each of FIGS. 6A and 6B omits a portion of components such as the electric charge holding unit MEM or a buffer BUF.

As illustrated in each of FIGS. 6A and 6B, the sensor pixels PX adjacent with two sensor pixels PX interposed in between in the Y axis direction share the electric charge voltage conversion unit FD in the pixel array unit 111A. Specifically, the sensor pixel PX1 and the sensor pixel PX4 share the first electric charge voltage conversion unit FD14 to which the respective photoelectric conversion units PD1 and PD4 are each coupled. In addition, the sensor pixel PX2 and a sensor pixel PX5 share a second electric charge voltage conversion unit FD25 to which respective photoelectric conversion units PD2 and PD5 are each coupled. Further, the sensor pixel PX3 and a sensor pixel PX6 share a third electric charge voltage conversion unit FD36 to which respective photoelectric conversion units PD3 and PD6 are each coupled.

The pixel array unit 111A further includes first to third normal readout switches FA14, FA25, and FA36 and first to third addition readout switches FB12, FB34, and FB56.

The first normal readout switch FA14 is provided between the first electric charge voltage conversion unit FD14 and the photoelectric conversion unit PD4. The first normal readout switch FA14 is configured to couple and uncouple the first electric charge voltage conversion unit FD14 and the photoelectric conversion unit PD4 through the transfer gate TRG4. In addition, the second normal readout switch FA25 is provided between the second electric charge voltage conversion unit FD25 and the photoelectric conversion unit PD2. The second normal readout switch FA25 is configured to couple and uncouple the second electric charge voltage conversion unit FD25 and the photoelectric conversion unit PD2 through a transfer gate TRG2. Further, the third normal readout switch FA36 is provided between the third electric charge voltage conversion unit FD36 and the photoelectric conversion unit PD6. The third normal readout switch FA36 is configured to couple and uncouple the third electric charge voltage conversion unit FD36 and the photoelectric conversion unit PD6 through a transfer gate TRG6.

The first addition readout switch FB12 is provided between the second normal readout switch FA25 and the photoelectric conversion unit PD2. The first addition readout switch FB12 is configured to couple and uncouple the photoelectric conversion unit PD1 and the photoelectric conversion unit PD2. In addition, the second addition readout switch FB34 is provided between the first normal readout switch FA14 and the photoelectric conversion unit PD4. The second addition readout switch FB34 is configured to couple and uncouple the photoelectric conversion unit PD3 and the photoelectric conversion unit PD4. Further, the third addition readout switch FB56 is provided between the third normal readout switch FA36 and the photoelectric conversion unit PD6. The third addition readout switch FB56 is configured to couple and uncouple the photoelectric conversion unit PD5 and the photoelectric conversion unit PD6.

In the pixel array unit 111A, the first to third normal readout switches FA14, FA25, and FA36 and the first to third addition readout switches FB12, FB34, and FB56 are configured to be selectively driven.

[Readout Method in Pixel Array Unit 111A]

In a case where the normal readout is performed in the pixel array unit 111A, the first to third normal readout switches FA14, FA25, and FA36 are turned on and the first to third addition readout switches FB12, FB34, and FB56 are turned off. As a result, as illustrated in FIG. 6A, the electric charge generated, for example, by the photoelectric conversion unit PD1 proceeds to the electric charge voltage conversion unit FD14 through the transfer gate TRG1, sequentially passes through the amplification transistor AMP14 and the selection transistor SEL14, and is outputted through the VSL 117. The electric charge generated by the photoelectric conversion unit PD2 passes through the transfer gate TRG2 and the second normal readout switch FA25, proceeds to the electric charge voltage conversion unit FD25, sequentially passes through an amplification transistor AMP25 and a selection transistor SEL25, and is outputted through the VSL 117. The electric charge generated by the photoelectric conversion unit PD3 passes through the transfer gate TRG3, proceeds to the electric charge voltage conversion unit FD36, sequentially passes through an amplification transistor AMP36 and a selection transistor SEL36, and is outputted through the VSL 117. The electric charge generated by the photoelectric conversion unit PD4 passes through the transfer gate TRG4 and the first normal readout switch FA14, proceeds to the electric charge voltage conversion unit FD14, sequentially passes through the amplification transistor AMP14 and the selection transistor SEL14, and is outputted through the VSL 117. The electric charge generated by the photoelectric conversion unit PD5 passes through the transfer gate TRG5, proceeds to the electric charge voltage conversion unit FD25, sequentially passes through an amplification transistor AMP25 and a selection transistor SEL25, and is outputted through the VSL 117. The electric charge generated by the photoelectric conversion unit PD6 passes through the transfer gate TRG6 and the third normal readout switch FA36, proceeds to the electric charge voltage conversion unit FD36, sequentially passes through an amplification transistor AMP36 and a selection transistor SEL36, and is outputted through the VSL 117.

In contrast, in a case where the addition readout is performed in the pixel array unit 111A, the first to third normal readout switches FA14, FA25, and FA36 are turned off and the first to third addition readout switches FB12, FB34, and FB56 are turned on. As a result, as illustrated in FIG. 6B, the electric charge generated, for example, by the photoelectric conversion unit PD1 proceeds to the electric charge voltage conversion unit FD14 through the transfer gate TRG1, sequentially passes through the amplification transistor AMP14 and the selection transistor SEL14, and is outputted through the VSL 117. The electric charge generated by the photoelectric conversion unit PD2 passes through the transfer gate TRG2 and the first addition readout switch FB12, proceeds to the electric charge voltage conversion unit FD14, sequentially passes through the amplification transistor AMP14 and the selection transistor SEL14, and is outputted through the VSL 117. The electric charge generated by the photoelectric conversion unit PD3 passes through the transfer gate TRG3, proceeds to the electric charge voltage conversion unit FD36, sequentially passes through the amplification transistor AMP36 and the selection transistor SEL36, and is outputted through the VSL 117. The electric charge generated by the photoelectric conversion unit PD4 passes through the transfer gate TRG4 and the second addition readout switch FB34, proceeds to the electric charge voltage conversion unit FD36, sequentially passes through the amplification transistor AMP36 and the selection transistor SEL36, and is outputted through the VSL 117. The electric charge generated by the photoelectric conversion unit PD5 passes through the transfer gate TRG5, proceeds to the electric charge voltage conversion unit FD25, sequentially passes through the amplification transistor AMP25 and the selection transistor SEL25, and is outputted through the VSL 117. The electric charge generated by the photoelectric conversion unit PD6 passes through the transfer gate TRG6 and the third addition readout switch FB56, proceeds to the electric charge voltage conversion unit FD25, sequentially passes through the amplification transistor AMP25 and the selection transistor SEL25, and is outputted through the VSL 117.

[Workings and Effects of Pixel Array Unit 111A]

In this way, in the pixel array unit 111A serving as the present modification example, the first to third normal readout switches FA14, FA25, and FA36 and the first to third addition readout switches FB12, FB34, and FB56 are disposed at appropriate positions in the pixel circuit. The pixel array unit 111A therefore allows for pixel addition readout (pixel binning) of adding and reading out the voltages of the two sensor pixels PX that are disposed the closest to each other.

Fourth Modification Example

[Configuration of Pixel Array Unit 111B]

FIGS. 7A, 7B, 8A, and 8 are a plan view and a cross-sectional view of the sensor pixel PX in a pixel array unit 111B serving as a fourth modification example of the first embodiment. It is to be noted that FIGS. 7A, 7B, 8A, and 8B respectively correspond to FIGS. 3A, 3B, 4A and 4B according to the first embodiment.

A pixel array unit 110B has a structure in which a first substrate S1 including the first level layer LY1 and the second level layer LY2 and a second substrate S2 including a third level layer LY3 are bonded together on a bonding interface K. In the pixel array unit 111 according to the first embodiment, the second level layer LY2 including the electric charge holding units MEM1 and MEM4 is provided with the electric charge voltage conversion unit FD14, the reset transistor RST14, the amplification transistor AMP14, the selection transistor SEL14, and the like. In contrast, in the pixel array unit 111B, the electric charge voltage conversion unit FD14, the reset transistor RST14, the amplification transistor AMP14, the selection transistor SEL14, and the like are moved to the third level layer LY3 of the second substrate S2 and the wiring layers are bonded to each other on the bonding interface K. So-called Cu—Cu bonding is preferable to bond the wiring layers to each other. In the Cu—Cu bonding, for example, the surfaces of metal layers such as Cu (copper) are irradiated with plasma to be activated and bonded to each other.

[Workings and Effects of Pixel Array Unit 111B]

In this way, in the pixel array unit 111B, a portion of the components other than the electric charge holding unit MEM is moved to another level layer. This makes it possible to increase the occupied area of the electric charge holding unit MEM formed in the second level layer LY2 as compared with the pixel array unit 111 or the like. It is thus possible to increase the saturation capacity of the electric charge holding unit MEM without increasing the area of the pixel array unit 111B. In other words, it is possible to decrease the area of the pixel array unit 111B while maintaining the saturation capacity of the electric charge holding unit MEM. This makes it possible to achieve the miniaturization of the solid-state imaging device 101.

Fifth Modification Example

[Configuration of Pixel Array Unit 111C]

FIGS. 9A, 9B, 10A, and 10B are a plan view and a cross-sectional view of the sensor pixel PX in a pixel array unit 111C serving as a fifth modification example of the first embodiment. It is to be noted that FIGS. 9A, 9B, 10A, and 10B respectively correspond to FIGS. 3A, 3B, 4A and 4B according to the first embodiment.

In the pixel array unit 111B (FIGS. 7A, 7B, 8A, and 8B) serving as the fourth modification example described above, the third level layer LY3 is formed in the second substrate S2 that is a different entity from the first substrate S1 including the first level layer LY1 and the second level layer LY2. After that, the first substrate S1 and the second substrate S2 are integrated. In contrast, in the pixel array unit 111C serving as the present modification example, the first level layer LY1, the second level layer LY2, and the third level layer LY3 are formed in order.

To manufacture the pixel array unit 111C, the second level layer LY2 is formed including the electric charge holding unit MEM, a transfer gate TRG, and the like and an oxide film is then formed. Next, the oxide film is planarized to form a flat surface and silicon wafers are then bonded together and decreased in thickness. Further, a variety of pixel transistors are formed such as the electric charge voltage conversion unit FD, a reset transistor RST, the amplification transistor AMP, and the selection transistor SEL.

[Workings and Effects of Pixel Array Unit 111C]

In this way, in the pixel array unit 111C, a portion of the components other than the electric charge holding unit MEM is moved to another level layer. This makes it possible to increase the occupied area of the electric charge holding unit MEM formed in the second level layer LY2 as compared with the pixel array unit 111 or the like. It is thus possible to increase the saturation capacity of the electric charge holding unit MEM without increasing the area of the pixel array unit 111C. In other words, it is possible to decrease the area of the pixel array unit 111B while maintaining the saturation capacity of the electric charge holding unit MEM. This makes it possible to achieve the miniaturization of the solid-state imaging device 101. Further, as compared with the pixel array unit 111B (FIGS. 7A, 7B, 8A, and 8B), it is possible to decrease, for example, the length of a wiring line that couples the electric charge voltage conversion unit FD and the third transfer transistor TG1C. This increases the efficiency of conversion between electric charge and a voltage.

Sixth Modification Example

[Configuration of Pixel Array Unit 111D]

FIGS. 11A, 11B, and 11C are plan views of the sensor pixel PX in a pixel array unit 111D serving as a sixth modification example of the first embodiment. FIGS. 11A, 11B, and 11C are schematic diagrams illustrating a planar configuration of the eight sensor pixels PX1 to PX8 for each of level layers. The eight sensor pixels PX1 to PX8 are included in the pixel array unit 111D. FIG. 11A schematically illustrates the arrangement of the electric charge holding unit formation regions 2R1 to 2R8 in the second level layer LY2. FIG. 11B schematically illustrates the arrangement of the photoelectric conversion unit formation regions 1R1 to 1R8 in the first level layer LY1. FIG. 11C schematically illustrates the arrangement of the color filters CF in the color filter formation layer LY0. It is to be noted that FIGS. 11A, 11B, and 11C corresponds to FIGS. 5A, 5B, and 5C according to the first embodiment.

As illustrated in FIGS. 11A, 11B, and 11C, in the pixel array unit 111D, the sensor pixels PX1 to PX4 arranged in line in the Y axis direction and the sensor pixels PX5 to PX8 arranged in line in the Y axis direction in the same way are disposed to be adjacent to each other in the X axis direction. In the pixel array unit 111D, the eight sensor pixels PX1 to PX8 are used as a unitary unit and arranged in both the X axis direction and the Y axis direction. In the pixel array unit 111D, the column of the sensor pixels PX1 to PX4 and the column of the sensor pixels PX5 to PX8 are disposed to have line symmetry with the Y axis as a symmetry axis. This disposes the vertical trench gates 51 and 52 close to each other in the adjacent sensor pixels PX.

Seventh Modification Example

[Configuration of Pixel Array Unit 111E]

FIGS. 12A and 12B are plan views of the sensor pixel PX in a pixel array unit 111E serving as a seventh modification example of the first embodiment. The pixel array unit 111E illustrated in FIGS. 12A and 12B has substantially the same configuration as that of the pixel array unit 111D illustrated in FIGS. 11A, 11B, and 11C except that the color filters CF corresponding the eight respective sensor pixels PX1 to PX8 included in a unitary unit have different colors. It is to be noted that FIG. 12A schematically illustrates the arrangement of the photoelectric conversion unit formation regions 1R1 to 1R8 in the first level layer LY1 and FIG. 12B schematically illustrates the arrangement of the color filters CF in the color filter formation layer LY0.

Specifically, in the pixel array unit 111E in FIGS. 12A and 12B, each of the sensor pixels PX2 and PX8 includes the red color filter CF-R, each of the sensor pixels PX1, PX4, PX6, and PX7 includes the green color filter CF-G, and each of the sensor pixels PX3 and PX5 includes the blue color filter CF-B.

[Workings and Effects of Pixel Array Unit 111E]

In this way, in the pixel array unit 111E, the positions for disposing the vertical trench gates 51 and 52 in the pixel regions of the respective sensor pixels PX1 to PX8 are unified for each of colors. Specifically, in the example of FIGS. 12A and 12B, the sensor pixels PX2 and PX8 each including the red color filter CF-R and the sensor pixels PX3 and PX5 each including the blue color filter CF-B all include the vertical trench gates 51 and 52 at positions slightly closer to the right side (the +X direction) in the X axis direction from the central positions. In contrast, the sensor pixels PX1, PX4, PX6, and PX7 each including the green color filter CF-G all include the vertical trench gates 51 and 52 at positions slightly closer to the left side (the −X direction) in the X axis direction from the central position. The sensor pixels PX2 and PX8 and the sensor pixels PX3 and PX5 thus each have the opening 14K of the light shielding film 14 at a position slightly closer to the right side (the +X direction) in the X axis direction from the central position. Similarly, each of the sensor pixels PX1, PX4, PX6, and PX7 has the opening 14K of the light shielding film 14 at a position slightly closer to the left side (the −X direction) in the X axis direction from the central position. This makes it possible to avoid the generation of variations in sensitivity characteristics or the like to obliquely incident light caused by the position of the opening 14K between the plurality of sensor pixels PX in the respective colors.

Eighth Modification Example

[Pixel Array Unit 111F]

FIGS. 13A, 13B, and 13C are plan views of the sensor pixel PX in a pixel array unit 111F serving as an eighth modification example of the first embodiment. The pixel array unit 111F illustrated in FIGS. 13A, 13B, and 13C has substantially the same configuration as that of the pixel array unit 111E illustrated in FIGS. 12A and 12B except that the color filters CF corresponding the eight respective sensor pixels PX1 to PX8 included in a unitary unit have different colors. In the pixel array unit 111F in FIGS. 13A, 13B, and 13C, the color filters CF have so-called Bayer arrangement. The color filters CF in the same color are not adjacent to each other. This offers excellent optical symmetry as a whole.

Ninth Modification Example

FIG. 14 illustrates a portion of a pixel circuit in a case where the diffusion layer of an electric charge voltage conversion unit FD1 in the sensor pixel PX1 and the diffusion layer of the OFD in the sensor pixel PX3 adjacent to the sensor pixel PX1 with the sensor pixel PX2 interposed in between are shared in the pixel array unit 111F illustrated in FIGS. 13A, 13B, and 13C. In this case, the reset transistor RST only has to be turned on to discharge the electric charge of the photoelectric conversion unit PD3 in the sensor pixel PX3.

Tenth Modification Example

[Pixel Array Unit 111G]

Figure 15A:
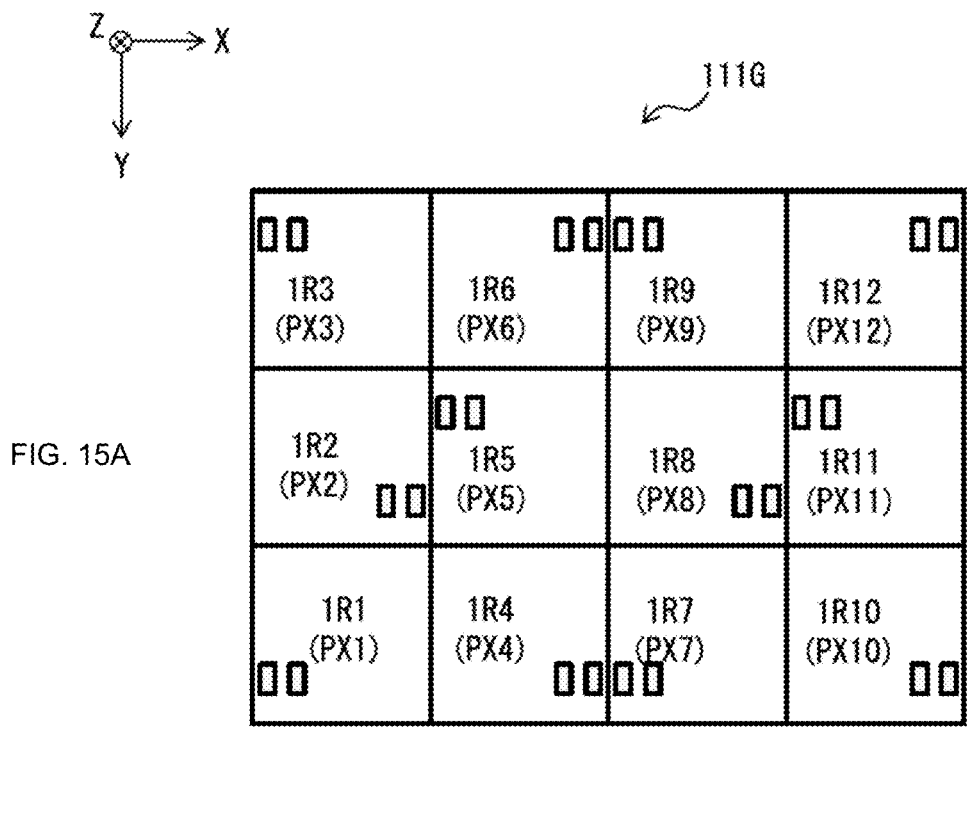
FIGS. 15A and 15B are plan views of an arrangement example of sensor pixels in a pixel array unit serving as a tenth modification example of the first embodiment.
Figure 15B:
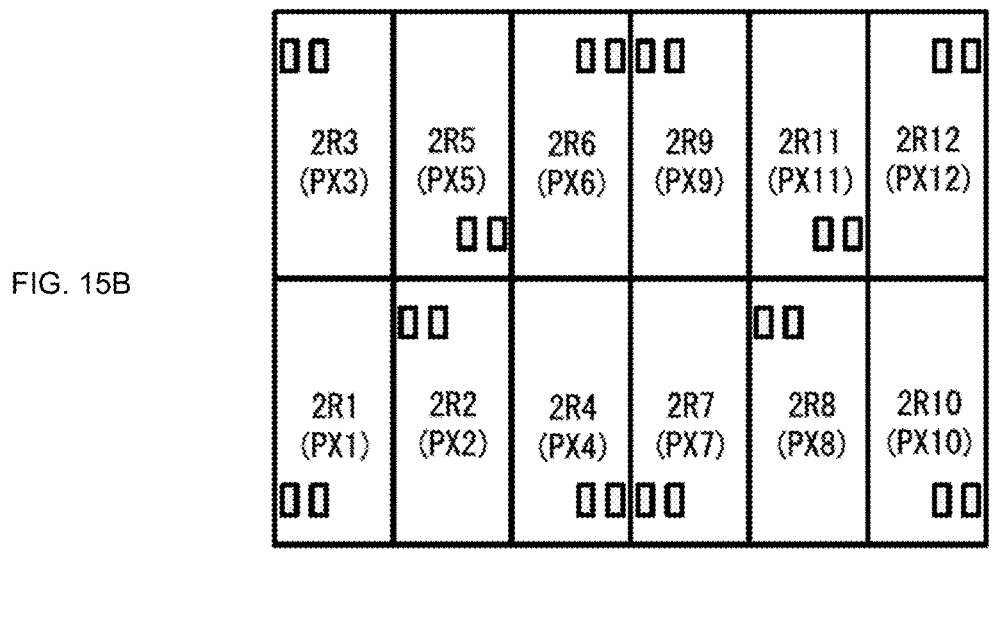

FIGS. 15A and 15B are plan view of an arrangement example of the sensor pixels PX1 to PX12 in a pixel array unit 111G serving as a tenth modification example of the first embodiment. FIG. 15A schematically illustrates the arrangement of the photoelectric conversion unit formation regions 1R1 to 1R12 in the first level layer LY1 and FIG. 15B schematically illustrates the arrangement of the electric charge holding unit formation regions 2R1 to 2R12 in the second level layer LY2.

The twelve sensor pixels PX are illustrated in total in the pixel array unit 111G illustrated in FIGS. 15A and 15B. The sensor pixels PX are illustrated in four columns in the X axis direction and the sensor pixels PX are illustrated in three rows in the Y axis direction. As illustrated in FIG. 15A, the first aspect ratio AR1 of each of the photoelectric conversion unit formation regions 1R1 to 1R12 is 1. Meanwhile, as illustrated in FIG. 15B, the second aspect ratio AR2 of each of the electric charge holding unit formation regions 2R1 to 2R12 is 2.25. Even in this case, an effect is expectable that is similar to that of the pixel array unit 111 according to the first embodiment described above.

Eleventh Modification Example

[Pixel Array Unit 111H]

Figure 16A:
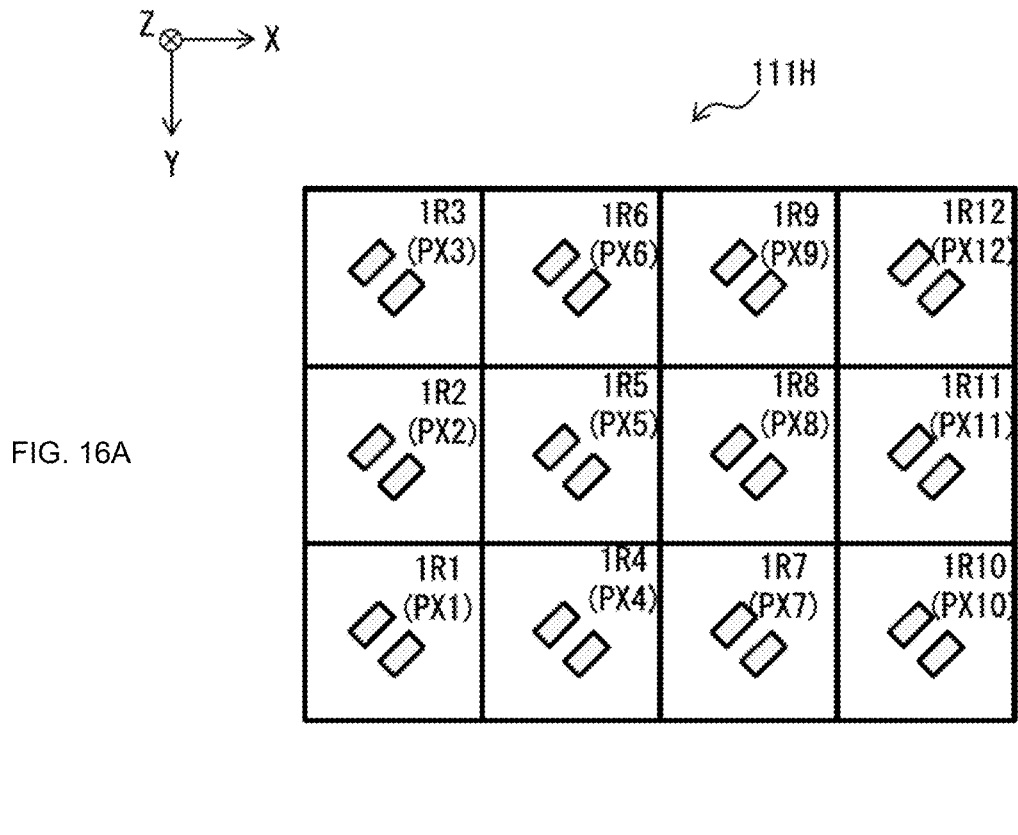
FIGS. 16A and 16B are plan views of an arrangement example of sensor pixels in a pixel array unit serving as an eleventh modification example of the first embodiment.
Figure 16B:
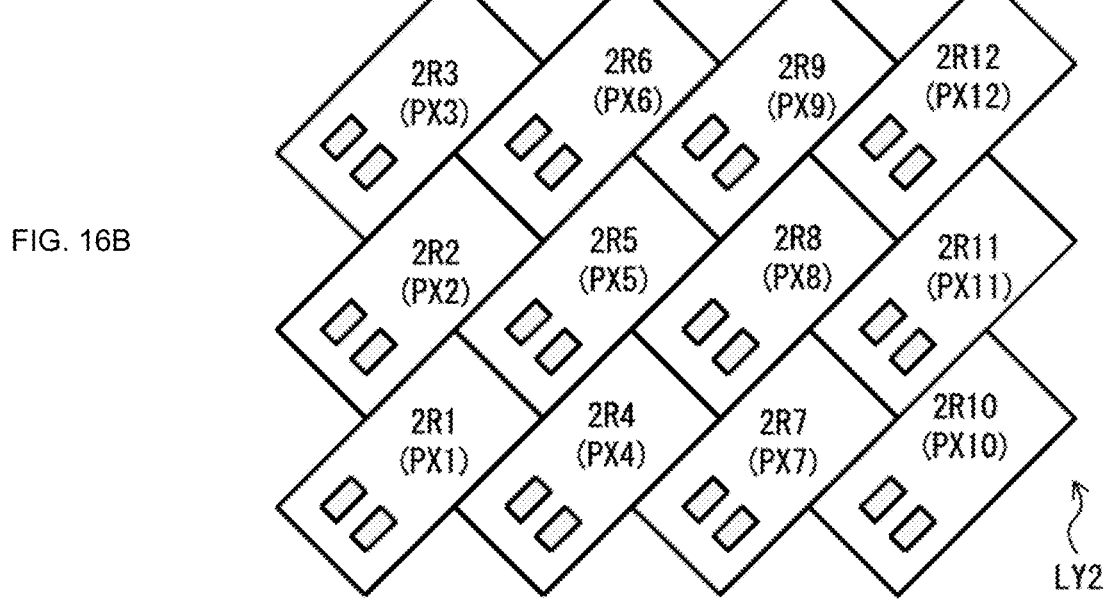

FIGS. 16A and 16B are plan views of an arrangement example of the sensor pixels PX1 to PX12 in a pixel array unit 111H serving as an eleventh modification example of the first embodiment. FIG. 16A schematically illustrates the arrangement of the photoelectric conversion unit formation regions 1R1 to 1R12 in the first level layer LY1 and FIG. 16B schematically illustrates the arrangement of the electric charge holding unit formation regions 2R1 to 2R12 in the second level layer LY2.

FIGS. 16A and 16B illustrate the twelve sensor pixels PX1 to PX12 in total among the plurality of the sensor pixels PX in the pixel array unit 111G. The sensor pixels PX are illustrated in four columns in the X axis direction and the sensor pixels PX are illustrated in three rows in the Y axis direction. As illustrated in FIG. 16A, the first aspect ratio AR1 of each of the photoelectric conversion unit formation regions 1R1 to 1R12 is 1. Meanwhile, as illustrated in FIG. 16B, the second aspect ratio AR2 of each of the electric charge holding unit formation regions 2R1 to 2R12 is 2.

As illustrated in FIGS. 16A and 16B, the second longitudinal direction of the electric charge holding unit formation regions 2R1 to 2R12 is inclined, for example, at 45° from the first longitudinal direction of the photoelectric conversion unit formation regions 1R1 to 1R12. In the pixel array unit 111G, the first arrangement pitch of the photoelectric conversion unit formation regions 1R in the X axis direction and the second arrangement pitch of the electric charge holding unit formation regions 2R in the X axis direction substantially match. In addition, the third arrangement pitch of the photoelectric conversion unit formation regions 1R in the Y axis direction and the fourth arrangement pitch of the electric charge holding unit formation regions 2R in the Y axis direction substantially match. Even in this case, an effect is expectable that is similar to that of the pixel array unit 111 according to the first embodiment described above.

3. Second Embodiment

[Configuration of Pixel Array Unit 211]

FIGS. 17A and 17B are plan views of the sensor pixel PX in a pixel array unit 211 according to a second embodiment of the present technology. FIGS. 17A and 17B are schematic diagrams illustrating a planar configuration of the two sensor pixels PX1 to PX2 for each of level layers. The two sensor pixels PX1 to PX2 are included in the pixel array unit 211. FIG. 17A schematically illustrates the arrangement of the electric charge holding unit formation regions 2R1 to 2R4 in the second level layer LY2. FIG. 17B schematically illustrates the arrangement of the photoelectric conversion unit formation regions 1R1 to 1R4 in the first level layer LY1. It is to be noted that FIGS. 17A and 17B corresponds to FIGS. 5A, 5B, and 5C according to the first embodiment.

Each of the sensor pixels PX1 to PX2 in the pixel array unit 211 is a so-called 2-PD image plane phase difference pixel. The sensor pixel PX1 and the sensor pixel PX2 are disposed to be adjacent in the Y axis direction. In the first level layer LY1 in the pixel array unit 211, the photoelectric conversion unit formation region 1R1 including the photoelectric conversion unit PD1 and the photoelectric conversion unit formation region 1R2 including the photoelectric conversion unit PD2 are disposed to be adjacent in the X axis direction. The photoelectric conversion unit formation region 1R1 and the photoelectric conversion unit formation region 1R2 each correspond to the sensor pixel PX1. In addition, the photoelectric conversion unit formation region 1R3 including the photoelectric conversion unit PD3 and the photoelectric conversion unit formation region 1R4 including the photoelectric conversion unit PD4 are disposed to be adjacent in the X axis direction. The photoelectric conversion unit formation region 1R3 and the photoelectric conversion unit formation region 1R4 each correspond to the sensor pixel PX2. Each of the photoelectric conversion units PD1 to PD4 is configured to generate electric charge through photoelectric conversion upon receiving incident light. The aspect ratio of each of the photoelectric conversion unit formation regions 1R1 to 1R4 or the ratio of the dimensions in the Y axis direction to the dimensions in the X axis direction is, for example, 2.

In addition, in the second level layer LY2 in the pixel array unit 211, the electric charge holding unit formation region 2R1 including the electric charge holding unit MEM1 and the electric charge holding unit formation region 2R2 including the electric charge holding unit MEM2 are disposed to be adjacent in the X axis direction. The electric charge holding unit formation region 2R1 and the electric charge holding unit formation region 2R2 each correspond to the sensor pixel PX1. In addition, the electric charge holding unit formation region 2R3 including the electric charge holding unit MEM3 and the electric charge holding unit formation region 2R4 including the electric charge holding unit MEM4 are disposed to be adjacent in the X axis direction. The electric charge holding unit formation region 2R3 and the electric charge holding unit formation region 2R4 each correspond to the sensor pixel PX2. The electric charge holding units MEM1 to MEM4 respectively hold the electric charge generated by the photoelectric conversion units PD1 to PD4. The aspect ratio of each of the electric charge holding unit formation regions 2R1 to 2R4 or the ratio of the dimensions in the Y axis direction to the dimensions in the X axis direction is, for example, 2.

4. Modification Examples of Second Embodiment

[Configuration of Pixel Array Unit 211A]

FIGS. 18A and 18B are plan views of the sensor pixel PX in a pixel array unit 211A serving as a first modification example according to the second embodiment of the present technology. FIGS. 18A and 18B are schematic diagrams illustrating a planar configuration of the two sensor pixels PX1 to PX2 for each of level layers. The two sensor pixels PX1 to PX2 are included in the pixel array unit 211A. FIG. 18A schematically illustrates the arrangement of the electric charge holding unit formation regions 2R1 to 2R2 in the second level layer LY2. FIG. 18B schematically illustrates the arrangement of the photoelectric conversion unit formation regions 1R1 to 1R2 in the first level layer LY1.

In the pixel array unit 211 according to the second embodiment described above, both the first longitudinal direction of the photoelectric conversion unit formation regions 1R1 to 1R4 and the second longitudinal direction of the electric charge holding unit formation regions 2R1 to 2R4 are the same Y axis direction. In contrast, in the pixel array unit 211A serving as a modification example, the first longitudinal direction of the photoelectric conversion unit formation regions 1R1 to 1R4 is the X axis direction. Except for this point, the pixel array unit 211A has substantially the same configuration of that of the pixel array unit 211. It is to be noted that, in the present technology, the sensor pixels PX in which the first longitudinal direction of the photoelectric conversion unit formation regions 1R1 to 1R4 and the second longitudinal direction of the electric charge holding unit formation regions 2R1 to 2R4 are the same and the sensor pixels PX in which the first longitudinal direction of the photoelectric conversion unit formation regions 1R1 to 1R4 and the second longitudinal direction of the electric charge holding unit formation regions 2R1 to 2R4 are different may be mixed.

5. Third Embodiment

FIGS. 19A and 19B are plan views of the one sensor pixel PX in a pixel array unit 311 according to a third embodiment of the present technology. FIGS. 19A and 19B are schematic diagrams illustrating a planar configuration of the one sensor pixel PX for each of level layers. The one sensor pixel PX is included in the pixel array unit 311. FIG. 19A schematically illustrates the photoelectric conversion unit formation region 1R1 in the first level layer LY1. FIG. 19B schematically illustrates the electric charge holding unit formation region 2R1 in the second level layer LY2. In the example of FIGS. 19A and 19B, the planar shape of the photoelectric conversion unit formation region 1R1 and the planar shape of the electric charge holding unit formation region 2R1 match, but the present technology is not limited to this. They may be different from each other. It is to be noted that FIGS. 19A and 19B corresponds to FIGS. 3A and 3B according to the first embodiment.

In addition, FIGS. 20A and 20B illustrate a cross-sectional configuration of the sensor pixel PX illustrated in FIGS. 19A and 19B. FIG. 20A is a cross-sectional view of a cross section taken along an XXA-XXAA cutting line in the X axis direction. The XXA-XXAA cutting line extends through the sensor pixel PX1 illustrated in FIG. 19B. In addition, (B) of FIG. 20B is a cross-sectional view of a cross section taken along an XXB-XXBB cutting line illustrated in FIG. 19B. It is to be noted that FIGS. 20A and 20B corresponds to FIGS. 4A and 4B according to the first embodiment.

Further, FIG. 21 illustrates a circuit configuration example of the sensor pixel PX illustrated in FIGS. 19A and 19B. Except that the discharge transistor OFG is not provided, the sensor pixel PX has substantially the same circuit configuration as that of the sensor pixel PX in the pixel array unit 111 according to the first embodiment.

In the sensor pixel PX in the pixel array unit 311, an electric charge conveyance path toward the discharge unit OFD and an electric charge conveyance path toward the electric charge holding unit MEM branch off in the buffer BUF that is an electric charge transfer unit. Here, the electric charge conveyance path toward the discharge unit OFD is not provided with the discharge transistor OFG.

The sensor pixel PX in the pixel array unit 311 includes first to third transfer transistors TGA to TGC or the like in the second level layer LY2. The first to third transfer transistors TGA to TGC serve as electric charge transfer units each including the electric charge holding unit MEM, the discharge unit OFD, and the buffer BUF.

Each of FIGS. 22A, 22B, 22C, 23A, 23B, 23C, 24A, 24B, 24C, 25A, 25B, 25C, 26A, 26B, and 26C is an explanatory diagram for describing a reset operation of the sensor pixel PX in the pixel array unit 311 on the photoelectric conversion unit PD and an operation of transferring electric charge from the photoelectric conversion unit PD to the electric charge holding unit MEM.

Figure 22A:
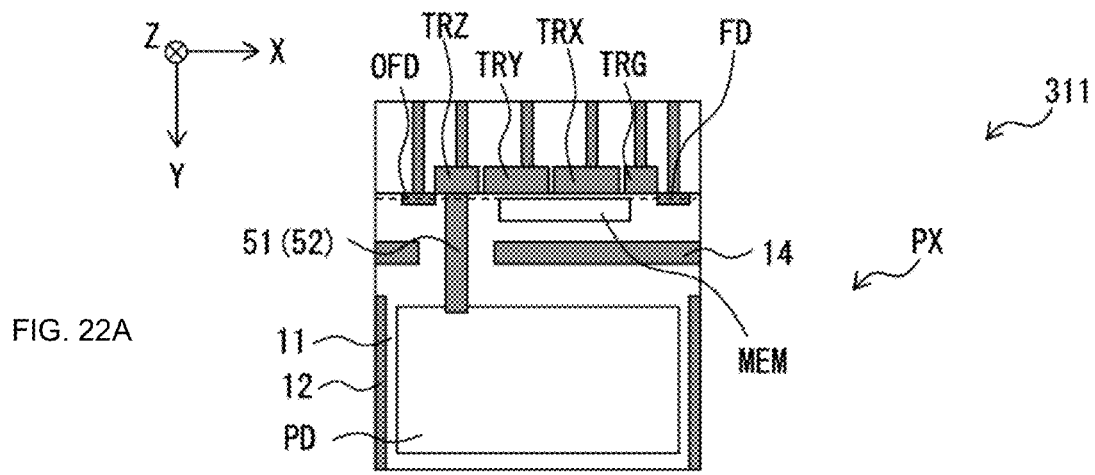
FIGS. 22A, 22B, and 22C are cross-sectional views of the sensor pixel illustrated in FIGS. 19A and 19B.
Figure 22B:
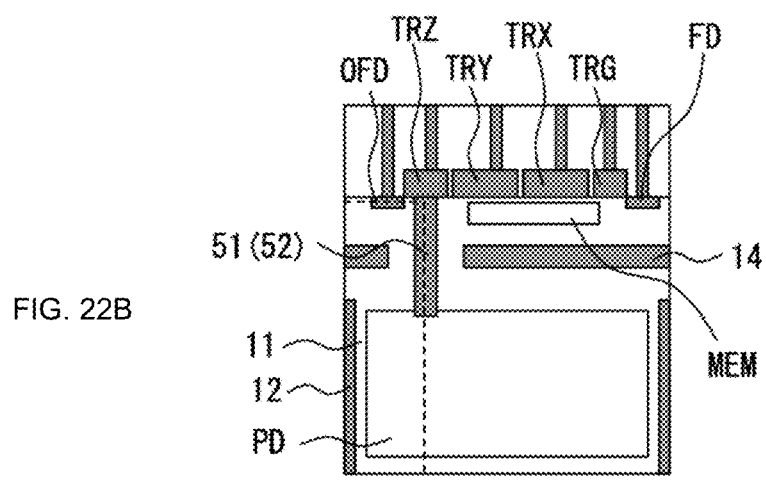
Figure 22C:
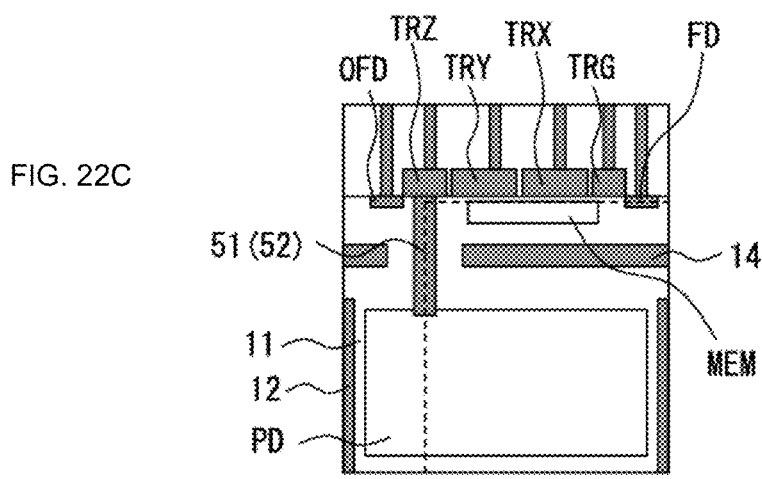
Figure 23A:
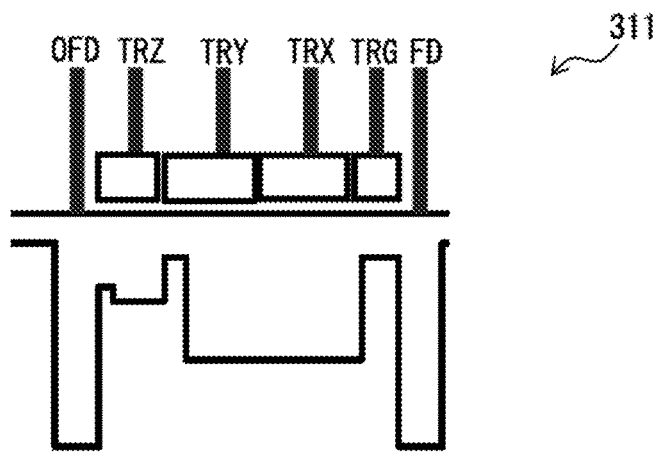
FIGS. 23A, 23B, and 23C are first potential diagram of the sensor pixel illustrated in FIGS. 22A, 22B, and 22C.
Figure 23B:
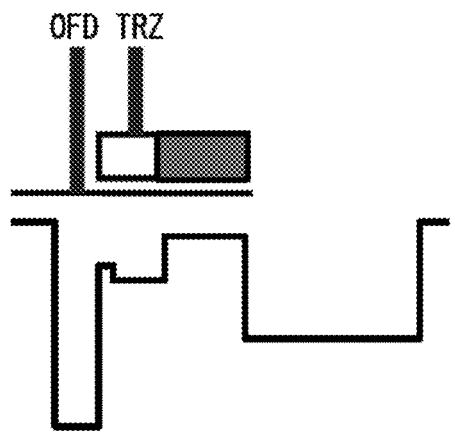
Figure 23C:
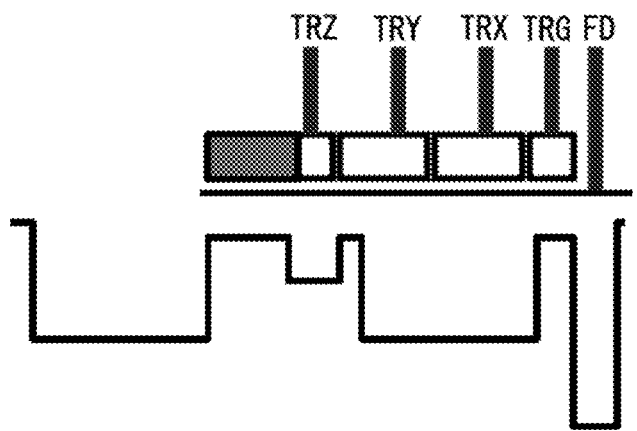
Figure 24A:
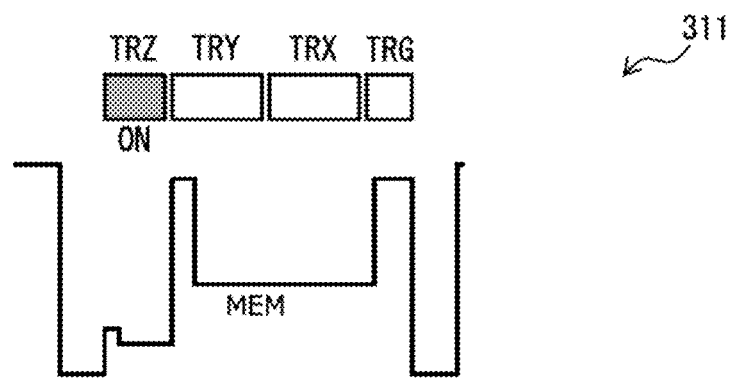
FIGS. 24A, 24B, and 24C are second potential diagrams of the sensor pixel illustrated in FIGS. 22A, 22B, and 22C.
Figure 24B:
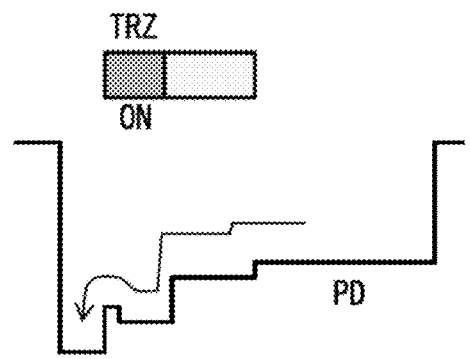
Figure 24C:
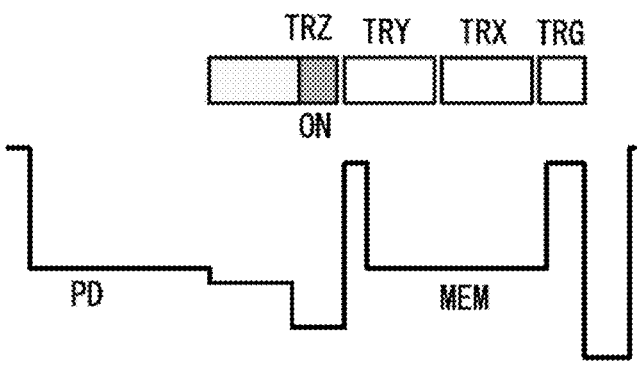

FIGS. 22A, 22B, and 22C, each correspond to the cross-sectional view of the pixel array unit 311 illustrated in FIG. 20B. FIGS. 23A, 23B, and 23C are potential diagrams respectively illustrating potentials along dashed lines XXIIA to XXIIC illustrated in FIGS. 22A, 22B, and 22C and illustrate that the transfer gates TRZ, TRY, TRX, and TRG are all off. (A) to (C) of FIGS. 23A, 23B, and 23C illustrate, for example, that electric charge is accumulated in the buffer BUF. Further, FIGS. 24A, 24B, and 24C are potential diagrams respectively illustrating the potentials along the dashed lines XXIIA to XXIIC illustrated in of FIGS. 22A, 22B, and 22C. FIGS. 24A, 24B, and 24C illustrate that only the transfer gate TRZ of the transfer gates TRZ, TRY, TRX, and TRG that are all off is turned on. FIGS. 24A, 24B, and 24C illustrate that a reset operation is performed.

Figure 25A:
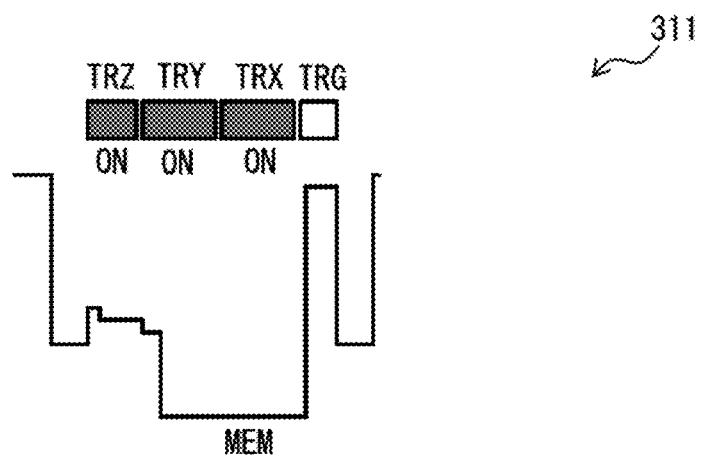
FIGS. 25A, 25B, and 25C are third potential diagrams of the sensor pixel illustrated in FIGS. 22A, 22B, and 22C.
Figure 25B:
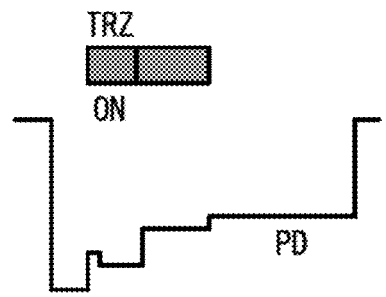
Figure 25C:
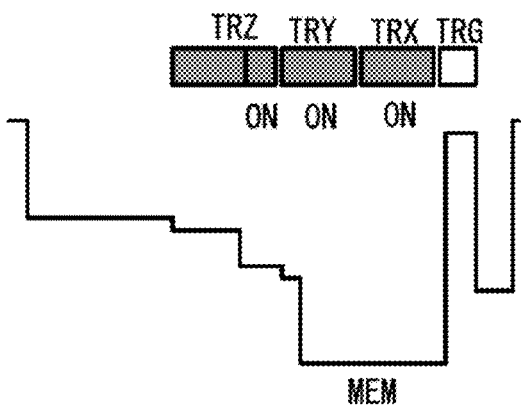
Figure 26A:
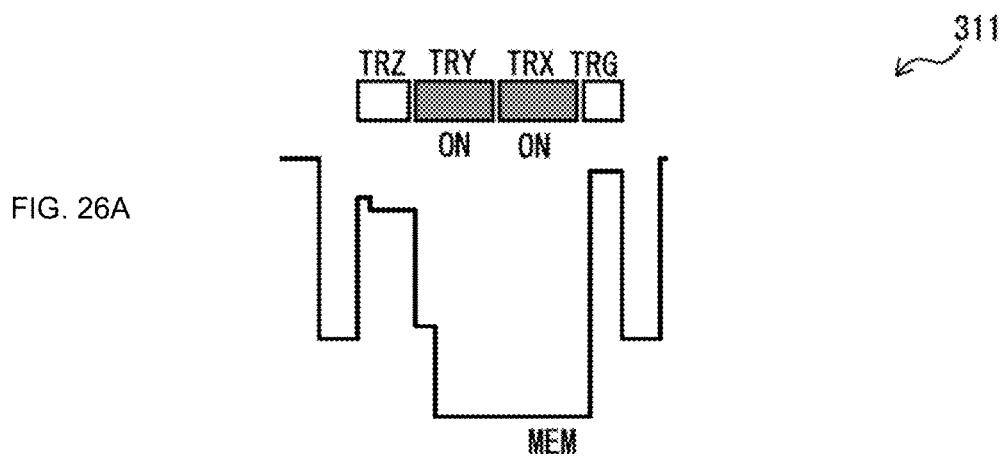
FIGS. 26A, 26B, and 26C are fourth potential diagram of the sensor pixel illustrated in FIGS. 22A, 22B, and 22C.
Figure 26B:
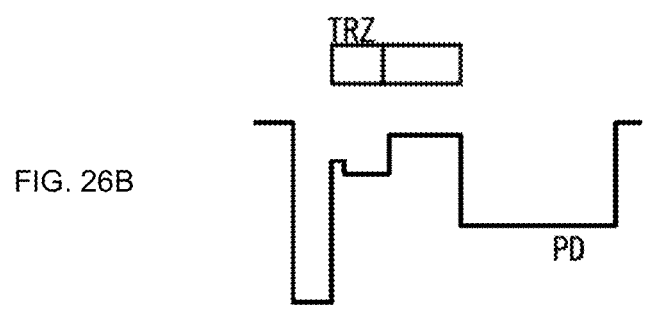
Figure 26C:
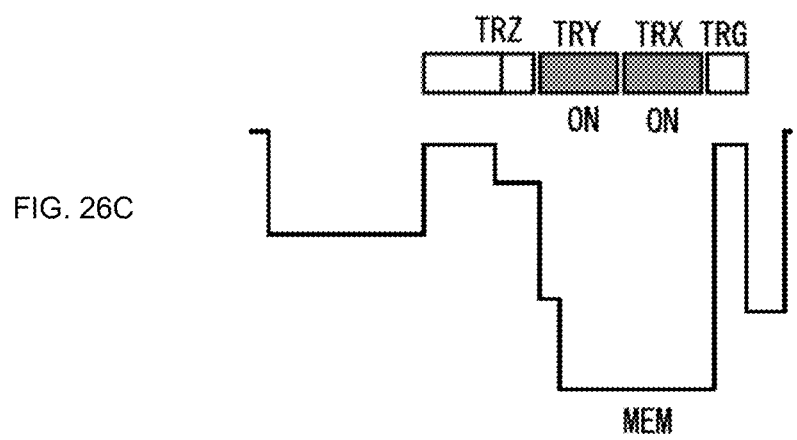

FIGS. 25A, 25B, and 25C are potential diagrams respectively illustrating the potentials along the dashed lines XXIIA to XXIIC illustrated in FIGS. 22A, 22B, and 22C. FIGS. 25A, 25B, and 25C illustrate that the transfer gates TRZ, TRY, and TRX of the transfer gates TRZ, TRY, TRX, and TRG that are all off is turned on. FIGS. 25A, 25B, and 25C illustrate that an operation begins of transferring electric charge from the photoelectric conversion unit PD to the electric charge holding unit MEM. Further, FIGS. 26A, 26B, and 26C are also potential diagrams respectively illustrating the potentials along the dashed lines XXIIA to XXIIC illustrated in FIGS. 22A, 22B, and 22C and illustrate that the transfer gate TRZ in the state of FIGS. 25A, 25B, and 25C is turned off.

FIG. 27 is a timing chart of a series of operations from a reset operation to an exposure operation and a readout operation of the sensor pixel PX in the pixel array unit 311.

As illustrated in FIGS. 22A, 22B, 22C, 23A, 23B, 23C, 24A, 24B, 24C, 25A, 25B and 25C, in a case where a reset operation is performed on the photoelectric conversion unit PD, only the transfer gate TRZ is turned on and the other transfer gates TRY, TRX, and TRG are turned off. This transfers electric charge from the photoelectric conversion unit PD to the buffer BUF. The electric charge overflowing from the buffer BUF does not flow to the electric charge holding unit MEM, but to the discharge unit OFD. After that, the transfer gate TRZ is turned off. This splits the photoelectric conversion unit PD and the buffer BUF. The electric charge remains in the buffer BUF. As a result, the reset operation on the photoelectric conversion unit PD is completed.

As illustrated in FIGS. 25A, 25B, 25C, 26A, 26B, and 26C, in a case where an operation is performed of transferring electric charge from the photoelectric conversion unit PD to the electric charge holding unit MEM, the transfer gates TRZ, TRY, and TRX are turned on at the same time. There is a potential barrier between the buffer BUF and the discharge unit OFD. In a case where there is a potential gradient from the buffer BUF to the electric charge holding unit MEM, the electric charge does not therefore move to the discharge unit OFD, but moves to the electric charge holding unit MEM.

In this way, the present embodiment refrains from providing the discharge transistor OFG, making it possible to increase the occupied area of the electric charge holding unit MEM in the second level layer LY2.

6. Modification Examples of Third Embodiment

[Pixel Array Unit 311A]

FIG. 28 illustrates a timing chart of a series of operations in a pixel array unit 311A serving as a first modification example according to the third embodiment. As illustrated in FIG. 28, the pixel array unit 311A causes the discharge unit OFD to have two-value driving. For example, in a case where a reset operation is performed on the photoelectric conversion unit PD, the discharge unit OFD is set at High. In a case where an operation is performed of transferring electric charge from the photoelectric conversion unit PD to the electric charge holding unit MEM, the discharge unit OFD is set at Low. This makes it possible to control the potential barrier between the buffer BUF and the discharge unit OFD by using the potential of the discharge unit OFD. It is thus possible to clearly perform the reset operation and the operation of transferring electric charge.

[Pixel Array Unit 311B]

Figure 29A:
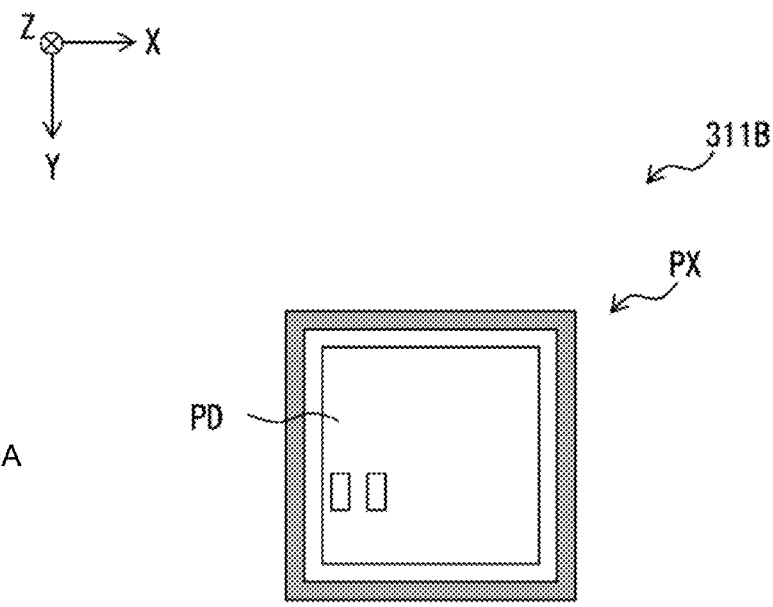
FIGS. 29A and 29B are plan views of a sensor pixel in a pixel array unit serving as a second modification example of the third embodiment of the present disclosure.
Figure 29B:
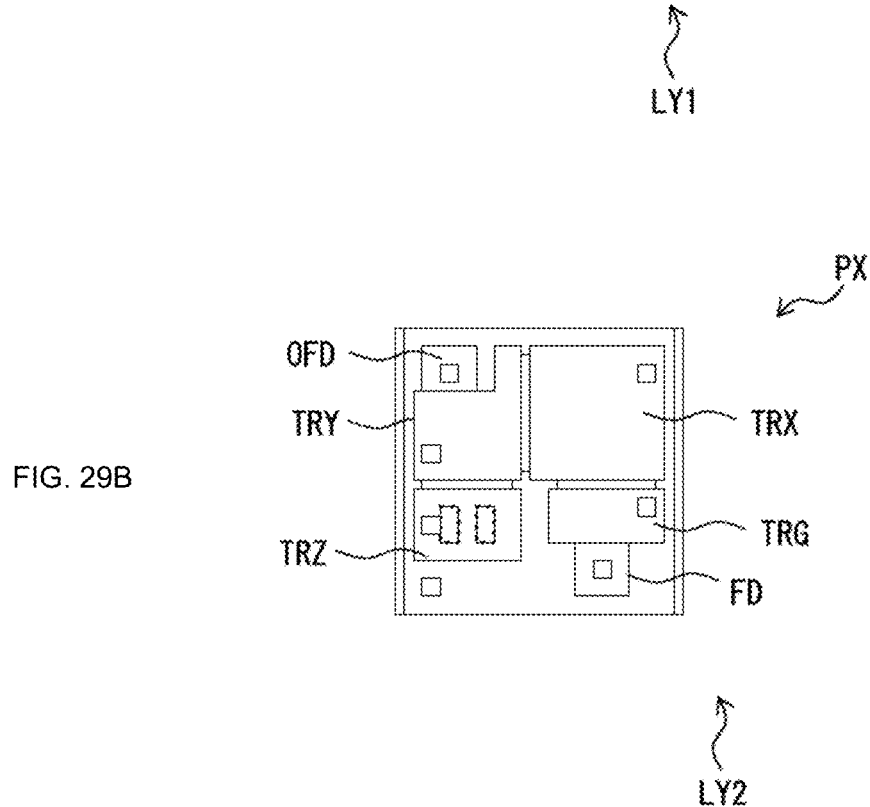

FIGS. 29A and 29B are plan views of the one sensor pixel PX in a pixel array unit 311B serving as a second modification example according to the third embodiment. FIG. 30 illustrates a timing chart of a series of operations of the one sensor pixel PX in the pixel array unit 311B.

In the pixel array unit 311, the discharge unit OFD is disposed on the opposite side to the electric charge holding unit MEM with the buffer BUF interposed in between. The buffer BUF is a branch section. In contrast, in the pixel array unit 311B, an electric charge transfer path toward the discharge unit OFD and an electric charge transfer path toward the electric charge holding unit MEM branch off between the transfer gate TRZ and the transfer gate TRY. In this case, the transfer gate TRZ and the transfer gate TRY are turned on to perform a reset operation and deplete the buffer BUF.

7. Example of Application to Electronic Apparatus

FIG. 31 is a block diagram illustrating a configuration example of a camera 2000 serving as an electronic apparatus to which the present technology is applied.

The camera 2000 includes an optical unit 2001 including a lens group and the like, an imaging device (an imaging device) 2002 to which the solid-state imaging device 101 or the like (referred to as solid-state imaging device 101 or the like below) described above is applied, and a DSP (Digital Signal Processor) circuit 2003 that is a camera signal processing circuit. In addition, the camera 2000 also includes a frame memory 2004, a display unit 2005, a recording unit 2006, an operation unit 2007, and a power supply unit 2008. The DSP circuit 2003, the frame memory 2004, the display unit 2005, the recording unit 2006, the operation unit 2007, and the power supply unit 2008 are coupled to each other through a bus line 2009.

The optical unit 2001 takes in incident light (image light) from a subject to form an image on an imaging surface of the imaging device 2002. The imaging device 2002 converts the amount of incident light formed as an image on the imaging surface by the optical unit 2001 into an electric signal on a pixel unit basis and outputs the converted electric signal as a pixel signal.

The display unit 2005 includes, for example, a panel display such as a liquid crystal panel or an organic EL panel and displays a moving image or a still image captured by the imaging device 2002. The recording unit 2006 records a moving image or a still image captured by the imaging device 2002 in a recording medium such as a hard disk or a semiconductor memory.

The operation unit 2007 issues an operation instruction about a variety of functions of the camera 2000 under an operation of a user. The power supply unit 2008 appropriately supplies the DSP circuit 2003, the frame memory 2004, the display unit 2005, the recording unit 2006, and the operation unit 2007 with various kinds of power for operations of these supply targets.

As described above, the use of the solid-state imaging device 101A or the like described above as the imaging device 2002 makes it possible to expect the acquirement of a favorable image.

8. Example of Practical Application to Mobile Body

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

FIG. 32 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 32, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 32, an audio speaker 12061, a display section 12062, and an instrument panel 12063 are illustrated as the output device. The display section 12062 may, for example, include at least one of an on-board display and a head-up display.

FIG. 33 is a diagram depicting an example of the installation position of the imaging section 12031.

In FIGS. 16A and 16B, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 33 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has described the example of the vehicle control system to which the technology according to the present disclosure may be applied. The technology according to the present disclosure may be applied to the imaging section 12031 among the components described above. Specifically, for example, the solid-state imaging device 101 illustrated in FIG. 1A or the like is applicable to the imaging section 12031. It is possible to expect an excellent operation of the vehicle control system by applying the technology according to the present disclosure to the imaging section 12031.

9. Other Modification Examples

Although the present disclosure has been described above with reference to several embodiments and modification examples, the present disclosure is not limited to the embodiments and the like described above. It is possible to make a variety of modifications. For example, the present disclosure is not limited to the back-illuminated image sensor, but is applicable to even a front-illuminated image sensor.

In addition, the imaging device according to the present disclosure is not limited to an imaging device that detects the light amount distribution of visible light and acquires it as an image, but may be an imaging device that acquires the amount distribution of incident infrared rays, X-rays, particles, or the like as an image.

In addition, the imaging device according to the present disclosure may also be in the form of a module in which an imaging unit and a signal processing unit or an optical system are packaged together.

The imaging device and the electronic apparatus serving as the respective embodiments of the present disclosure make it possible to increase the proportion of area occupiable by the electric charge holding unit. It is thus possible to decrease the dimensions in the in-plane direction without decreasing the saturation capacity of the electric charge holding unit. This makes it possible to achieve miniaturization in the in-plane direction without impairing the operation performance.

It is to be noted that the effects described in this specification are merely illustrative, but not limited to the description. There may be other effects. In addition, the present technology may have configurations as follows.

(1)

An imaging device including a plurality of pixels each having a stacked structure of a photoelectric conversion unit formation region and an electric charge holding unit formation region, the photoelectric conversion unit formation region including a photoelectric conversion unit and having a first planar shape in a plane extending in a first direction and a second direction, the photoelectric conversion unit being configured to generate electric charge through photoelectric conversion, the electric charge corresponding to an amount of received light, the first direction and the second direction being orthogonal to each other, the first planar shape having a first aspect ratio, the electric charge holding unit formation region including an electric charge holding unit and having a second planar shape in the plane, the electric charge holding unit being configured to hold the electric charge, the second planar shape having a second aspect ratio different from the first aspect ratio.

(2) The imaging device according to (1), in which a first longitudinal direction of the photoelectric conversion unit formation region and a second longitudinal direction of the electric charge holding unit formation region substantially match or are substantially orthogonal to each other.

(3) The imaging device according to (2), in which the first aspect ratio is substantially 1 and the second aspect ratio is substantially 4.

(4) The imaging device according to (2) or (3), in which
the plurality of pixels is arranged in both the first direction and the second direction,
a first arrangement pitch of the photoelectric conversion unit formation regions in the first direction and a second arrangement pitch of the electric charge holding unit formation regions in the first direction are different, and
a third arrangement pitch of the photoelectric conversion unit formation regions in the second direction and a fourth arrangement pitch of the electric charge holding unit formation regions in the second direction are different.

(5) The imaging device according to (4), in which a first ratio of the second arrangement pitch to the first arrangement pitch is substantially equal to an inverse of a second ratio of the fourth arrangement pitch to the third arrangement pitch.

(6) The imaging device according to (4) or (5), in which each of the plurality of pixels further includes a light shielding wall in a second level layer including the electric charge holding unit formation region, the light shielding wall extending in a third direction and extending along the second longitudinal direction.

(7) The imaging device according to any one of (1) to (6), in which the stacked structure further includes a light shielding film between the photoelectric conversion unit and the electric charge holding unit, the light shielding film extending along the plane.

(8) The imaging device according to (1), in which
the light shielding film includes an opening that allows the electric charge to pass through the opening, and
the imaging device further includes an electric charge transfer unit including a vertical trench gate, the vertical trench gate extending in a third direction to extend through the opening and transferring the electric charge from the photoelectric conversion unit to a transfer destination, the third direction being orthogonal to the plane.

(9) The imaging device according to (8), in which the electric charge transfer unit includes a plurality of the vertical trench gates arranged in a direction parallel with the plane and orthogonal to a second longitudinal direction of the electric charge holding unit formation region.

(10) The imaging device according to any one of (1) to (9), further including:
first to third normal readout switches; and
first to third addition readout switches, in which
the plurality of pixels includes first to sixth pixels arranged in order in one direction,
the first pixel and the fourth pixel share a first electric charge voltage conversion unit to which the respective photoelectric conversion units are each coupled,
the second pixel and the fifth pixel share a second electric charge voltage conversion unit to which the respective photoelectric conversion units are each coupled,
the third pixel and the sixth pixel share a third electric charge voltage conversion unit to which the respective photoelectric conversion units are each coupled,
the first normal readout switch is provided between the first electric charge voltage conversion unit and the photoelectric conversion unit of the fourth pixel, the first normal readout switch being configured to couple and uncouple the first electric charge voltage conversion unit and the photoelectric conversion unit of the fourth pixel,
the second normal readout switch is provided between the second electric charge voltage conversion unit and the photoelectric conversion unit of the second pixel, the second normal readout switch being configured to couple and uncouple the second electric charge voltage conversion unit and the photoelectric conversion unit of the second pixel,
the third normal readout switch is provided between the third electric charge voltage conversion unit and the photoelectric conversion unit of the sixth pixel, the third normal readout switch being configured to couple and uncouple the third electric charge voltage conversion unit and the photoelectric conversion unit of the sixth pixel,
the first addition readout switch is provided between the second normal readout switch and the photoelectric conversion unit of the second pixel, the first addition readout switch being configured to couple and uncouple the photoelectric conversion unit of the first pixel and the photoelectric conversion unit of the second pixel,
the second addition readout switch is provided between the first normal readout switch and the photoelectric conversion unit of the fourth pixel, the second addition readout switch being configured to couple and uncouple the photoelectric conversion unit of the third pixel and the photoelectric conversion unit of the fourth pixel,
the third addition readout switch is provided between the third normal readout switch and the photoelectric conversion unit of the sixth pixel, the third addition readout switch being configured to couple and uncouple the photoelectric conversion unit of the fifth pixel and the photoelectric conversion unit of the sixth pixel, and
the first to third normal readout switches and the first to third addition readout switches are configured to be selectively driven.

(11) The imaging device according to any one of (1) to (10), in which a second longitudinal direction of the electric charge holding unit formation region is inclined from a first longitudinal direction of the photoelectric conversion unit formation region.

(12)

The imaging device according to (4), in which the plurality of pixels is arranged in both the first direction and the second direction, the first arrangement pitch of the photoelectric conversion unit formation regions in the first direction and the second arrangement pitch of the electric charge holding unit formation regions in the first direction substantially match, and the third arrangement pitch of the photoelectric conversion unit formation regions in the second direction and the fourth arrangement pitch of the electric charge holding unit formation regions in the second direction substantially match.

(13)

An imaging device including a plurality of pixels each having a stacked structure of a first level layer in which a first photoelectric conversion unit and a second photoelectric conversion unit are arranged and a second level layer in which a first electric charge holding unit and a second electric charge holding unit are arranged, the first photoelectric conversion unit being configured to generate first electric charge through photoelectric conversion, the second photoelectric conversion unit being configured to generate second electric charge through photoelectric conversion, the first electric charge holding unit being configured to hold the first electric charge, the second electric charge holding unit being configured to hold the second electric charge.

(14)

The imaging device according to (13), in which the first photoelectric conversion unit and the second photoelectric conversion unit are disposed in the first level layer to be adjacent in a first direction, and the first electric charge holding unit and the second electric charge holding unit are disposed in the second level layer to be adjacent in the first direction.

(15)

The imaging device according to (13), in which the first photoelectric conversion unit and the second photoelectric conversion unit are disposed in the first level layer to be adjacent in a first direction, and the first electric charge holding unit and the second electric charge holding unit are disposed in the second level layer to be adjacent in a second direction orthogonal to the first direction.

(16)

The imaging device according to (13), in which the plurality of pixels includes a first pixel and a second pixel, the first pixel and the second pixel being adjacent in a first direction, the first pixel includes the first level layer in which the first photoelectric conversion unit and the second photoelectric conversion unit are disposed to be adjacent in the first direction and the second level layer in which the first electric charge holding unit and the second electric charge holding unit are disposed to be adjacent in the first direction, and the second pixel includes the first level layer in which the first photoelectric conversion unit and the second photoelectric conversion unit are disposed to be adjacent in a second direction orthogonal to the first direction and the second level layer in which the first electric charge holding unit and the second electric charge holding unit are disposed to be adjacent in the first direction.

(17)

An imaging device including:

a semiconductor layer including a front surface and a back surface, the back surface being opposite to the front surface;

a photoelectric conversion unit embedded in the semiconductor layer, the photoelectric conversion unit generating electric charge through photoelectric conversion, the electric charge corresponding to an amount of received light;

an electric charge holding unit provided between the front surface of the semiconductor layer and the photoelectric conversion unit, the electric charge holding unit being configured to hold the electric charge;

a discharge unit that discharges the electric charge to outside; and a transfer unit including a branch section, the transfer unit being configured to selectively transfer the electric charge generated by the photoelectric conversion unit to the electric charge holding unit or the discharge unit through the branch section.

(18)

The imaging device according to (17), in which the transfer unit includes a first trench gate extending from the front surface of the semiconductor layer toward the back surface until the photoelectric conversion unit is reached.

(19)

The imaging device according to (17) or (18), in which the discharge unit is disposed on an opposite side to the electric charge holding unit in an in-plane direction parallel with the front surface with the branch section interposed between the discharge unit and the electric charge holding unit.

(20)

The imaging device according to any one of (17) to (19), in which the transfer unit includes a transistor provided on the front surface, and the branch section includes a buffer formed immediately below the transistor.

(21)

An electronic apparatus including an imaging device, the imaging device including a plurality of pixels each having a stacked structure of a photoelectric conversion unit formation region and an electric charge holding unit formation region, the photoelectric conversion unit formation region including a photoelectric conversion unit and having a first planar shape in a plane extending in a first direction and a second direction, the photoelectric conversion unit being configured to generate electric charge through photoelectric conversion, the electric charge corresponding to an amount of received light, the first direction and the second direction being orthogonal to each other, the first planar shape having a first aspect ratio, the electric charge holding unit formation region including an electric charge holding unit and having a second planar shape in the plane, the electric charge holding unit being configured to hold the electric charge, the second planar shape having a second aspect ratio different from the first aspect ratio.

(22)
An electronic apparatus including
an imaging device,
the imaging device including a plurality of pixels each having a stacked structure of a first level layer in which a first photoelectric conversion unit and a second photoelectric conversion unit are arranged and a second level layer in which a first electric charge holding unit and a second electric charge holding unit are arranged,
the first photoelectric conversion unit being configured to generate first electric charge through photoelectric conversion, the second photoelectric conversion unit being configured to generate second electric charge through photoelectric conversion,
the first electric charge holding unit being configured to hold the first electric charge, the second electric charge holding unit being configured to hold the second electric charge.

(23)
An electronic apparatus including
an imaging device,
the imaging device including
a semiconductor layer including a front surface and a back surface, the back surface being opposite to the front surface,
a photoelectric conversion unit embedded in the semiconductor layer, the photoelectric conversion unit generating electric charge through photoelectric conversion, the electric charge corresponding to an amount of received light,
an electric charge holding unit provided between the front surface of the semiconductor layer and the photoelectric conversion unit, the electric charge holding unit being configured to hold the electric charge,
a discharge unit that discharges the electric charge to outside, and
a transfer unit including a branch section, the transfer unit being configured to selectively transfer the electric charge generated by the photoelectric conversion unit to the electric charge holding unit or the discharge unit through the branch section.

The present application claims the priority on the basis of Japanese Patent Application No. 2019-63541 filed on Mar. 28, 2019 with Japan Patent Office, the entire contents of which are incorporated in the present application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device, comprising:
a plurality of pixels, each pixel comprises a stacked structure, the stacked structure comprises a first level layer and a second level layer on the first level layer, a photoelectric conversion unit formation region is arranged on the first level layer, and a plurality of electric charge holding unit formation regions are arranged on the second level layer, wherein
the photoelectric conversion unit formation region comprises a photoelectric conversion unit configured to generate electric charge through photoelectric conversion, the electric charge corresponding to an amount of received light,
the photoelectric conversion unit formation region has a first planar shape in a plane extending in a first direction and a second direction, the first direction and the second direction being orthogonal to each other, and the first planar shape having a first aspect ratio, and
an electric charge holding unit formation region of the plurality of electric charge holding unit formation regions comprises:
an electric charge holding unit configured to hold the electric charge,
an electric charge transfer unit configured to transfer the electric charge, and
a discharge unit configured to discharge the electric charge to outside, wherein
the electric charge holding unit formation region has a second planar shape in the plane, and the second planar shape corresponds to a second aspect ratio different from the first aspect ratio,
at least two of the plurality of electric charge holding unit formation regions are disposed for the photoelectric conversion unit formation region in the first direction,
a first longitudinal direction of the photoelectric conversion unit formation region and a second longitudinal direction of the electric charge holding unit formation region match or are orthogonal to each other, and
the first aspect ratio is 1 and the second aspect ratio is 4.

2. The imaging device according to claim 1, wherein the plurality of pixels are arranged in both the first direction and the second direction,
a first arrangement pitch of photoelectric conversion unit formation regions in the first direction and a second arrangement pitch of the plurality of electric charge holding unit formation regions in the first direction are different, wherein the photoelectric conversion unit formation regions comprise the photoelectric conversion unit formation region, and
a third arrangement pitch of the photoelectric conversion unit formation regions in the second direction and a fourth arrangement pitch of the plurality of electric charge holding unit formation regions in the second direction are different.

3. The imaging device according to claim 2, wherein a first ratio of the second arrangement pitch to the first arrangement pitch is equal to an inverse of a second ratio of the fourth arrangement pitch to the third arrangement pitch.

4. The imaging device according to claim 2, wherein each of the plurality of pixels further comprises a light shielding wall in the second level layer that includes the electric charge holding unit formation region, the light shielding wall extending in a third direction and extending along the second longitudinal direction, the third direction being orthogonal to the plane.

5. The imaging device according to claim 1, wherein the stacked structure further comprises a light shielding film between the photoelectric conversion unit and the electric charge holding unit, the light shielding film extending along the plane.

6. The imaging device according to claim 5, wherein
the light shielding film comprises an opening to allow the electric charge to pass through the opening,
the electric charge transfer unit comprises a plurality of vertical trench gates, a vertical trench gate of the plurality of vertical trench gates extends in a third direction through the opening, the vertical trench gate is configured to transfer the electric charge from the photoelectric conversion unit to a transfer destination, and the third direction being orthogonal to the plane.

7. The imaging device according to claim 6, wherein the plurality of vertical trench gates are arranged in a direction parallel with the plane and orthogonal to the second longitudinal direction of the electric charge holding unit formation region.

8. An imaging device, comprising:
a plurality of pixels, wherein
each pixel comprises a stacked structure, the stacked structure comprises a first level layer and a second level layer on the first level layer, a first photoelectric conversion unit and a second photoelectric conversion unit are arranged on a first photoelectric conversion unit formation region and a second photoelectric conversion unit formation region, respectively, on the first level layer, and a first electric charge holding unit and a second electric charge holding unit are arranged on a first electric charge holding unit formation region and a second electric charge holding unit formation region, respectively, in the second level layer, and
the first photoelectric conversion unit is configured to generate first electric charge through photoelectric conversion,
the second photoelectric conversion unit is configured to generate second electric charge through photoelectric conversion,
the first electric charge holding unit is configured to hold the first electric charge,
the second electric charge holding unit is configured to hold the second electric charge, wherein
each of the first electric charge holding unit formation region and the second electric charge holding unit formation region comprises:
an electric charge transfer unit configured to transfer the first electric charge and the second electric charge, and
a discharge unit configured to discharge at least one of the first electric charge or the second electric charge to outside, and wherein
a first aspect ratio of the first photoelectric conversion unit formation region and the second photoelectric conversion unit formation region and a second aspect ratio of the first electric charge holding unit formation region and the second electric charge holding unit formation region are different,
wherein the first electric charge holding unit formation region and the second electric charge holding unit formation region are disposed for one of the first photoelectric conversion unit formation region or the second photoelectric conversion unit formation region in a first direction.

9. The imaging device according to claim 8, wherein the first photoelectric conversion unit and the second photoelectric conversion unit are disposed in the first level layer to be adjacent in the first direction, and the first electric charge holding unit and the second electric charge holding unit are disposed in the second level layer to be adjacent in the first direction.

10. The imaging device according to claim 8, wherein the first photoelectric conversion unit and the second photoelectric conversion unit are disposed in the first level layer to be adjacent in the first direction, and the first electric charge holding unit and the second electric charge holding unit are disposed in the second level layer to be adjacent in a second direction orthogonal to the first direction.

11. An imaging device, comprising:
a semiconductor layer that comprises a front surface and a back surface, the back surface being opposite to the front surface;
a photoelectric conversion unit embedded in a photoelectric conversion unit formation region of the semiconductor layer, the photoelectric conversion unit is configured to generate an electric charge through photoelectric conversion, the electric charge corresponding to an amount of received light;
a plurality of electric charge holding units in a plurality of electric charge holding unit formation regions, wherein
an electric charge holding unit formation region of the plurality of electric charge holding unit formation regions comprises an electric charge holding unit of the plurality of electric charge holding units,
the electric charge holding unit is between the front surface of the semiconductor layer and the photoelectric conversion unit,
the electric charge holding unit is configured to hold the electric charge, and
at least two of the plurality of electric charge holding unit formation regions are disposed for the photoelectric conversion unit formation region in a first direction;
a discharge unit in the electric charge holding unit formation region, configured to discharge the electric charge to outside; and
a transfer unit in the electric charge holding unit formation region, the transfer unit including a branch section, the transfer unit being configured to selectively transfer the electric charge generated by the photoelectric conversion unit to one of the electric charge holding unit or the discharge unit through the branch section,
wherein a first aspect ratio of the photoelectric conversion unit formation region and a second aspect ratio of the electric charge holding unit formation region are different.

12. The imaging device according to claim 11, wherein the transfer unit comprises a first trench gate that extends from the front surface of the semiconductor layer towards the back surface until the photoelectric conversion unit is reached.

13. The imaging device according to claim 11, wherein the discharge unit is on an opposite side to the electric charge holding unit in an in-plane direction parallel with the front surface with the branch section interposed between the discharge unit and the electric charge holding unit.

14. The imaging device according to claim 11, wherein the transfer unit comprises a transistor on the front surface, and the branch section comprises a buffer immediately below the transistor.

15. An electronic apparatus, comprising:
an imaging device, wherein
the imaging device comprising a plurality of pixels, wherein
each pixel comprises a stacked structure, the stacked structure comprises a first level layer and a second level layer on the first level layer, a photoelectric conversion unit formation region is arranged on the first level layer, and a plurality of electric charge holding unit formation regions are arranged on the second level layer, the photoelectric conversion unit formation region comprises a photoelectric conversion unit configured to generate electric charge through photoelectric conversion, the photoelectric conversion unit formation region has a first planar shape in a plane that extends in a first direction and a second direction, the first direction and the second direction being orthogonal to each other, and the first planar shape has a first aspect ratio, and an electric charge holding unit formation region of the plurality of electric charge holding unit formation regions comprises:

an electric charge holding unit configured to hold the electric charge, an electric charge transfer unit configured to transfer the electric charge, and a discharge unit configured to discharge the electric charge to outside, wherein the electric charge holding unit formation region has a second planar shape that corresponds to a second aspect ratio different from the first aspect ratio, at least two of the plurality of electric charge holding unit formation regions are disposed for the photoelectric conversion unit formation region in the first direction, a first longitudinal direction of the photoelectric conversion unit formation region and a second longitudinal direction of the electric charge holding unit formation region match or are orthogonal to each other, and the first aspect ratio is 1 and the second aspect ratio is 4.

16. An electronic apparatus, comprising:

an imaging device, wherein the imaging device comprises a plurality of pixels, each pixel comprises a stacked structure of a first level layer and a second level layer on the first level layer, a first photoelectric conversion unit and a second photoelectric conversion unit are arranged on a first photoelectric conversion unit formation region and second photoelectric conversion unit formation region, respectively, on the first level layer, and a first electric charge holding unit and a second electric charge holding unit are arranged on a first electric charge holding unit formation region and a second electric charge holding unit formation region, respectively, in the second level layer, the first photoelectric conversion unit is configured to generate first electric charge through photoelectric conversion, the second photoelectric conversion unit is configured to generate second electric charge through photoelectric conversion, the first electric charge holding unit is configured to hold the first electric charge, the second electric charge holding unit is configured to hold the second electric charge, wherein each of the first electric charge holding unit formation region and the second electric charge holding unit formation region comprises:

an electric charge transfer unit configured to transfer the first electric charge and the second electric charge, and a discharge unit configured to discharge at least one of the first electric charge or the second electric charge to outside, wherein a first aspect ratio of the first photoelectric conversion unit formation region and the second photoelectric conversion unit formation region and a second aspect ratio of the first electric charge holding unit formation region and the second electric charge holding unit formation region are different wherein the first electric charge holding unit formation region and the second electric charge holding unit formation region are disposed for at least one of the first photoelectric conversion unit formation region and the second photoelectric conversion unit formation region in a first direction.

17. An electronic apparatus, comprising:

an imaging device, wherein the imaging device comprising:

a semiconductor layer that comprises a front surface and a back surface, the back surface being opposite to the front surface, a photoelectric conversion unit embedded in a photoelectric conversion unit formation region of the semiconductor layer, the photoelectric conversion unit configured to generate an electric charge through photoelectric conversion, the electric charge corresponds to an amount of received light, a plurality of electric charge holding units in a plurality of electric charge holding unit formation regions, wherein an electric charge holding unit formation region of the plurality of electric charge holding unit formation regions comprises an electric charge holding unit of the plurality of electric charge holding units, the electric charge holding unit is between the front surface of the semiconductor layer and the photoelectric conversion unit, the electric charge holding unit is configured to hold the electric charge, at least two of the plurality of electric charge holding unit formation regions are disposed for one of the photoelectric conversion unit formation region in a first direction, a discharge unit in the electric charge holding unit formation region, configured to discharge the electric charge to outside, and a transfer unit in the electric charge holding unit formation region, comprises a branch section, the transfer unit is configured to selectively transfer the electric charge generated by the photoelectric conversion unit to one of the electric charge holding unit or the discharge unit through the branch section, wherein a first aspect ratio of the photoelectric conversion unit formation region and a second aspect ratio of the electric charge holding unit formation region are different.

18. An imaging device, comprising:

a plurality of pixels, each pixel comprises a stacked structure, the stacked structure comprises a first level layer and a second level layer on the first level layer, a photoelectric conversion unit formation region is arranged on the first level layer, and an electric charge holding unit formation region is arranged on the second level layer, wherein the photoelectric conversion unit formation region comprises a photoelectric conversion unit configured to generate electric charge through photoelectric conversion, the electric charge corresponding to an amount of received light, the photoelectric conversion unit formation region has a first planar shape in a plane extending in a first direction and a second direction, the first direction and the second direction being orthogonal to each other, and the first planar shape having a first aspect ratio, and the electric charge holding unit formation region comprises:
- an electric charge holding unit configured to hold the electric charge,
- an electric charge transfer unit configured to transfer the electric charge, and
- a discharge unit configured to discharge the electric charge to outside, wherein
  - the electric charge holding unit formation region has a second planar shape in the plane, and the second planar shape corresponds to a second aspect ratio different from the first aspect ratio,
  - a first longitudinal direction of the photoelectric conversion unit formation region and a second longitudinal direction of the electric charge holding unit formation region match or are orthogonal to each other, and
  - the first aspect ratio is 1 and the second aspect ratio is 4.

* * * * *